United States Patent
Sheehan et al.

(10) Patent No.: US 11,714,940 B2
(45) Date of Patent: Aug. 1, 2023

(54) ARTIFICIAL INTELLIGENCE DETERMINATION OF BUILDING METRICS FOR CODE COMPLIANCE WITH USER INTERACTION

(71) Applicant: Togal.AI Inc., Miami, FL (US)

(72) Inventors: Michael Sheehan, Coral Gables, FL (US); Patrick E Murphy, Miami, FL (US); Johnny Maghzal, Miami, FL (US); Patrick Hughes, Miami, FL (US); Emilia Keller, State College, PA (US); Matthew Foley, Boxborough, MA (US)

(73) Assignee: Togal.AI Inc.

( * ) Notice: Subject to any disclaimer, the term of this patent is extended or adjusted under 35 U.S.C. 154(b) by 0 days.

(21) Appl. No.: 17/809,585

(22) Filed: Jun. 29, 2022

(65) Prior Publication Data

US 2022/0327264 A1   Oct. 13, 2022

Related U.S. Application Data

(63) Continuation of application No. 17/697,691, filed on Mar. 17, 2022, which is a continuation of application (Continued)

(51) Int. Cl.
*G06F 30/27* (2020.01)
*G06F 30/13* (2020.01)

(52) U.S. Cl.
CPC .............. *G06F 30/27* (2020.01); *G06F 30/13* (2020.01)

(58) Field of Classification Search
None
See application file for complete search history.

(56) References Cited

U.S. PATENT DOCUMENTS

| 4,642,780 A | * | 2/1987 | Thomson | ............... G06F 3/0489 |
| | | | | 345/593 |
| 9,898,912 B1 | | 2/2018 | Jordan et al. | |

(Continued)

FOREIGN PATENT DOCUMENTS

| CN | 105023201 A | 11/2015 |
| EP | 3550493 A1 | 10/2019 |

(Continued)

OTHER PUBLICATIONS

Risto Miikkulainen et al., Evolving Deep Neural Networks, Sentient Technologies, Inc., The University of Texas at Austin, arXiv:1703.00548v2 [cs.NE], Mar. 4, 2017.

*Primary Examiner* — Mohamed Abou El Seoud
*Assistant Examiner* — Conrad R Pack
(74) *Attorney, Agent, or Firm* — Tracnik Law PLLC; Joseph P. Kincart

(57) ABSTRACT

Methods and apparatus operative to quantify building metrics using artificial intelligence analysis of a design plan. A design plan is represented using multiple dynamic components. Each dynamic component may include a parameter changeable via the user interactive interface. The dynamic components may be arranged in a user interactive interface to form a first set of boundaries, including a respective length and area, and defining at least a portion of a first unit. AI may determine a longest path of egress and a supportable occupancy load that may be used to determine compliance with parameters of a given code. The AI may assess whether a building described in the design plans complies with a relevant code set forth by an authority having jurisdiction. Codes may include, for example, codes enforcing fire safety and the Americans with Disabilities Act.

31 Claims, 43 Drawing Sheets

IU: Distance Inside Unit

Related U.S. Application Data

No. 17/515,774, filed on Nov. 1, 2021, now Pat. No. 11,475,174.

(60) Provisional application No. 63/231,595, filed on Aug. 10, 2021, provisional application No. 63/158,702, filed on Mar. 9, 2021, provisional application No. 63/158,727, filed on Mar. 9, 2021, provisional application No. 63/158,744, filed on Mar. 9, 2021.

(56) References Cited

U.S. PATENT DOCUMENTS

| | | |
|---|---|---|
| 2002/0013704 A1 | 1/2002 | Finney |
| 2005/0038636 A1 | 2/2005 | Wakelam et al. |
| 2006/0136179 A1* | 6/2006 | Sit ............................ G06F 30/00 |
| | | 703/1 |
| 2007/0009155 A1 | 1/2007 | Potts et al. |
| 2008/0126022 A1 | 5/2008 | Hoguet |
| 2009/0024970 A1* | 1/2009 | Saito ..................... G06F 30/392 |
| | | 716/106 |
| 2012/0276517 A1* | 11/2012 | Banaszuk ............. G01C 21/00 |
| | | 434/365 |
| 2013/0120426 A1 | 5/2013 | DiVerdi et al. |
| 2013/0211790 A1 | 8/2013 | Loveland et al. |
| 2013/0218780 A1 | 8/2013 | Buzz |
| 2018/0218301 A1* | 8/2018 | Shike ................. G06Q 30/0645 |
| 2019/0022811 A1 | 1/2019 | Roettgen |
| 2019/0108603 A1 | 4/2019 | Waslander et al. |
| 2019/0130233 A1 | 5/2019 | Stenger et al. |
| 2020/0134745 A1* | 4/2020 | McLinden ....... G06Q 10/06313 |
| 2020/0242849 A1* | 7/2020 | Cini ......................... G06T 7/73 |
| 2020/0302630 A1 | 9/2020 | Spader et al. |
| 2021/0019453 A1* | 1/2021 | Yang .................... G06T 19/006 |
| 2021/0073433 A1* | 3/2021 | Austern .................. G06F 30/27 |
| 2021/0103687 A1 | 4/2021 | Harris et al. |
| 2021/0150088 A1 | 5/2021 | Gallo et al. |

FOREIGN PATENT DOCUMENTS

| | | |
|---|---|---|
| WO | 2020031009 A1 | 2/2020 |
| WO | 2020220068 A1 | 11/2020 |
| WO | WO201615431 A1 | 4/2021 |

\* cited by examiner

FIG. 1D

| | 322 | 323 | 324 | 325 | 326 | 327 |
|---|---|---|---|---|---|---|
| AREA TYPE | PRIVATE OFFICE | GENERAL OFFICE SPACE | PUBLIC CONF. ROOM | PRIVATE CONF. ROOM | PRIVATE WATER CLOSET | PUBLIC WATER CLOSET |
| 322 PRIVATE OFFICE | 50/50 | 50/40 | 40/50 | 50/50 | 50/50 | 40/60 |
| 323 GENERAL OFFICE SPACE | | | | | | |
| 324 PUBLIC CONF. ROOM | | | | | | |
| 325 PRIVATE CONF. ROOM | | | | | | |
| 326 PRIVATE WATER CLOSET | | | | | | |
| 327 PUBLIC WATER CLOSET | | | | | | |

FIG. 3D

TABLE A

| AREA TYPE MAPPING | | |
|---|---|---|
| CASUAL NAME | CLASS NAME | # |
| NONE | none | 0 |
| RESIDENTIAL | residential | 1 |
| HOTEL | hotel | 1 |
| RETAIL | office | 1 |
| OFFICE | amenity | 1 |
| AMENITIES | foh | 1 |
| FOH | bohAc | 1 |
| BOH AC | bohNonAc | 1 |
| PARKING | parking | 1 |
| STAIRS | stair | 1 |
| PUBLIC TERRACES | publicTerrace | 1 |
| PRIVATE BALCONIES | privateBalcony | 1 |
| NON-ACCESSIBLE | nonAccessible | 1 |

422

| Variable | Compliance | Remedial Action |
|---|---|---|
| Occupancy Load | Yes | |
| Travel Distance from Furthest Point in a Unit | | |
| Common Path | Yes | |
| Dead End | No | Install Doorway |
| Egress Capacity | | |

┌─────────────────────────────────────────────────────────────────────────┐
│  RECEIVE INTO A CONTROLLER A FIRST TWO DIMENSIONAL REPRESENTATION OF AT │
│                    LEAST A PORTION OF A BUILDING                         │
│                                  1001                                    │
└─────────────────────────────────────────────────────────────────────────┘
┌─────────────────────────────────────────────────────────────────────────┐
│     REPRESENT THE FIRST TWO DIMENSIONAL REPRESENTATION AS A RASTER IMAGE │
│                                  1002                                    │
└─────────────────────────────────────────────────────────────────────────┘
┌─────────────────────────────────────────────────────────────────────────┐
│  ANALYZE THE RASTER IMAGE WITH AN ARTIFICIAL INTELLIGENCE ENGINE OPERATIVE│
│      TO ASCERTAIN COMPONENTS INCLUDED IN THE TWO DIMENSIONAL             │
│                           REPRESENTATION                                 │
│                                  1003                                    │
└─────────────────────────────────────────────────────────────────────────┘
┌─────────────────────────────────────────────────────────────────────────┐
│      DETERMINE A SCALE OF THE COMPONENTS INCLUDED IN THE FIRST TWO       │
│                      DIMENSIONAL REPRESENTATION                          │
│                                  1004                                    │
└─────────────────────────────────────────────────────────────────────────┘
┌─────────────────────────────────────────────────────────────────────────┐
│      ARRANGE THE COMPONENTS IN A USER INTERFACE TO FORM BOUNDARIES       │
│                                  1005                                    │
└─────────────────────────────────────────────────────────────────────────┘
┌─────────────────────────────────────────────────────────────────────────┐
│       GENERATE AN AREA OF A FEATURE BASED UPON THE FORMED BOUNDARIES     │
│                                  1006                                    │
└─────────────────────────────────────────────────────────────────────────┘
┌─────────────────────────────────────────────────────────────────────────┐
│  GENERATE A LENGTH AND/OR AN AREA OF A FEATURE BASED UPON A FORMED       │
│                              BOUNDARIES                                  │
│                                  1007                                    │
└─────────────────────────────────────────────────────────────────────────┘
                                    │
                                    ▼
                               ( FIG. 10B )
```

BASED UPON THE COMPONENTS INCLUDED IN THE TWO DIMENSIONAL REPRESENTATION, THE AREA OF A FEATURE, AND THE FORMED BOUNDARIES, DESIGNATING ONE OR MORE OF: AN OCCUPANCY LOAD; A TRAVEL DISTANCE; WIDTH OF A FEATURE, CLEARANCE AROUND A FEATURE; AND A DEAD END

1008

↓

REPEAT STEP 1008 FOR MULTIPLE AREA AND EGRESS PATH STARTING POSITION THAT MAY BE INCLUDED IN A FURTHEST DISTANCE EGRESS PATH

1009

↓

AGGREGATE ONE OR MORE OF: AREAS FOR OCCUPANCY LOAD, DISTANCES INCLUDED IN EGRESS PATHS, WIDTHS OF EGRESS PATHS, WIDTHS OF DOORWAYS, WIDTHS OF STAIRWAYS AND WIDTHS OF RAMPS FOR WHEELCHAIRS AND/OR WALKERS

ARTIFICIAL INTELLIGENCE DETERMINATION OF BUILDING METRICS FOR CODE COMPLIANCE WITH USER INTERACTION

CROSS REFERENCE TO RELATED MATTERS

The present application is a continuation in part of U.S. patent application Ser. No. 17/697,691, filed Mar. 17, 2022, entitled "ARTIFICIAL INTELLIGENCE DETERMINATION OF BUILDING METRICS FOR CODE COMPLIANCE" which claims priority to the U.S. patent application Ser. No. 17/515,774 entitled "METHODS AND APPARATUS FOR ARTIFICIAL INTELLIGENCE CONVERSION OF A TWO-DIMENSIONAL REFERENCE INTO AN ACTIONABLE INTERFACE" filed Nov. 1, 2021; which in turn claims the benefit of the Provisional Patent Application Ser. No. 63/158,702 filed Mar. 9, 2021, and entitled METHODS AND APPARATUS FOR PROCESSING TWO DIMENSIONAL DOCUMENTS WITH ARTIFICIAL INTELLIGENCE, and the benefit of Provisional Patent Application Ser. No. 63/158,727 filed Mar. 9, 2021 and entitled METHODS AND APPARATUS FOR IMPROVED CONSTRUCTION ESTIMATION PROCESSES, and the benefit of Provisional Patent Application Ser. No. 63/158,744 filed Mar. 9, 2021 and entitled METHOD AND APPARATUS FOR GENERATING IMPROVED PROJECT MANAGEMENT; and claims the benefit of Provisional Patent Application Ser. No. 63/231,595 filed Aug. 10, 2021 and entitled METHODS AND APPARATUS FOR PROCESSING TWO DIMENSIONAL DOCUMENTS AND BIM DOCUMENTS WITH ARTIFICIAL INTELLIGENCE.

FIELD OF THE INVENTION

The present invention provides improved methods and apparatus for artificial intelligence-based determination of whether a building design complies with required codes. More specifically, the present invention provides for methods and apparatus that analyze two-dimensional references and uses AI to ascertain whether architectural aspects pictorially described in the disparate two-dimensional references describe a building that complies with specified building codes.

BACKGROUND OF THE INVENTION

In order for buildings to be authorized for use, they are required to meet certain design parameters that correspond to codes enforced by an authority having jurisdiction. In the case of compliance, variables such as an occupant load, an area being consideration, egress path length, egress path width, clearance around a lavatory, access for person with disabilities, and other physical parameters of building aspects. In addition, the design plan parameters may vary for different types of building use. For example, a factory space will have different requirements than a residential space, which in turn will be different than an office space, retail space, restaurant space or other space for public access.

Proposed design plans are typically physically and visually inspected one by one by a highly skilled worker to ascertain compliance with required codes. Determination of whether a building is in compliance is made further complicated by different political areas having different requirements for various type of building occupancy and use.

Such manual processes are incredibly time intensive, and it is often difficult to locate skilled personnel with the correct credentials to complete an analysis of a building design for the many types of building use. In addition, different workers may have slightly different approaches and interpretations of a design plan. As a result, many jurisdictions have a backlog of designs to be analyzed and if a plan is not approved, the plan owner often has to engage in a time intensive process to ascertain options available in order to bring a plan into compliance. Also, a design plan may receive different treatment depending upon the worker that reviews the plan.

Due to their physical disabilities, disabled people are already at a disadvantage, and the way construction projects are carried out can play a part in this disadvantage. For people who are disabled, it may be traumatizing to not have a way to enter, or adequately maneuver through a building. A 2020 study by Apartment List found that, in nearly all major cities across the country, renters who have a physical disability spend a greater share of their income on housing costs. This is due, in part, to the fact that accessible housing is not ubiquitous; in the United States there are 15.2 million households that include a person with a physical disability, however, the U.S. only has 6.6 million homes that are livable to people with moderate mobility difficulties. One result of inadequate housing for those persons with a physical disability is an increase in the number of lawsuits filed for accessibility. The total number of ADA Title III Federal lawsuits filed in 2020 was 10,982 up approximately 400% from 2013 (2722 lawsuits). These numbers reflect Title III lawsuits. There is also a significant number of disability access lawsuits filed in state courts or demand letters that do not result in a lawsuit. Systems are needed to assist those responsible for buildings to create buildings that at least adhere to relevant codes, and preferably facilitate adoption of best practices above and beyond code requirements.

A need exists for a way to review design plans, provide meaningful analysis, and feedback results quickly, accurately, and consistently.

SUMMARY OF THE DISCLOSURE

Accordingly, the present disclosure provides methods and apparatus for analyzing two-dimensional (sometimes referred to as "2D") documents such as design plans with the aid of artificial intelligence (sometimes referred to herein as "AI") to make sure that the design plans are in compliance with requirements set forth by a authority having jurisdiction ("AHJ") for various aspects of a resulting building, such as fire safety or access to the building by disabled people needing to traverse areas throughout the building.

Specifically, the present invention uses AI to auto-detect, measure, and classify components of building plans, and ascertain whether requirements relating to building design are in compliance with a relevant code according to the AHJ, such as, but not limited to: occupancy load, travel distance to exit a building from within disparate areas, common paths, egress capacity, treatment of dead ends, percentage of accessible public entrance (versus services entrances); width, slope, rise and handrail requirements for ramps; door clearances and widths; minimum accessible parking space requirements; accessible routes within a building and on a building site, including egress; and elevator dimension requirements.

The present invention reduces inconsistencies in design compliance analysis and mistakes. It also provides consistent feedback on the reasons why a building design is in compliance or which aspects of a design plan place the building design in a state or non-compliance. Furthermore, according to some embodiments, suggestions may be made to achieve compliance or to adopt a best practice whether or not the best practice is required to meet an obligation dictated by a relevant code. For example, if a newer design of a wheel chair that enables a user to ascend and descend a stairwell while remaining in the wheelchair requires an additional clearance that is not yet adopted by a code dictated by an AHJ, the present invention may a) determine whether the design plan provides the necessary clearance; b) suggest a change to provide such clearance; and c) track a percentage of buildings that are capable of being traversed by the wheelchair.

A two-dimensional reference, such as a design floorplan is input into an AI engine and the AI engine converts aspects of the floorplan into components that may be processed by the AI engine, such as, for example, a rasterized version of the floorplan. The floorplan is then processed with machine learning to specify portions that may be specified as discernable components. Discernable components may include, for example, rooms, residential units, hallways, stairs, dead ends, windows, or other discrete aspects of a building.

A scaling process is applied to the floorplan and size descriptors are assigned to the discernable components. In addition, distances, such as, for example, a distance to an exit from the furthest point in a residential unit are calculated.

Variables are specified that will be used to assess compliance and a compliance determination is made based upon values for the specified variables. In some embodiments, the variables may include some or all of: occupancy load; travel distance; travel distance from a furthest point from a pint of egress; egress capacity; common path; dead end; a function of space; or other factor on which a determination of compliance and/or lack of compliance may be based. The AI engine will generate values for some, or all of the variables referenced to determine compliance.

In some embodiments, a controller will also set forth one or both of: components and conditions required to be in compliance; and where in the floorplan the components/conditions were included. Some embodiments may also include, in the case where the conditions/components were not met by a floorplan, the portions referenced in determining non-compliance. Still further, some embodiments may include suggested changes and/or options for sets of changes to the floor plan that may be implemented in order to achieve compliance.

Using the methods and apparatus described herein, a determination of whether a building is conducive for use by people with disabilities is generated. The present invention indicates how AI may be used in the design, construction and compliance of buildings meant for use by people to bring about profoundly important advances in safety and accessibility for the handicapped community and to mitigate risk from fire or other adverse conditions.

In general, the present invention provides for apparatus and methods related to receiving as input design plans (either physical or electronic) and generating one or more pixel patterns based upon automated processing of the design plans. The pixel patterns are analyzed using computerized processing techniques to mimic the perception, learning, problem-solving, and decision-making formerly performed by human workers (sometimes referred to herein as artificial intelligence or "AI").

Based upon AI analysis of pixel patterns derived from the two dimensional references and knowledge accumulated from increasing volumes of analyzed two dimensional references, interactive user interfaces may be generated that allow for a user to modify dynamic design plans of features gleaned from the two-dimensional reference. AI processing of the pixel patterns, based upon the two dimensional references, may include mathematical analysis of polygons formed by joining select vectors included in the two-dimensional reference. The analysis of pixel patterns and manipulatable vector interfaces and/or polygon-based interfaces is advantageous over human processing in that AI analysis of pixel patterns, vectors and polygons is capable of leveraging knowledge gained from one or both of: a select group and learnings derived from similar previous bodies of work, whether or not a human requesting a current analysis was involved in the previous learnings.

In still another aspect, in some embodiments, enhanced interactive interfaces may include one or more of: user definable and/or editable lines; user definable and/or editable vectors; and user definable and/or editable polygons. The interactive interface may also be referenced to generate diagrams based upon the lines, vectors and polygons defined in the interactive interface. Still further, various embodiments include values for variables that are definable via the interactive interface with AI processing and human input.

According to the present invention, analysis of pixel patterns and enhanced vector diagrams and/or polygon based diagrams may include one or more of: neural network analysis, opposing (or adversarial) neural networks analysis, machine learning, deep learning, artificial-intelligence techniques (including strong AI and weak AI), forward propagation, reverse propagation and other method steps that mimic capabilities normally associated with the human mind—including learning from examples and experience, recognizing patterns and/or objects, understanding and responding to patterns in positions relative to other patterns, making decisions, solving problems. The analysis also combines these and other capabilities to perform functions the skilled labor force traditionally performed.

BRIEF DESCRIPTION OF THE DRAWINGS

The accompanying drawings, which are incorporated into and constitute a part of this specification, illustrate several embodiments of the present invention. Together with the description, these drawings serve to illustrate some aspects of the present invention.

FIG. 1D illustrates tables that list exemplary parameters that may be values for variables used in AI engine processes.

FIGS. 3A-3D show various views of the AI-analyzed boundaries overlaid on the original floorplan including a table illustrated to contain hierarchical dominance relationships between area types.

FIGS. 4A-4B illustrate various aspects of dominance-based area allocation.

FIGS. 10A-10B illustrate additional method steps that may be executed in some embodiments of the present invention.

DETAILED DESCRIPTION

Figure 1A:
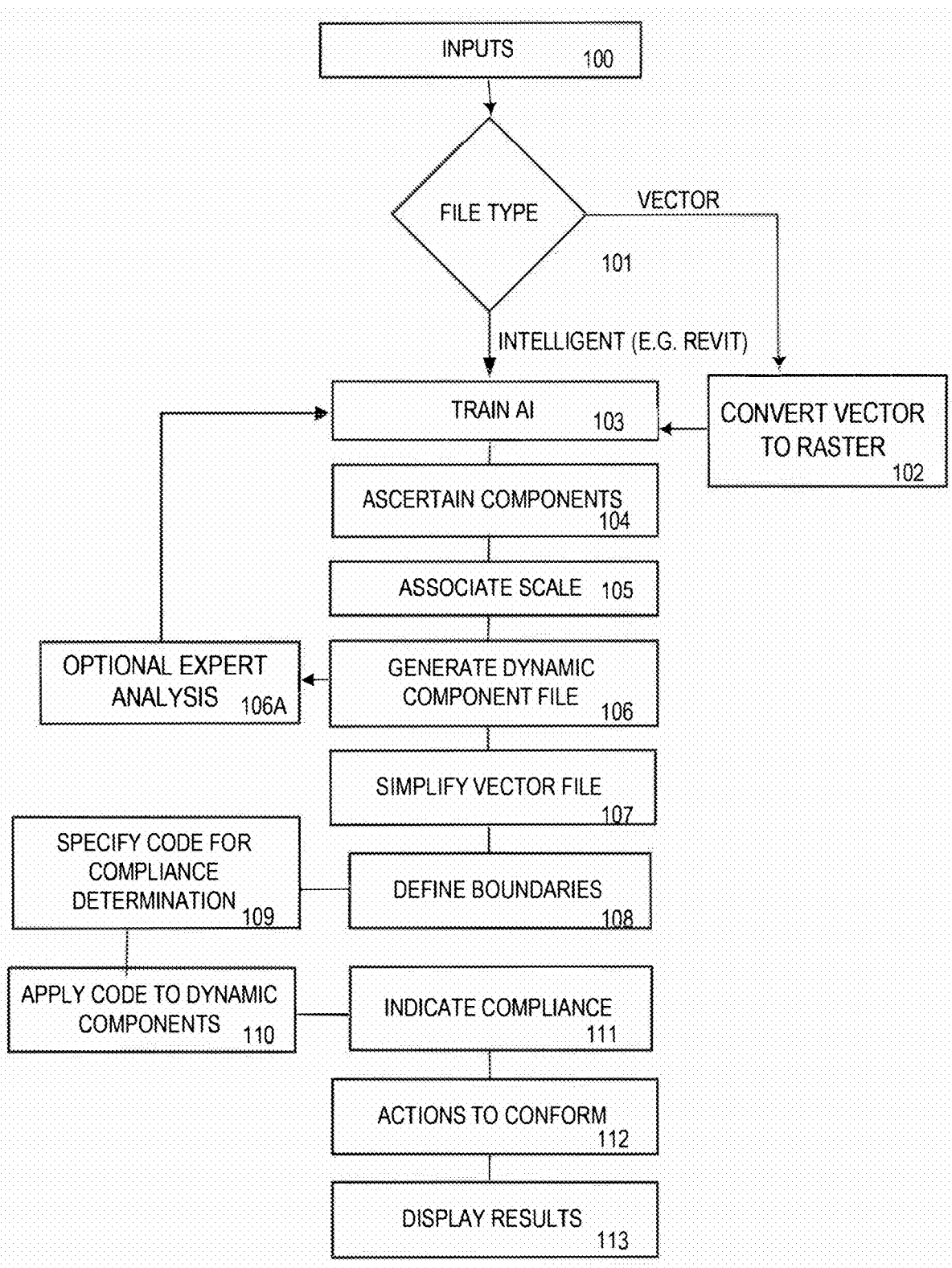
FIG. 1A illustrates method steps that may be implemented in some embodiments of the present invention.

The present invention provides improved methods and apparatus for artificial intelligence-based conversion of a two-dimensional reference, such as a design plan, into an interactive interface that indicates whether the design plan is compliant with building code requirements. The interactive interface is operative to generate values of variables useful to ascertain whether the submitted design plan meets or exceeds a designated building code pertaining to a geographic and/or geopolitical area. The interactive interface may also include specific requirements of a building code and indications of whether some or all of the requirements are met. In addition, the interface may include pictorial indications of portions of a design plan that have been associated with specific requirements of the building code during the AI analysis. The pictorial indications may include description of why a particular portion meets, exceeds, or does not meet a compliance code requirement.

As described herein, a design plan may be associated with an existing building or a proposed project that includes construction of a building (or other structure, herein collectively referred to as a "building"). Generation of documentation quantifying compliance or non-compliance of a design plan with specific building codes is also within the scope of the present invention. In some embodiments, automated suggested revisions to the design plan to bring the design plan into conformity with the code are also within the scope of the invention.

According to the present invention, a controller is operative to execute artificial intelligence (AI) processes and analyze one or more design plans of at least a portion of a building (or other structure) for which a compliance determination will be generated and provides values for variables used to ascertain a state of compliance based upon descriptive content included in the design plans.

In some embodiments, the design plan may include technical drawings such as blueprints, floorplans, design plans and the like. The AI analysis may include determination of boundaries and/or features indicated in the design plan. The design plan may be a two-dimensional static reference, or a two-dimensional or three dimensional dynamic reference, such as a Revit compatible file. This boundary determination may be used to provide useful information about a building such as, one or more of: rooms that comprise a residential unit; an area of an individual room or other area; a distance of travel to a point of egress, a width of a doorway; a width of a path or egress; a dead end path; a perimeter of a defined area; a point furthest from another point (e.g.; a point furthest from a point of egress); a common path; and the like. Based upon values of parameters derived from a two dimensional references, the AI engine may generate additional values related to code compliance, such as, one or more of: an egress capacity; an occupancy load; a function for a space; alternative paths of egress; dead end double back distances; or other parameters.

In some embodiments, the present invention may analyze a two dimensional reference and generate one or both of compliant paths from a defined room to a point of egress and suggested modifications to the two dimensional reference. Some preferred embodiments include an interface that describes a condition for compliance and illustrates a portion of the two dimensional reference that indicates a state of compliance or non-compliance associated with the condition. For example, an interface may require a path for egress that is less than a proscribed minimum distance and of sufficient width. The present invention provides for an interface illustrating a suggested path integrated into the design plan. A user may accept a path laid out by automated processes or input a specific path into a user interactive interface. The user interactive interface may also indicate whether the path supports a determination of compliance with a particular code or a state of non-compliance.

Similarly, the AI engine may apply machine learning to a design plan to determine values for variables that relate to other conditions for compliance, such as, by way of non-limiting example: dining accommodations; swimming pool access; locker rooms accommodations; door widths; parking space availability and surrounding area; widths of accessible routes to equipment; number of points of entry into a pool; number of points of egress; width of path of egress; width of stairways; and the like.

AI generated values for parameters may also be useful in a variety of estimation elements, such as (without limitation): flooring (wood, ceramic, carpet, tile, etc.), structural (poured concrete, steel), walls (gypsum, masonry blocks, glass walls, wall base, exterior cladding), doors and frames (hollow metal, wood, glass), windows glazing, insulation, paint (ceilings and walls), acoustical ceilings, code compliance, stucco (ceilings and walls), mechanical, plumbing, and electrical aspects. The estimation elements may be used to calculate a cost of construction to implement a modification to a building design in order to become compliant with a building code. The cost may be calculated based upon AI determination of architectural aspects, such as doorways, windows, angles in walls, curves in walls, plumbing fixtures, piping, wiring, electrical equipment or boxes; duct work; HVAC fixtures and/or equipment; or other component or aspect included in an estimate for work to cause a building to be compliant.

In the following sections, detailed descriptions of examples and methods will be given. The description of both preferred and alternative examples, though thorough, are exemplary only. It is understood that, to those skilled in the art, that various modifications and alterations may be apparent and within the scope of the present invention. Unless otherwise indicated by the language of the claims, the examples do not limit the broadness of the aspects of the underlying invention as defined by the claims.

Referring now to FIG. 1A, a general flow diagram showing some preferred embodiments of the present invention is illustrated. At step 100, a design plan (which may be design plan or dynamic architectural design file (e.g., a Revit® compatible file) indicating aspects of a building; is input into a controller or other data processing system using a computing device. The design plan may include an item of a known size, such as, by way of non-limiting example, a scale bar that allows a user to obtain a scale of the drawing (e.g., 1"=100' etc.) or an architectural aspect of a known dimension, such as a wall or doorway of a known length (e.g., a doorway known to be three feet wide).

Input of the two-dimensional reference into the controller may occur, for example, via known ways of rendering an image as a vector diagram, such as via a scan of paper-based initial drawings; upload of a vector image file (e.g., encapsulated postscript file (epf file); adobe illustrator file (ai file); or portable document file (pdf file). In other examples, a starting point for estimation may be drawing file in an electronic file containing a model output for an architectural floor plan. In still further examples, other types of images stored in electronic tiles such as those generated by cameras may be used as inputs for automated processes that determine compliance with requirements of a code.

In some embodiments, the design plan may be files extensions that include but are not limited to: DWG, DXF, PDF, TIFF, PNG, JPEG, GIF, or other type of file based upon a set of engineering drawings. Some design plans may already be in a pixel format, such as, by way of non-limiting example a two-dimensional reference in a JPEG, GIF or PNG file format. The engineering drawings may be hand drawings, or they may be computer-generated drawings, such as may be created as the output of CAD files associated with software programs such as AutoDesk™, Microstation™ etc. In other examples, such as for older structures, a drawing or other design plan may be stored in paper format or digital version or may not exist or may never have existed. The input may also be in any raster graphics image or vector image format.

The input process may occur with a user creating, scanning into, or accessing such a file containing a raster graphics image or a vector graphics image. The user may access the file on a desktop or standalone computing device or, in some embodiments, via an application running on a smart device. In some embodiments, a user may operate a scanner or a smart device with a charged couple device to create the file containing the image on the smart device.

In some embodiments, a degree of the processing as described herein may be performed on a controller, which may include a cloud server, a standalone computing device or a smart device. In many examples, the input file may be communicated by the smart device to a controller embodied to a remote server. In some embodiments, the remote server, which is preferably a cloud server, may have significant computing resources that may be applied to AI algorithmic calculations analyzing the image.

In some embodiments, dedicated integrated circuits tailored for deep learning AI calculations (AI Chips) may be utilized within a controller or in concert with a controller. Dedicated AI chips may be located on a controller, such as a server that supports a cloud service or a local setting directly.

In some embodiments, an AI chip tailored to a particular artificial intelligence calculation may be configured into a case that may be connected to a smart device in a wired or wireless manner and may perform a deep learning AI calculation. Such AI chips may be configurable to match a number of hidden levels to be connected, the manner of connection, and physical parameters that correspond to the weighting factors of the connection in the AI engine (sometimes referred to herein as an AI model). In other examples, software only embodiments of the AI engine may be run on one or more of: local computers, cloud servers, or on smart device processing environments.

At step 101, a controller may determine if a design received into the controller includes a vector diagram. If a file type of the received design plan, such as an input architectural floor plan technical drawing, includes at least a portion that is not already in raster graphics image format (for example that it is in vector format), then the input architectural floor plan technical drawing may be transformed to a pixel or raster graphics image format in step 102. Vector-to-image transforming software may executed by the controller, or via a specialized processor and associated software.

In some embodiments, the controller may determine a pixel count of a resulting rasterized file. The rasterized file will be rendered suitable for a controller hosting an artificial intelligence engine ("AI engine") to process, the AI engine may function best with a particular image size or range of image size and may include steps to scale input images to a pixel count range in order to achieve a desired result. Pixel counts may also be assigned to a file to establish the scale of a drawing—for example, 100 pixels equals 10 feet.

In various examples, the controller may be operative to scale up small images with interleaved average values with superimposed gaussian noise as an example, or the controller may be operative to scale down large images with pixel removal. A desired result may be detectable by one or both of the controller and a user. For example, a desired result may be a most efficient analysis, a highest quality analysis, a fastest analysis, a version suitable for transmission over an available bandwidth for processing, or other metric.

At step 103, training (and/or retraining) of the AI engine is performed. Training may include, for example manual identification of patterns in a rasterized version of an image included in a design plan that correspond with architectural aspects, walls, fixtures, piping, duct work, wiring or other features that may be present in the two-dimensional reference. The training may also include one or more of: identification of relative positions and/or frequencies and sizes of identified patterns in a rasterized version of the image included in the design plan.

In some embodiments, and in a non-limiting sense, an AI engine used to analyze the design plan may be based on a deep learning artificial neural network framework. The AI engine image processing may extract different aspects of an image included in the design plan that is under analysis. At a high level, the processing may perform segmentation to define boundaries between important features. In engineering drawings defined boundaries may be based upon the presence of architectural features, such as walls, doorways, windows, stairs, and the like.

In some embodiments, a structure of the artificial neural network may include multiple layers, such as, input layers and hidden layers with designed interconnections with weighting factors. For learning optimization, the input architectural floor plan technical drawings may be used for artificial intelligence (AI) training to enhance the AI's ability to detect what is inside a boundary. A boundary is an area on a digital image that is defined by a user and tells the software what needs to be analyzed by the AI. Boundaries may also be automatically defined by a controller executing software during certain process steps, such as a user query. Using deep artificial neural networks, original architectural floor plans (along with any labeled boundaries) may be used to train AI models to make predictions about what is inside a boundary. In exemplary embodiments, the AI model may be given over ~50,000 similar architectural floor plans to improve boundary-prediction capabilities.

In some embodiments, a training database may utilize a collection of design data that may include one or more of: a combination of a vector graphic two-dimensional references such as floor plans and associated raster graphic version of the two-dimensional references; raster graphic patterns associated with features; and a determination of boundaries may be automatically or manually derived. (An exemplary AI-processed two-dimensional reference that includes a design pan and/or a floorplan 210, with boundaries 211 predicted, is shown in FIG. 2B, based on the floorplan of FIG. 2A.)

In still another aspect, in some embodiments, a controller may access data from various types of BIM and Computer Aided Drafting (CAD) design programs and import dimensional and shape aspects of select spaces or portions of the designs as they related to a design plan.

At step 104, an AI engine may ascertain features included in the design plan, the AI engine may additionally ascertain that a feature is located within a particular set of boundaries or external to the set of boundaries. Features may include, by way of non-limiting example, one or more of: architectural aspects, fixtures, duct work, wiring, piping, or other item included in a two-dimensional reference submitted to be analyzed. The features and boundaries may be determined, for example, via algorithmically processing an input design plan image with a trained AI model. As a non-limiting example, the AI engine may process a raster file that is converted for output as an image file of a floorplan (as illustrated in FIG. 2B, a boundary is represented as line, a boundary may also be represented as a polygon, which may be a patterned polygon or other user discernable representation, such as a colored line etc.). Features may also be designated on a user interface. A feature may be represented via an artifact, such as, for example, one or more of: a point, a polygon, an icon, or other shape.

At step 105, a scale (e.g.; FIG. 2B item 217) is associated with the two-dimensional reference. In preferred embodiments, the scale is based upon a portion of the two-dimensional reference dedicated for indicating a scale, such as a ruler of a specific length relative to features included in a technical drawing included in the two-dimensional reference. The software then performs a pixel count on the image and applies this scale to the bitmapped image. Alternatively, a user may input a drawing scale for a particular image, drawing or other two-dimensional reference. The drawing scale, may for example, be in inches: feet, centimeters: meters, or any other appropriate scale.

In some embodiments, a scale may be determined by manually measuring a room, a component, or other empirical basis for assessing a scale (including the ruler discussed above). Examples therefore include a scale included as a printed parameter on two-dimensional reference or obtained from dimensioned features in the drawing. For example, if it is known that a particular wall is thirty feet in length, a scale may be based upon a length of the wall in a particular rendition of the two-dimensional reference and proportioned according to that length. (Fig.

At step 106, a controller is operative to generate a user interface with dynamic components that may be manipulated by one or both of user interaction and automated processes. Any or all of the components in a user interface may be converted to a version that allows a user to modify an attribute of the component, such as the length, size, beginning point, end point, thickness, or other attribute. In some embodiments, a boundary may be treated as a component and manipulated in like manner.

Other components included in the user interface may include, one or more of: AI engine predicted components, user training aspects, and AI training aspects. In some non-limiting examples of the present invention, a generative adversarial network may include a controller with an AI engine operative to generate a user interface that includes dynamic components. In some embodiments, a generative adversarial network may be trained based on a training database for initial AI feature recognition processes.

An interactive user interface may include one or more of: lines, arcs, or other geometric shapes and/or polygons. In some embodiments, the geometric shapes and/or polygons may comprise boundaries. The components may be dynamic in that they are further definable via user and/or machine manipulation. Components in the interactive user interface may be defined by one or more vertices. In general, a vertex is a data structure that can describe certain attributes, like the position of a point in a two-dimensional or three-dimensional space. It may also include other attributes, such as normal vectors, texture coordinates, colors, or other useful attributes.

At step 107, some embodiments may include a simplification or component refinement process that is performed by the controller. The component refinement process is functional to reduce a number of vertices generated by a transformation process executed via a controller generating the user interface and to further enhance an image included in the user interface. Improvements may include, by way of non-limiting example, one or more of: smooth an edge, define a start, or end point, associate a pattern of pixels with a predefined shape corresponding with a known component or otherwise modify a shape formed by a pattern of pixels.

In addition, some embodiments that utilize the recognition step transforms features such as windows, doorways, vias and the like to other features and may be remove them and/or replace them as elements—such as line segments, vectors, or polygons referenceable to other neighboring features. In a simplification step, one or more steps the AI performs (which may in some embodiments be referred to as an algorithm or a succession of algorithms) may make a determination that wall line segments, and other line segments represent a single element and then proceeds to merge them into a single element (line, vector, or polygon). In some embodiments, straight lines may be specified as a default for simplified elements, but it may also be possible to simplify collections of elements into other types of primitive or complex elements including polylines, polygons, arcs, circles, ellipses, splines, and non-uniform rational basis spline (NURBS) where a single feature object with definitional parameters may supplant a collection of lines and vertices.

The interaction of two elements at a vertex may define one or more new elements. For example, an intersection of two lines at a vertex may be assessed by the AI as an angle that is formed by this combination. As many construction plan drawings are rectilinear in nature, it may be that the simplification step inside a boundary can be considered a reduction in lines and vertices and replacing them with elements and/or polygons.

In another aspect, in some embodiments, one or both of a user and a controller may indicate a component type for a boundary. Component types by include, for example, one or more of line segments, polygons, multiple line segments, multiple polygons, and combinations of line segments and polygons.

At step 106A, In some embodiments, components presented in an interactive user interface may be analyzed by a user and refinements may be made to one or more components (e.g., size, shape and/or position of the component). In some embodiments, user modifications may also be input back to the AI engine train the AI engine. User modifications provided back to the AI Engine may be referenced to make subsequent AI processes more accurate and/or enable additional types of AI processes.

At step 108, a controller (such as, by way of non-limiting example, a cloud server) operative as an AI engine may create AI-predicted dynamic boundaries that are arranged to form a representation of submitted design plan that does not include the boundaries that bound it.

In various embodiments, a boundary may be used to define a unit, such as a residential unit, a commercial office unit, a common area unit, a manufacturing area, a recreational area, a dining area, or other area delineated according to a permitted use.

Some embodiments include an interface that enables user modifications of boundaries and areas defined by the modified boundaries. For example, a boundary may be selected and "dragged" to a new location. The user interface may enable a user to select a line end, a polygon portion, an apex, or other convenient portion and move the selected portion to a new position and thereby redefine the line and/or polygon. An area that includes a boundary as a border will be redefined based upon the modification to the boundary. As such, an area of a room or unit may be redefined by a user via the user interface. Changing an area of a room and/or unit may in turn be used as a basis for modifying an occupant load, defining an egress path, classifying a space, or other purpose.

For example, a change in a boundary may make an area larger. The larger area may be a basis for an increase in occupancy load. The larger area may also result in a longer path from the furthest point in the defined area to a point of egress (e.g.; if a user chooses to use a worst case in determining an egress route).

At step 109, one or both of the user and an automated process on a controller may specify a code for which a compliance determination based upon the AI generated boundaries. In some embodiments, a selection of a set of codes to apply to the floor plan may be automated, for example, based upon a geographic or geopolitical area in which the building resides or will be constructed. In other embodiments, a user may specify a set of codes, such as, for example, a drop down menu may indicate available codes and a suer may select one or more sets of codes to apply to the floor plan. Accordingly, by way of non-limiting example, a user may select that a set of floorplans be analyzed with the AI engine to assess compliance with Americans with Disabilities Act (ADA) compliance and National Fire protection Association code, or other code adopted by an authority having jurisdiction.

At step 110, a set of parameters for a selected set of code is applied to some or all of the dynamic components generated via the AI engine.

At step 111, the user interface or other output may be caused to display an indication of whether a design plan is in compliance with the selected set(s) of codes. In some preferred embodiments, a list of conditions required in order for a building to be in compliance, and an indication of why one or more of the conditions is met may be illustrated within a user interface or other output. For example, if the ADA is the basis for a set of codes to ascertain compliance with, a set of floorplans may be input into an AI engine and the Ai engine will determine a value, and/or a range of values, which may be compared to the code requirements and a determination may be generated indicating whether the design plans describe a building that is in compliance with a selected set of codes. The ADA may require that a building described in the design plan have accessible routes that are at least thirty six (36) inches wide. The AI engine may analyze a design plan and generate boundaries that may be manipulated by a user and then generate values for variables required to assess whether a condition the code sets forth is present in the design plan, such as the 36 inch wide routes.

In generating a value for such as variable, the AI engine and/or the user may need to that one or more boundaries define a specific type of area, such as a bedroom, a hallway, or a stairwell. Each specific type of area may have specified variables associated with it. By way of non-limiting example, the user interface may employ a simple yes/no indicator for compliance with a requirement of a selected code. In other embodiments, the user interface may visually indicate portion of the design plan that was referenced in determining a state of compliance or on-compliance, e.g.; a doorway that is thirty six inches or more and therefore in compliance or a hallway that is only twenty four inches wide and therefore not in compliance.

Some specific embodiments may include a first portion of a user interface with delineated conditions for code compliance, such as, for example, a listing of sections of a code, an ability for a user to select a specific section of the code, and a link that brings up an interface with visual indicators illustrating a state of compliance (or non-compliance as the case may be) with the user selected section of code.

At step 112, in another aspect, the present invention may use the AI to generate suggested modifications to a design plan in order to transition the design plan from a state of non-compliance to a state of compliance. In addition, the user interface may indicate other actions, in addition to a modification to the design plan, (e.g., reduce an occupant load) in order to conform to code.

At step 113, a conclusion of whether a design plan is in compliance may be displayed as a user interface in an integrated fashion in relation to a replication of the two-dimensional reference (such as the design plan, architectural floor plan or technical drawing). The user interface may also be shown in a form that includes user modifiable elements, such as, but not limited to: polylines, polygons, arcs, circles, ellipses, splines, line segments, icons, points and other drawing features or combinations of lines and other elements.

Figure 1B:
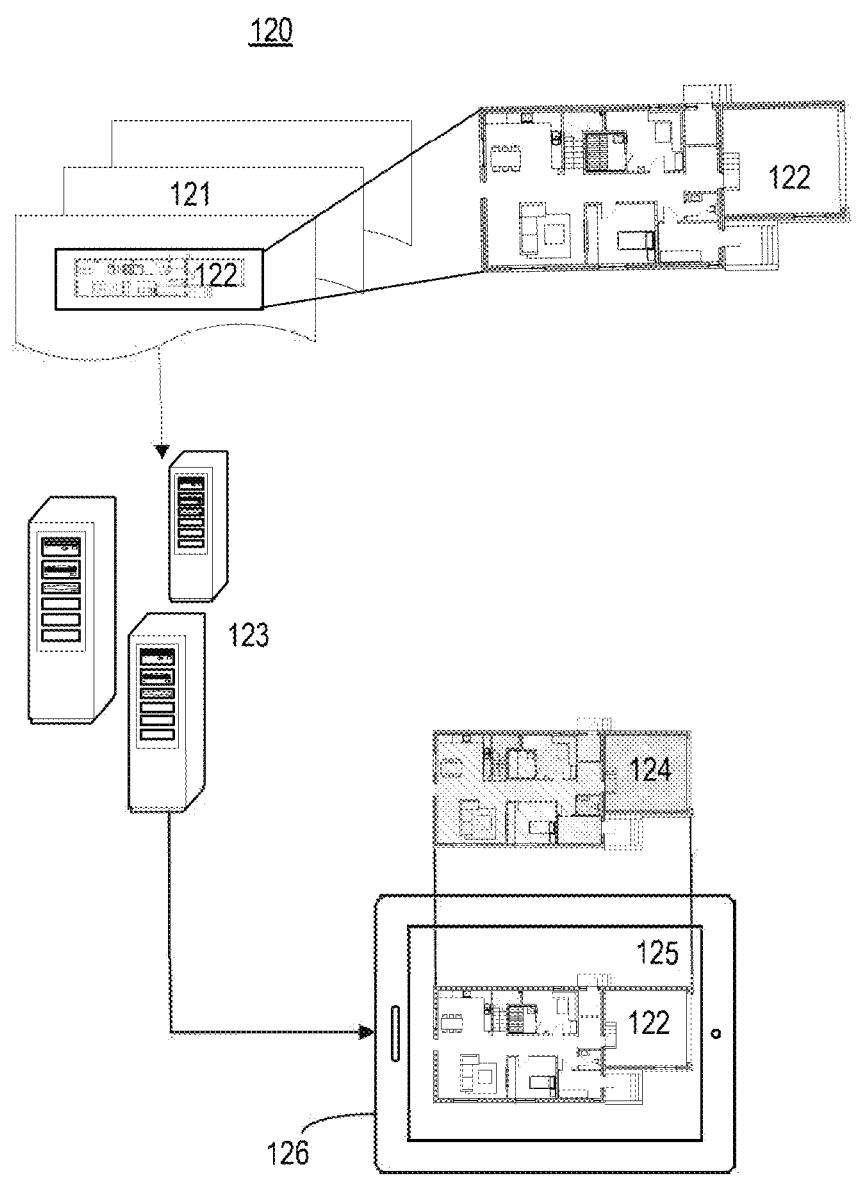
FIG. 1B illustrates a high level diagram of components included in a system that uses AI to generate an interactive user interface.

Referring now to FIG. 1B, a high level diagram illustrates components included in a system 120 that uses AI to generate an interactive user interface 125 and programmable apparatus (controller) 123 operative to execute method steps useful in determining compliance with a design plan or other architectural description.

According to some embodiments of the present invention, a two dimensional reference 121, such as a design plan, floorplan, blueprint, or other document includes a pictorial representation 122 of at least a portion of a building. The pictorial representation 122 may include, for example, a portable document format (PDF) document, jpeg, prig or other essential non-dynamic file format, or a hardcopy document. The pictorial representation 122 includes an image descriptive of architectural aspects of the building, such as, by way of non-limiting example, one or more of: walls, doors, doorways, hallways, rooms, residential units, office units, bathrooms, stairs, stairwells, windows, fixtures, real estate accouterments, and the like.

The two dimensional reference 121 may be electronically provided to a controller 123 running an AI engine. The controller 123 may include, for example, one or more of: a cloud server, an onsite server, a network server, or other computing device, capable of running executable software and thereby activate the AI engine. Presentation of the two dimensional reference may include for example, scanning a hardcopy version of the two dimensional document into electronic format and transmitting the electronic format to the controller 123 running the AI engine.

The controller is operative to generate a user interface 125 on a user computing device 126. The user computing device may include a smart device, workstation, tablet, laptop or other user equipment with a processor, storage, and display.

The user interface 125 includes a reproduction of the pictorial representation 122 and an overlay 124 with one or more user manipulatable components, such as, by way of non-limiting example: boundaries, line segments, polygons, images, icons, points, and the like. The line segments may have calculated lengths that may be mathematically manipulated and/or summarized. Aspects such as polygons, line segments, shapes, icons, and points may be counted, added, subtracted, extrapolated, and other functions performs on them.

In addition, renditions of the user interface 125 may be created and saved, and/or communicated to other users, or controllers, compared to subsequent interface renditions, archived and/or submitted to additional AI analysis.

In some embodiments, a first user interface 125 rendition, may be modified by a user to create a second user interface 125, and submitted to AI analysis to ascertain compliance with a selected code. Some embodiments may also calculate costs, expenses, man hours or other variable associated with changes to a design plan in order to bring the design plan into compliance. Change order renditions provided as options to bring a design plan into compliance with a selected code may also be provided with a unique identifier, time and/or date stamped to create a continuum of work, as related to original projects and compliance initiated changes. Each of the items in the continuum of work may be stored and subsequently used for ascertaining eventual compliance a building with each selected code.

Figure 1C:
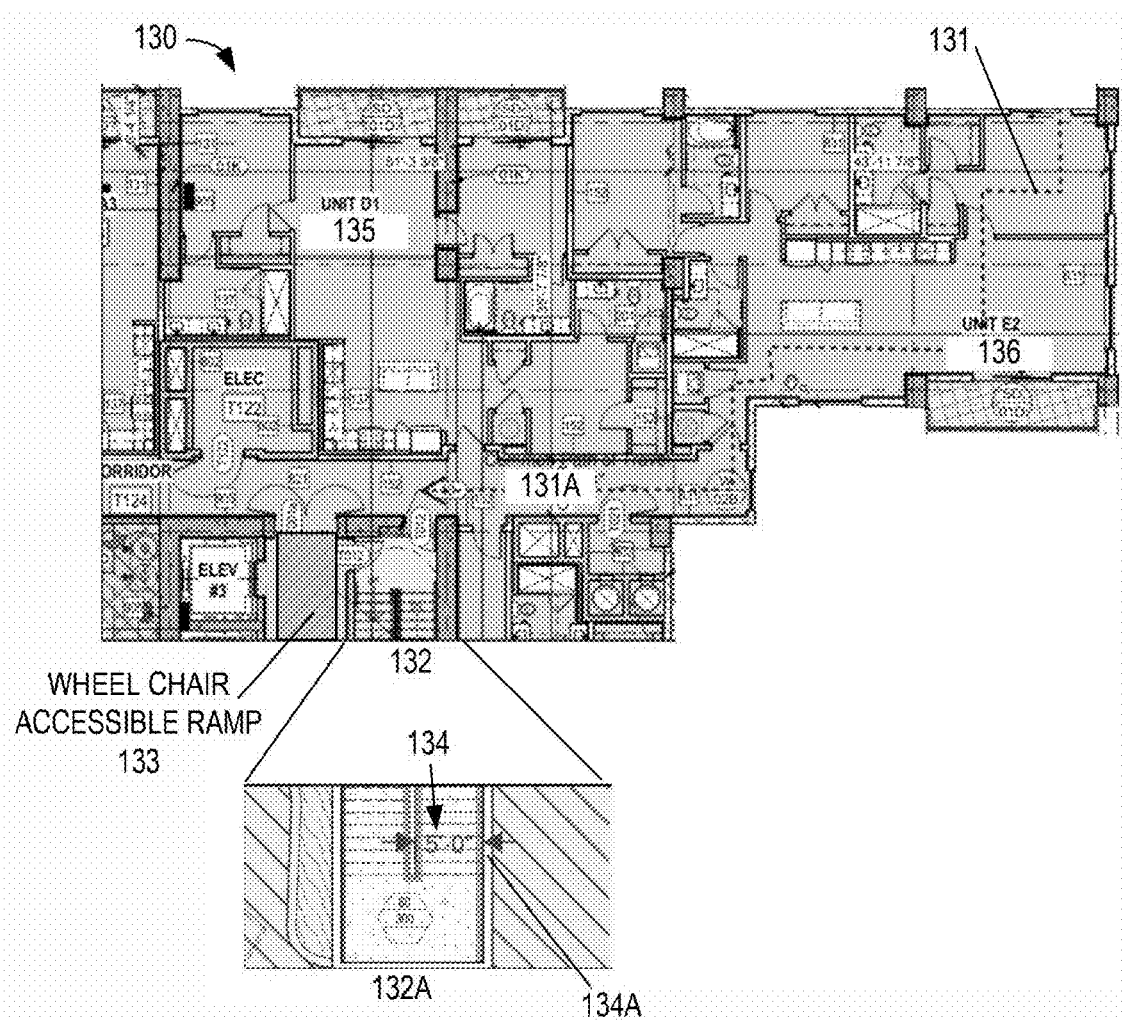
FIG. 1C illustrates a design plan that is illustrated with multiple dwelling units.

Referring now to FIG. 1C, a design plan is illustrated with multiple dwelling units 135-136 and a path of travel 131 from a farthest point in the unit, and a blow up of the stairwell 132A of a portion of the design plan determined by the AI engine to be a stairwell 132. The blowup of the stairwell 132A includes a dimension 134 indicating that % of the stairwell 132A (typically either ascending or descending side of a stairwell 132A) is equal to five feet. A dimensional end cap 134A is illustrated and indicates one side of the dimension 134.

In some embodiments, the end cap 134A will be placed on a user interface with dynamic components 130 by a controller as a result of a determination by an AI engine in communication with the controller. Furthermore, some embodiments allow placement of the end cap 134A may be a result of a user action. Still further, one or both of the controller and the user may adjust placement of an end cap 134A initially placed by either the controller and/or the user.

According to the present invention, once a dimension 134 has a value associated with it, the dimension may be used to extrapolate other dimensions, such as, for example, one or more of: a length and/or width of a wheelchair accessible ramp 133; a length 131A of a path 131, an area of a unit 135-136 or other distance and/or area. As discussed in more detail herein, a length 131A of a path 131 may be used to calculate a length of a path from a furthest point to a point of egress.

The illustrated end cap 134A is shown as a line, other and caps 134A may also be within the scope of the present invention that may better suit a particular aspect on a design plan interface 103, such as, by way of non-limiting example, one or more of: a perpendicular corner, a dot, an arrow, a circle, angled lines joined at a defined number of degrees, such as thirty degrees, forty-five degrees, ninety degrees or an angle provided by one or both of the AI engine and the user.

Referring now to FIG. 1D, tables 140 list exemplary parameters that may be values for variables used in AI engine processes to determine whether a design plan is in compliance with a set of required code parameters and/or best practices. As described herein, a design plan may be defined as one or more areas or regions. An area may be associated with variables. Values for the variables may be generated by the AI engine and/or provided via user input and may be a value representative of a relevant code, or a best practice. Non-limiting examples of variables include: a function of the area 141, which may have an exemplary value of: kitchen, dining, bedroom, bathroom, living room, meeting room, office, lounge, or other descriptor of a space that may be one or more "rooms" in a Unit 143. A 'Type' variable 142 may indicate a sanctioned use for the area, such as, for example: residential, business, assembly, storage, clean room, retail, medical and the like. An area 144 may be indicted as square feet, square meters, square yards, or other designated measurement unit for area.

A Perimeter 145 includes a value for distance measurement. An area per occupant 146 may be indicated as square feet per occupant, such as 10 to 30 square feet. The area per occupant may be determined via the AI engine based upon a geopolitical location the building represented by the design plan will be built in, or input by a user. A maximum occupancy 147 may be calculated from the area 144 and the sq. ft per occupant 146. The Distance to front door 148 may be calculated by the AI engine by analyzing a layout and available paths for an occupant to travel in order to exit (as described in more detail with regard for FIGS. 12A-12C.

Other variables, such as longest distance per unit 149 and longest per type 150 may include values for variables representative of one or both of: distances calculated by the AI engine based upon analysis of a design floorplan. Aggregations 151-153 may include a sum of some or all values for variables in a given class, such as, for example an aggregated sum of areas 144, aggregated maximum occupancy 152, and aggregated longest distance 153.

An AI engine may also calculate values for egress capacities 140A based upon the AI processes presented herein that receive a simple 2D design plan document and derive values for a means of egress 162; door width 154, which may be based upon a known scale or a scale designated by a known distance such as a door width or stairwell width; a door width capacity factor 155, which may be based upon a code for a geopolitical area or input by a user; a capacity calculated based using the door width and capacity factor, stair width 157; stair width capacity factor 158; a capacity 159 calculated based upon the stair width 157 and the stair width capacity factor 158; a limiting capacity 160 with a value based upon a lesser of the door width capacity 156 and the stair width capacity 159; and a use 161. Other variables and values for those variables are also within the scope of the present invention.

Figure 2A:
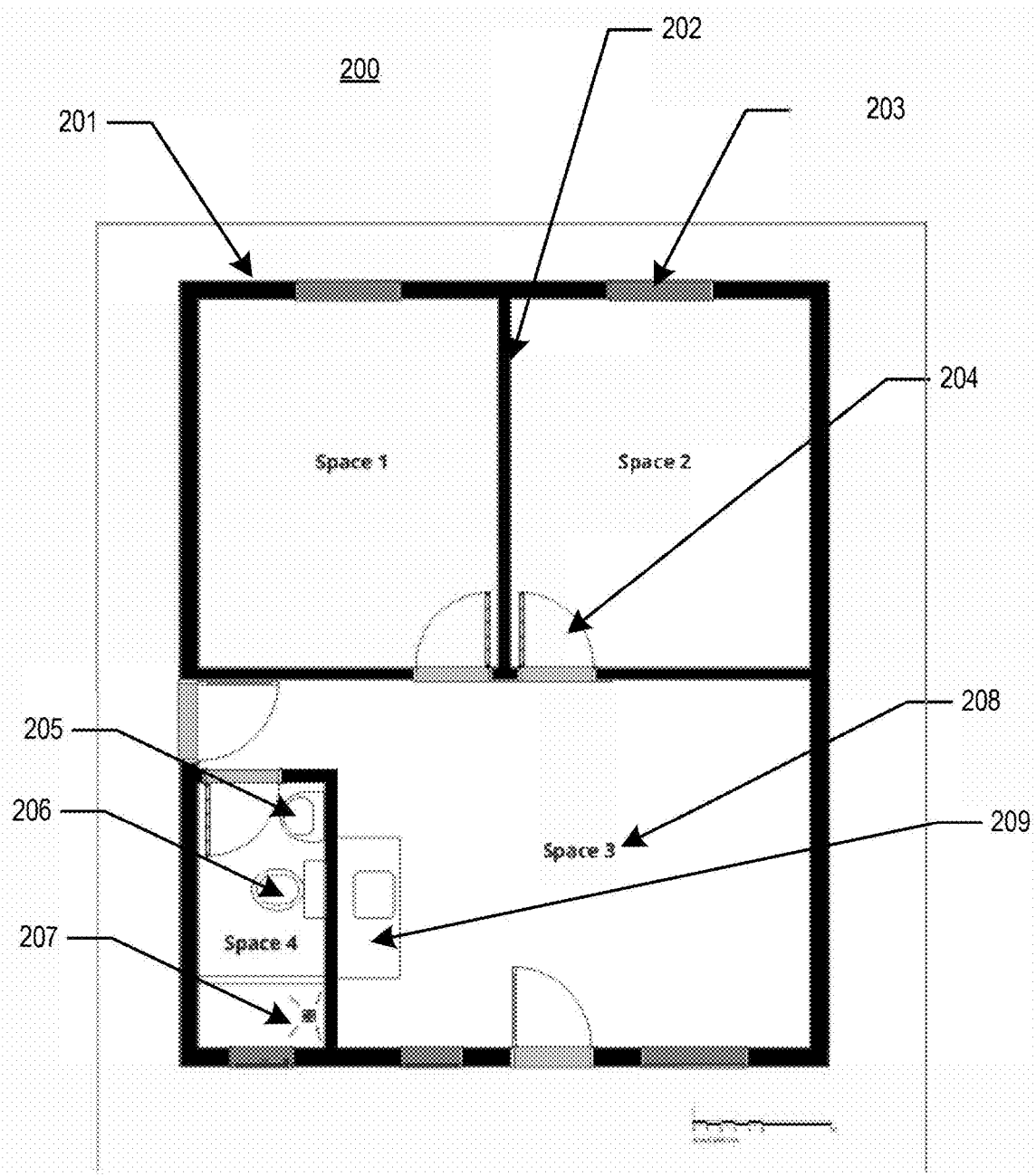
FIGS. 2A, 2B, 2C and 2D illustrate a-two-dimensional representation of a floor plan and an AI analysis of same to assess boundaries.
Figure 2B:
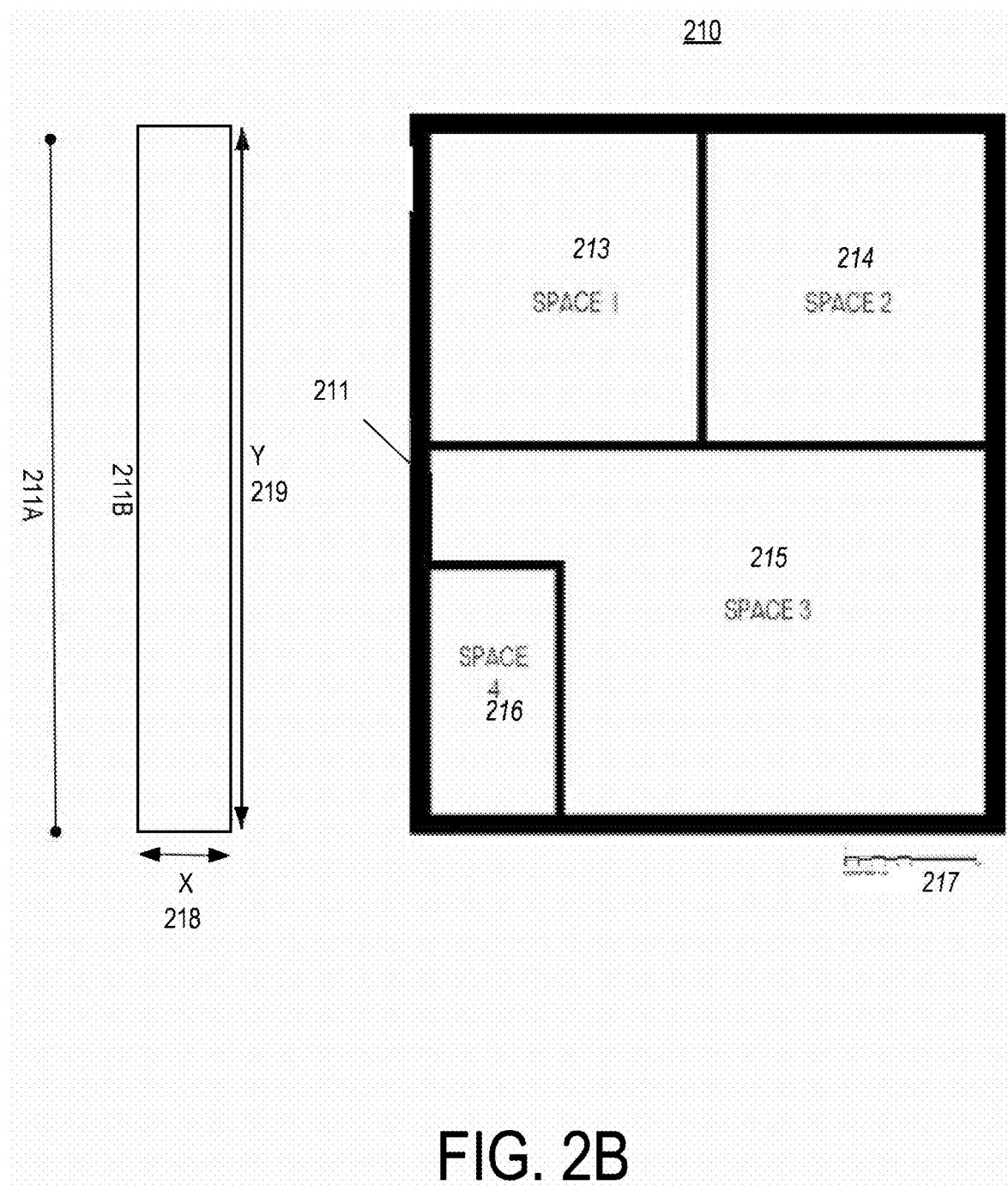

Referring now to FIG. 2A, a given two-dimensional reference 200 may have a number of elements that an observer and/or an AI engine may classify as features 201-209 such as, for example, one or more of: exterior walls 201; interior walls 202; doorways 204; windows 203; plumbing components, such as sinks 205, toilets 206, showers 207, water closets or other water or gas related items; kitchen counters 209 and the like. The two-dimensional references 200 may also include narrative or text 208 of various kinds throughout the two-dimensional references.

Identification and characterization of various features 201-209 and/or text may be included in the input two-dimensional references. Generation of values for variables included in generating a bid may be facilitated by splitting features into groups called 'disparate features' 201-209 and boundary definitions and generation of a numerical value associated with the features, wherein numerical values may include one or more of: a quantity of a particular type of feature; size parameters associated with features, such as the square area of a wall or floor, complexity of features (e.g. a number of angles or curves included in a perimeter of an area; a type of hardware that may be used to construct a portion of a building, a quantity of a type of hardware that may be used to construct a portion of the building; or other variable value.

In some embodiments, a recognition step may function to replace or ignore a feature. For example, for a task goal of the result shown in FIG. 2B, features such as windows 203, and doorways, 204, may be recognized and replaced with other features consistent with exterior walls 201 or interior walls 202 (as shown in FIG. 2A). Other features may be removed, such as the text 208, the plumbing features and other internal appliances and furniture which may be shown on drawings used as input to the processing. Again, such feature recognition may be useful to accomplish other goals, but for a goal of boundary 211 definition that delineates a floorplan 210 as illustrated in FIG. 2B a pictorial representation may be purposefully devoid of such features, as illustrated.

Referring now to FIG. 2B, a boundary 211 is illustrated around a grouping of defined spaces 213-216. Spaces are areas within a boundary (which may include, but are not limited to rooms, hallways, stairwells etc.).

FIG. 2B illustrates an AI predicted boundary 211 based upon an analysis of the floorplan 210 illustrated in FIG. 2A. A transition from FIG. 2A to FIG. 2B illustrates how an AI engine successfully distinguishes between wall features and other features such as a shower 207, kitchen counter 209, toilet 206, bathroom sink 205, etc. shown in FIG. 2A.

In another aspect, in some embodiments, a boundary may include a polygon 211B. A polygon may be any shape that is consistent with a design submitted for AI analysis. For example, a rectangular polygon 211B may be based upon a wall segment 211A and have a width X 218 and a length Y 219. Boundaries that include polygons are useful, for example in creating a three dimensional representation of a design plan According to the present invention, a boundary may be represented on a user interface as one or both of: one or more line segments, and one or more polygons. In addition, a feature may be represented as a single point, a polygon, an icon, or a set of polygons. In some embodiments, a point may be placed in a centroid position for the feature and the centroid points may be counted, summarized, subtracted, averaged, or otherwise included in mathematical processes.

In some embodiments, an analytical use for a boundary may influence how a boundary is represented. For example, determination of a length of a wall section, or size of a feature may be supported via a boundary that includes a line segment. A count of feature type may be supported with a boundary that includes a single point or predefined polygon or set of polygons. Extrapolation of a two dimensional reference into a three dimensional representation may be supported with a boundary that includes polygons.

A scale 217 may be used to indicate a size of features included in a technical drawing included in the two-dimensional reference. As indicated above, executable software may be operative with a controller to count pixels on an image and apply a scale to a bitmapped image. Alternatively, a user may input a drawing scale for a particular image, drawing or other two-dimensional reference. Typical units referenced in a scale include inches: feet, centimeters: meters, or any other appropriate unit.

In some embodiments, a scale 217 may be determined by manually measuring a room, a component, or other empirical basis for assessing a relative size. Examples therefore include a scale included as a printed parameter on two-dimensional reference or obtained from dimensioned features in the drawing. For example, if it is known that a particular wall is thirty feet in length, a scale may be based upon a length of the wall in a particular rendition of the two-dimensional reference and proportioned according to that length.

Figure 2C:
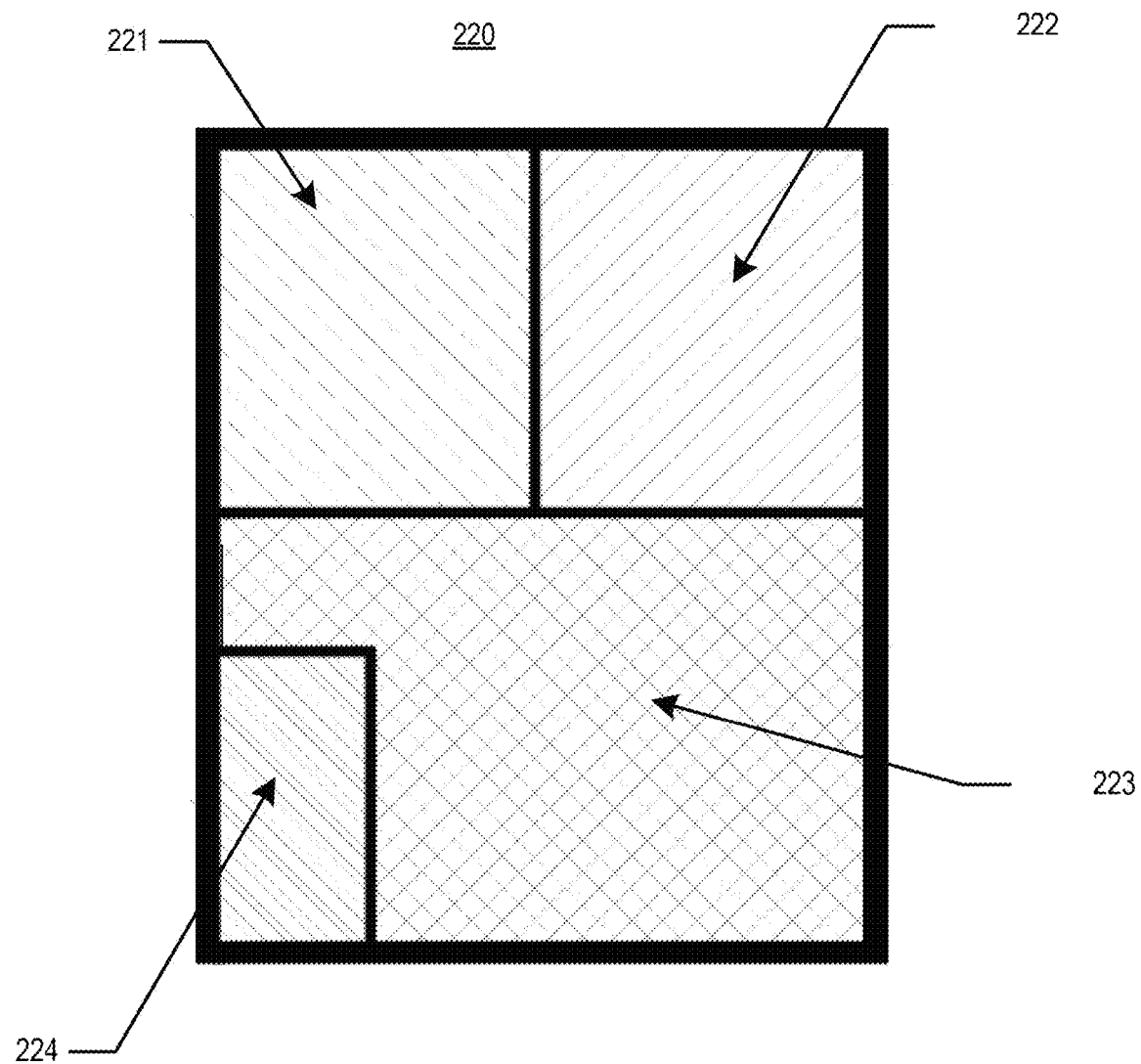

Referring now to FIG. 2C, a user interface 220 is illustrated with multiple regions 221-224. The multiple regions 221-224 may be presented via different hatch representations or other distinguishing pattern (in some embodiments regions may also be represented as various colors etc.). During training of AI engines, and in some embodiments, when a submitted design drawing includes highly customized or unique features, a user may wish to adjust an automated identification of boundaries and automated filling of space within the boundaries.

During training of processes executed by a controller, such as those included in an AI engine made operative by the controller, and in some embodiments, when a submitted design drawing includes highly customized or unique features, an automated identification of boundaries and automated filling of space within the boundaries may be included in the interactive user interface may not be according to a particular need of a user. Therefore, in some embodiments of the present invention, an interactive user interface may be generated that presents a user with a display of one or more boundaries and pattern or color filled areas arranged as a reproduction of a two-dimensional reference input into the AI engine.

In some embodiments, the controller may generate a user interface 220 that includes indications of assigned vertices and boundaries, and one or more filled areas or regions with user changeable editing features to allow the user to modify the vertices and boundaries. For example, the user interface may enable a user to transition an element such as a vertex to a different location, change an arc of a curve, move a boundary, of change an aspect of polylines, polygons, arcs, circles, ellipses, splines, NURBS or predefined subsets of the interface. The user can thereby "correct" an assignment error made by the AI engine, or simply rearrange aspects included in the interface for a particular purpose or liking.

In some embodiments, modifications and/or corrections of this type can be documented and included in training datasets of the AI model, also in processes described in later portions of the specification.

Discrete regions may be regions associated with an estimation function. A region that is contained within a defined wall feature may be treated in different ways such as ignoring all area in a boundary, to counting all area in a boundary (even though regions do not include boundaries). If the AI engine counts the area, it may also make an automated decision on how to allocate the region to an adjacent region or regions that the region defines.

Figure 2D:
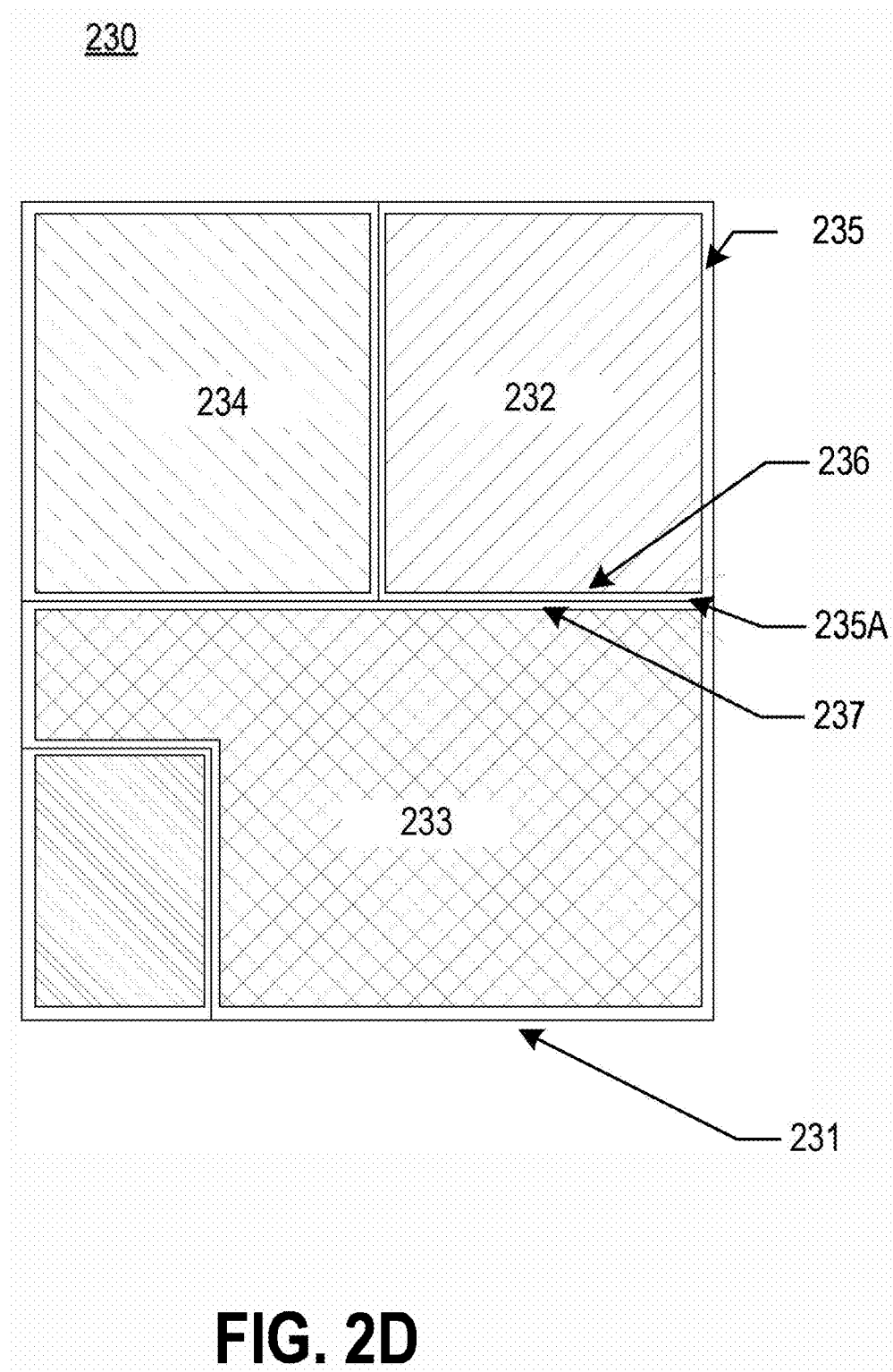

Referring to FIG. 2D, an exemplary user interface 230 illustrates a user interface floorplan model 231 with boundaries 236-237 between adjacent regions 233-234 with interior boundaries 236-237 that may be included in an appropriate region of a dynamic component 130. The AI may incorporate a hierarchy where some types of regions may be dominant over others, as described in more detail in later sections. Regions with similar dominance rank may share space, or regions with higher dominance rank may be automatically assigned to a boundary. In general, a dominance ranking schema will result in an area being allocated to the space with the higher dominance rank. In some embodiments, a dominance rank will allocate an area that may be used in determining an occupancy load. Moreover, in those embodiments that analyze a dynamic file (such as, for example, a Revit® compatible file) a dominance rank may be included, or added to, one or more dynamic features and be modified as the dynamic feature is modified.

In some embodiments, an area 235A between interior boundaries 236-237 and an exterior boundary 235 may be fully assigned to an adjacent region 232-234. An area between interior boundaries 235A may be divided between adjacent regions 232-234 to the interior boundaries 236-237. In some embodiments, an area 235A between boundaries 236-237 may be allocated equally, or it may be allocated based upon a dominance scheme where one type of area is parametrically assessed as dominant based upon parameters such as its area, its perimeter, its exterior perimeter, its interior perimeter, and the like. Parameters may also be based upon items that are automatically counted using AT analysis of pixel patterns that identifies a pattern as an item, such as, by way of non-limiting example, one or more of: doors or other paths of egress; plumbing fixtures; fixed obstacles; stairs; inclines; and declines.

In some examples, a boundary 235-237 and associated area 235A may be allocated to a region 232-234 according to an allocation schema, such as, for example, an area dominance hierarchy, to a prioritize a kitchen over a bathroom, or a larger space over a smaller space. In some embodiments, user selectable parameters (e.g., a bathroom having parameters such as two showers and two sinks may be more dominant over a kitchen having parameters of a single sink with no dishwasher). These parameters may be used to determine boundary and/or area dominance. A resulting computed floorplan model may include a designation of an area associated with a region as illustrated in FIG. two dimensional. In various embodiments, different calculated features are included in a user interface floorplan model 231 such as features representing aspects of a wall, such as, for example, center lines, the extents of the walls, zones where doors open and the like, and these features may be displayed in selected circumstances.

Some embodiments may also include AI analysis of a dynamic tile, such as a Revit or Revit compatible tile and/or a raster file with patterns of dots, the AI may generate a likelihood that a region or area represented by one or both of a polygon or pattern of dots, includes a common path or dead end or an area definable for determining an occupancy load, egress capacity, travel distance and/or other factor that may influence a decision on compliance with a local code.

Once boundaries have been defined a variety of calculations may be made by the system. A controller may be operative to perform method steps resulting in calculation of a variable representative of a floorplan area, which in some embodiments may be performed by integrating areas between different line features that define the regions.

Alternatively, or in addition to method steps operative to calculate a value for a variable representative of an area, a controller may be operative to generate a value for element lengths, which values may also be calculated. For example, if ceiling heights are measured, presented on drawings, or otherwise determined then volume for the room and surface area calculations for the walls may be made. There may be numerous dimensional calculations that may be made based on the different types of model output and the user inputted calibration factors and other parameters entered by the user.

In some embodiments, a controller may be provided with two dimensional references that include a series of architectural drawings with disparate drawings representing different elevations within a structure. A three dimensional model may be effectively built based upon a sequenced stacking of the disparate drawings representing different levels of elevations. In other examples, the series of drawings may include cross sectional representation as well as elevation representation. A cross section drawing, for example, may be used to infer a common three-dimensional nature that can be attributed to the features, boundaries and areas that are extracted by the processes discussed herein. Elevation drawings may also present a structure in a three-dimensional perspective. Feature recognition processes may also be used to create three-dimensional model aspects.

Figure 3A:
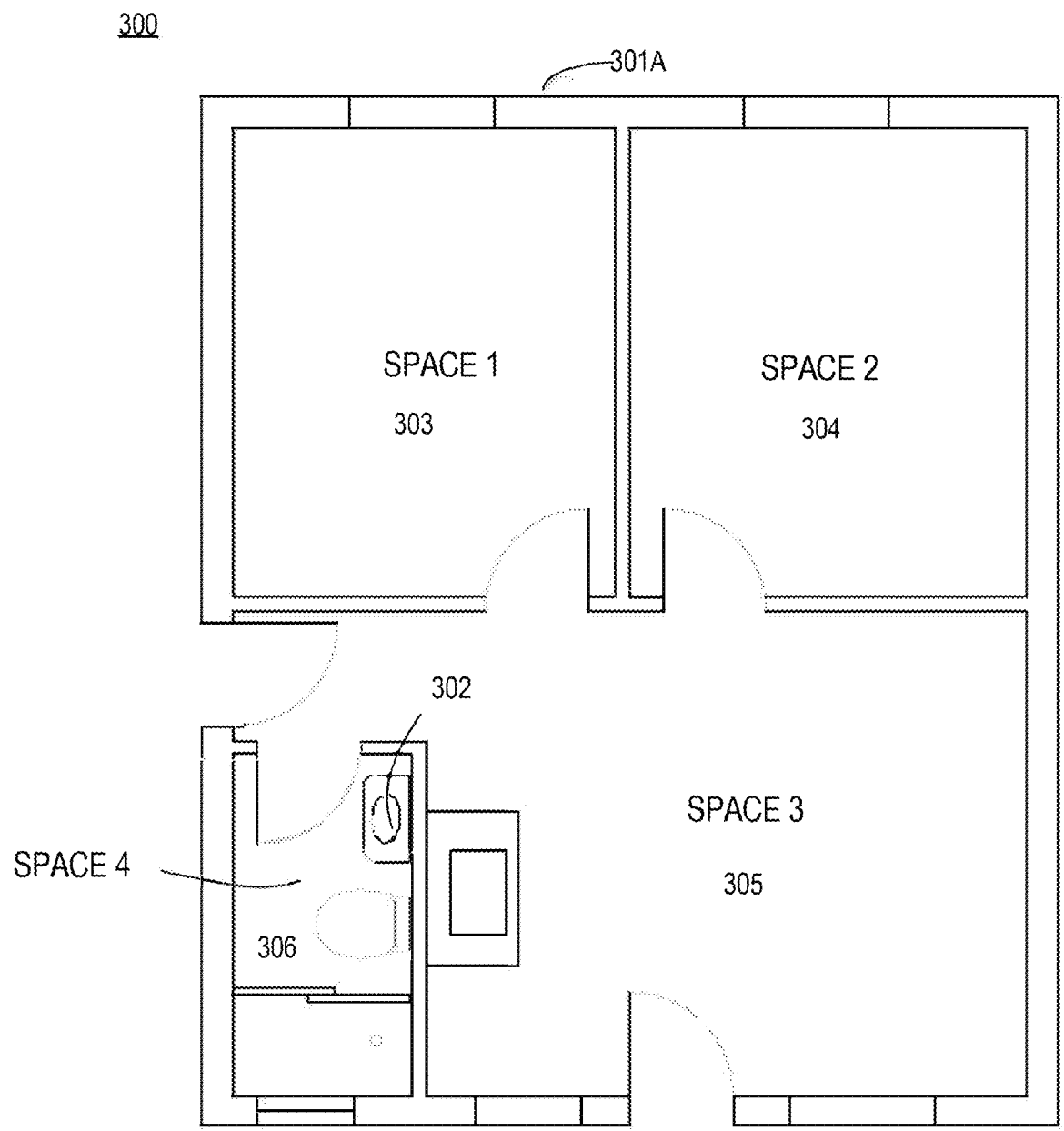
Figure 3B:
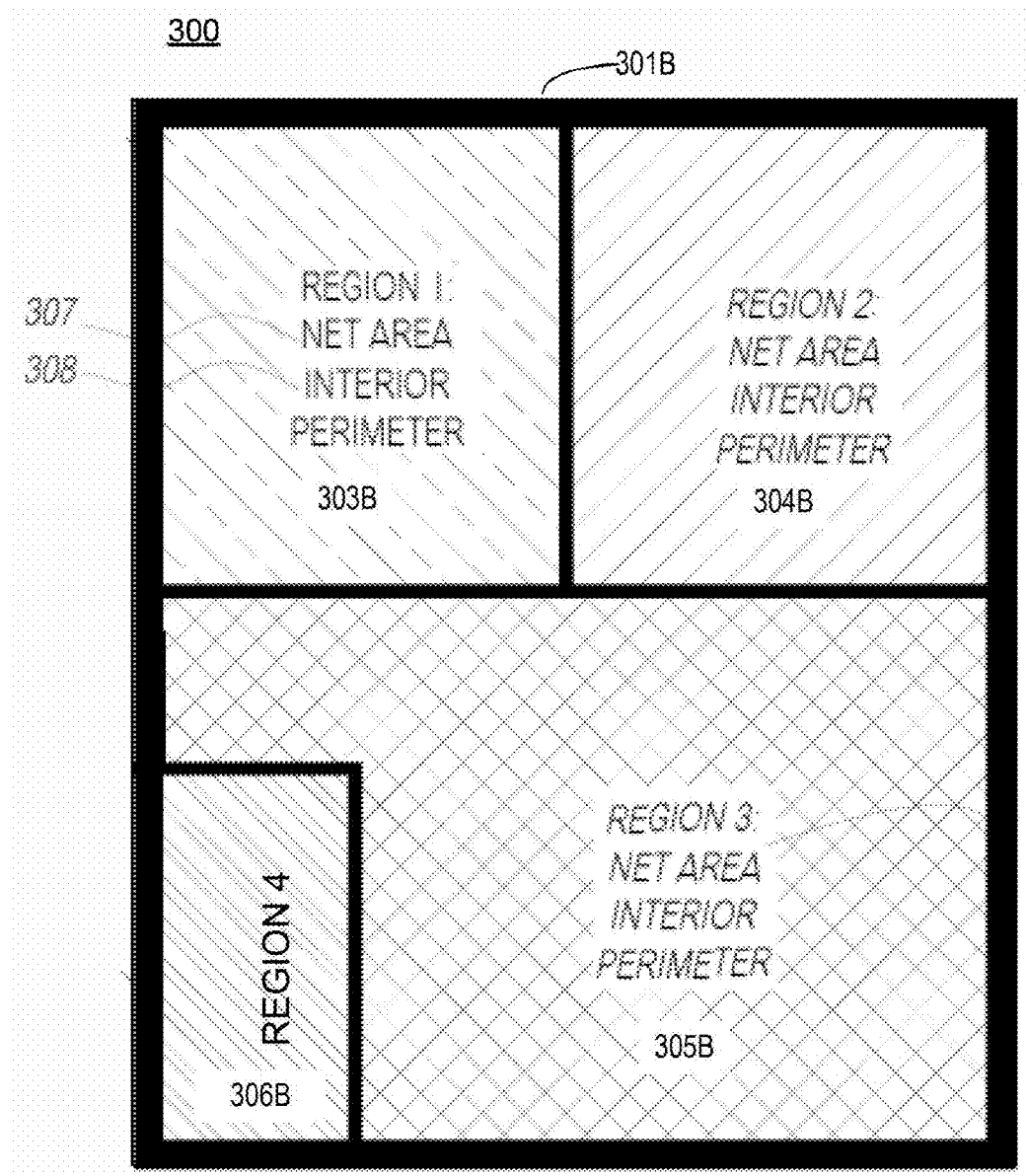
Figure 3C:
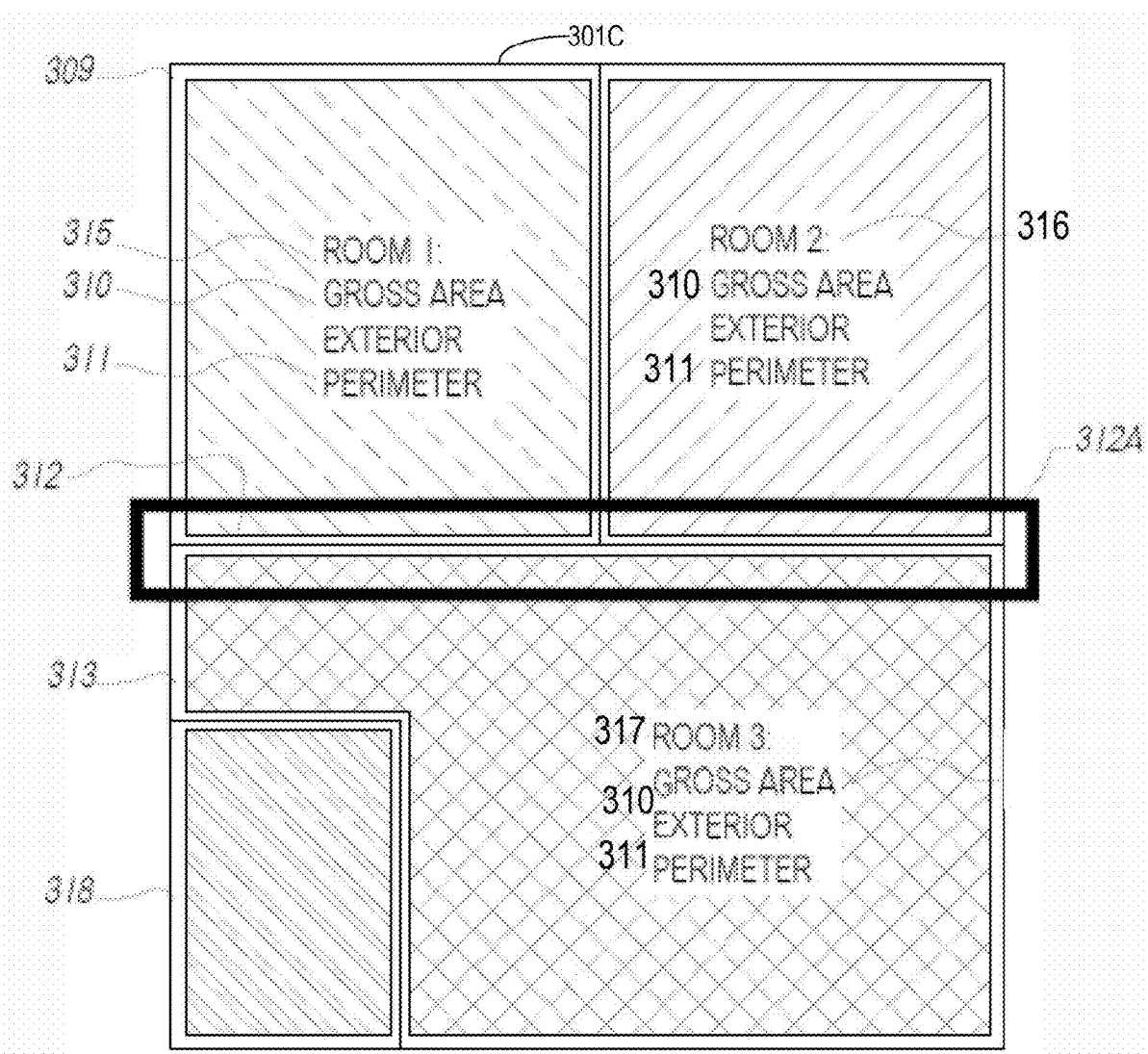

Referring now to FIGS. 3A-3C a user interface 300 may generate multiple different user views, each view has different aspects related to the two-dimensional reference drawing inputted. For example, referring now to FIG. 3A, a user interface 300 with a replication view 301A may include replication of an original floor plan represented by a two-dimensional reference, without any controller added features, vectors, lines, or polygons integrated or overlaid into the floorplan. The replication view 301A includes various spaces 303-306 that are undefined in the replication view 301A but may be defined during the processes described herein. For example, some or all of a space 303-306 may correlate to a region in a region view 301B.

The replication view 301A, may also include one or more fixtures 302. A rasterized version (or pixel version) of the fixtures 302 may be identified via an AI engine. If a pattern is present that is not identified as a fixture 302, a user may train the AI engine to recognize the pattern as a fixture of a particular type. The controller may generate a tally of multiple fixtures 302 identified in the two dimensional reference. The tally of multiple fixtures 302 may include some or all of the fixtures identified in the two dimensional reference and be used to generate an estimate for completion of a project illustrated by, or otherwise represented by the two dimensional reference.

Referring now to FIG. 3B, in the user interface 300 a user may specify to a controller that a one of multiple views available to presented via the interface. For example, a user may designate via an interactive portion of a screen displaying the user interface 300 that a region view 301B be presented. The region view 301B may identify one or more regions and/or spaces 303B-306B identified via processing by a controller, such as for example via an AI engine running on the controller. The region view 301B may include information about one or more regions 303-306 delineated in the region view 301B of the user interface 300. For example, the controller may automatically generate and/or display information descriptive of one or more of: user displays, printouts or summary reports showing a net interior area 307 (e.g., a calculation of square footage available to an occupant of a region), an interior perimeter 308, a type of use a region 3038-306B will be deployed for, or a particular material to be used in the region 3038-306B. For example, Region 4 306B may be designated for use as a bathroom; and flooring and wall board associated with Region 4 may be designated as needing to be waterproof material.

Referring now to FIG. 3C a gross area region view 301C and 309 is illustrated. As illustrated in FIG. 3B, a user interface may include interactive devices for display of additional parameters, such as, for example, one or more of: a net interior area 307 may generate a designation of a value that is in contrast to a gross area 310 and exterior perimeter 311. The selection of gross area 310 may be more useful to a proprietor charging for a leased space but, may be less useful to an occupant than a net interior area 307 and interior perimeter 308. One or more of the net interior areas 307, interior perimeter 308 gross area 310 and exterior perimeter 311 may be calculated based upon analysis by an AI engine of a two dimensional reference.

In addition, a height for a region may also be made available to the controller and/or an AI engine, then the controller may generate a net interior volume and vertical wall surface areas (interior and/or exterior).

In some embodiments, an output, such as a user interface of a computing device, smart device, tablet and the like, or a printout or other hardcopy, may illustrate one or both of: a gross area 310 and/or an exterior perimeter 311. Either output may include automatically populated information, such as the gross area of one or more rooms (based upon the above boundary computations) or exterior perimeters of one or more rooms.

In some embodiments, the present invention calculates an area bounded within a series of polygon elements (such as, for example using mathematical principals or via pixel counting processes), and/or line segments.

In some embodiments, in an area of a bounded by lines intersecting at vertices, the vertices may be ordered such that they proceed in a single direction such as clockwise around the bounded area. The area may then be determined by cycling through the list of vertices and calculating an area between two points as the area of a rectangle between the lower coordinate point and an associated axis and the area of the triangle between the two points. When a path around the vertices reverses direction, the area calculations may be performed in the same manner, but the resulting area is subtracted from the total until the original vertex is reached. Other numerical methods may be employed to calculate areas, perimeters, volumes, and the like.

These views may be used in generating estimation analysis documents. Estimation analysis documents may rely on fixtures, region area, or other details. By assisting in generating net area, estimation documents may be generated more accurately and quickly than is possible through human-engendered estimation parameters.

With reference now again to FIGS. 3B and 3C, regions 303B-306B defined by an AI engine may include one or more Rooms in FIG. 3B subsequently have regions assigned as "Rooms" in FIG. 3C.

Referring now to FIG. 3D, a table is illustrated containing hierarchical relationships between area types 322-327 that may be defined in and/or by an AI engine and/or via the user interface. The area types 322-327 may be associated with dominance relationship values in relation to adjacent areas. For example, a border region 312-313 (as illustrated in FIG. 3C) will have an area associated with it. According to the present invention, an area 315-318 associated with the border region 312-313 may have an area type 322-327 associated with the area 315-318. An area 312A included in the border region 312-313 may be allocated according to a ratio based upon a dominance ranking of one feature as compared to another feature, which may be represented as a hierarchical relationship between the features, such as, for example adjacent areas (e.g., area 315 and area 317 or area 317 and area 318), the hierarchical relationship may be used to generate a dominance ranking of one area of another area, or to ascertain factors useful in determining whether a building is in compliance with an applicable code. For example, a dominance ranking may allocate space used to calculate one or more of: an occupancy load; a width and/or area of an egress path; a width and/or area of a common path; a length of a dead end; egress capacity; and travel distance from a furthest point.

Some embodiments of the present invention allocate one or more areas according to a user input (wherein the user input may be programmed to override and automated hierarchical relationship or be subservient to the automated hierarchical relationship). For example, as indicated in the table, a private office located adjacent to a private office may have an area in a border region split between the two adjacent areas in a 50/50 ration, but a private office adjacent to a general office space may be allocated 60 percent of an area included in a border region, and so on.

Dominance associated with various areas may be systemic throughout a project, according to customer preference, indicated on a two-dimensional reference by two-dimensional reference basis or another defined basis.

Figure 4A:
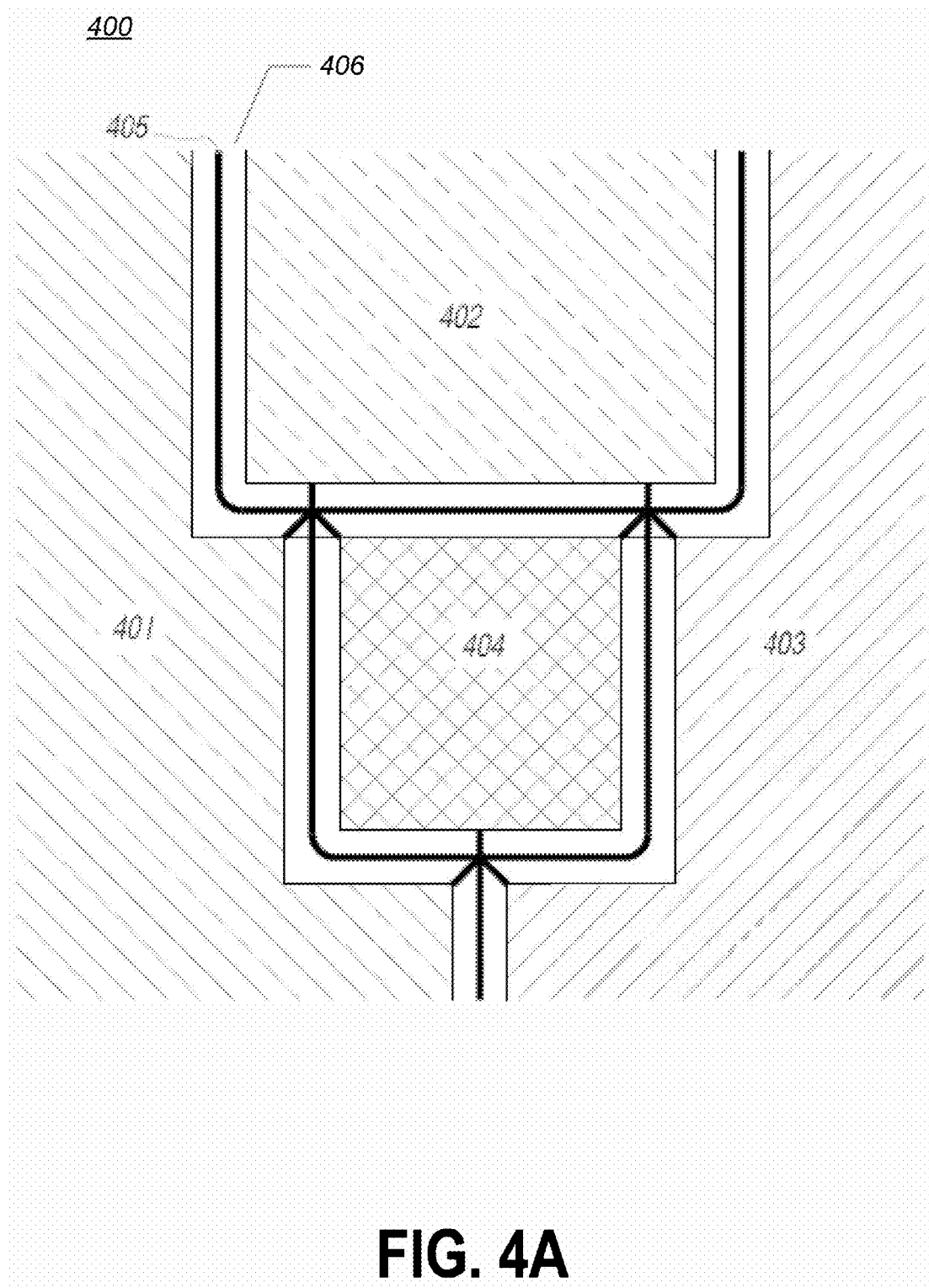

Referring now to FIG. 4A, an exemplary user interface 400 may include boundaries (which, as discussed above, may include one or more of: line segments, polygons, and icons) and regions overlaid on aspects included in a two-dimensional reference is illustrated. A defined space within a boundary (sometimes referred to as a region or area) may include an entire area within perimeters of a structure.

For example, a controller running an AI engine may determine locations of boundaries, edges, and inflections of neighboring and/or adjacent areas 401-404. There may be portions of boundary regions 405 and 406 that are initially not associated with an adjacent area 401-404. The controller may be operative via executing software in the AI engine to determine the nature of respective adjacent areas 401-404 on either side of a boundary, and apply a dominance based ranking upon an area type, or an allocation of respective areas 401-404. Different classes or types of spaces or areas may be scored to be equal to, dominant (e.g., above) others or subservient (e.g., below) others.

Referring now to FIG. 4B, an exemplary table A indicating classes of space types and their associated ranks. In some embodiments, a controller may be operative via execution of software to determine relative ranks associated with a region on one or either side of a boundary. For example, area 402 may represent office space and area 404 may represent a stair well. An associated rank lookup value for office space may be found at rank 411, and the associated rank lookup value for stairwells may be found at rank 413. Since the rank 413 of stairwells may be higher, or dominant, over the rank 411 of office space then the boundary space may be associated with the dominant stairs 412 or stairwell space. In some embodiments, a dominant rank may be allocated to an entirety of boundary space at an interface region. In other examples, more complicated allocations may be made where the dominant rank may get a larger share of boundary space than another rank allocated by some functional relationship. In still other examples (Table B), controller may execute logical code to be operative to assign pre-established work costs to elements identified within boundaries.

In some embodiments, a boundary region may transition from one set of interface neighbors to a different set. For example, again in FIG. 4A, a boundary 405 between office region 402 and stairwell 404 may transition to a boundary region between office region 402 and unallocated space 403. The unallocated space may have a rank associated with the unallocated space 403 that is dominant. Accordingly, the nature of allocated boundary space 405 may change at such transitions where one space may receive allocation of boundary space in one pairing and not in a neighboring region. The allocation of the boundary space 405 may support numerous downstream functionalities and provide an input to various application programs. Summary reports may be generated and/or included in an interface based upon a result after incorporation of assignment of boundary areas.

In another aspect, in FIG. 4B, a table 422 illustrates fields 414-416 that may have variable 417-421 values designated by an AI engine or other process run by a controller based upon the two dimensional reference, such as a floor plan, design plan or architectural blueprint. The variables 417-421 include aspects that may affect compliance with conditions that must be met in order to be compliant with a code, such as, for example, compliance and remedial actions. For example, as illustrated, variables 417-421 may include occupancy load 417, travel distance form a furthest point 418, Common path 419, dead end 420, and egress capacity 421.

Area Takeoff Classification

The determination of boundary definitions for a given inputted design plan, which may be a single drawing or set of drawings or other image, has many important uses and aspects as has been described. However, it can also be important for a supporting process executed by a controller, such as an AI algorithm to take boundary definitions and area definitions and generate classifications of a space. As mentioned, this can be important to support processes executed by a controller that assign boundary areas based on dominance of these classifications.

Classification of areas can also be important for further aggregations of space. In a non-limiting example, accurate automatic classification of room spaces may allow for a combination of all interior spaces to be made and presented to a user. Overlays and boundary displays can accordingly be displayed for such aggregations. There may be numerous functionality and purpose to automatic classification of regions from an input drawing.

An AI engine or other process executed by a controller may be refined, trained, or otherwise instructed to utilize a number of recognized characteristics to accomplish area classification. For example, an AI engine may base predictions for a type "/"category" of a region with a starting point of the determination that a region exists from the previous predictions by the segmentation engine.

In some embodiments, a type may be inferred from text located on an input drawing or other two-dimensional reference. An AI engine may utilize a combination of factors to classify a region, but it may be clear that the context of recognized text may provide direct evidence upon which to infer a decision. For example, a recognized textual comment in a region may directly identify the space as a bedroom, which may allow the AI engine to make a set of hierarchical assignments to space and neighboring spaces, such as adjoining bathrooms, closets, and the like.

Classification may also be influenced by, and use, a geometric shape of a predicted region. Common shapes of certain spaces may allow a training set to train a relevant AI engine to classify a space with added accuracy. Furthermore, certain space classes may typically fall into ranges of areas which also may aid in the identification of a region's class. Accordingly, it may be important to influence the makeup of training sets for classification that contain common examples of various classes as well as common variations on that theme.

Figure 5A:
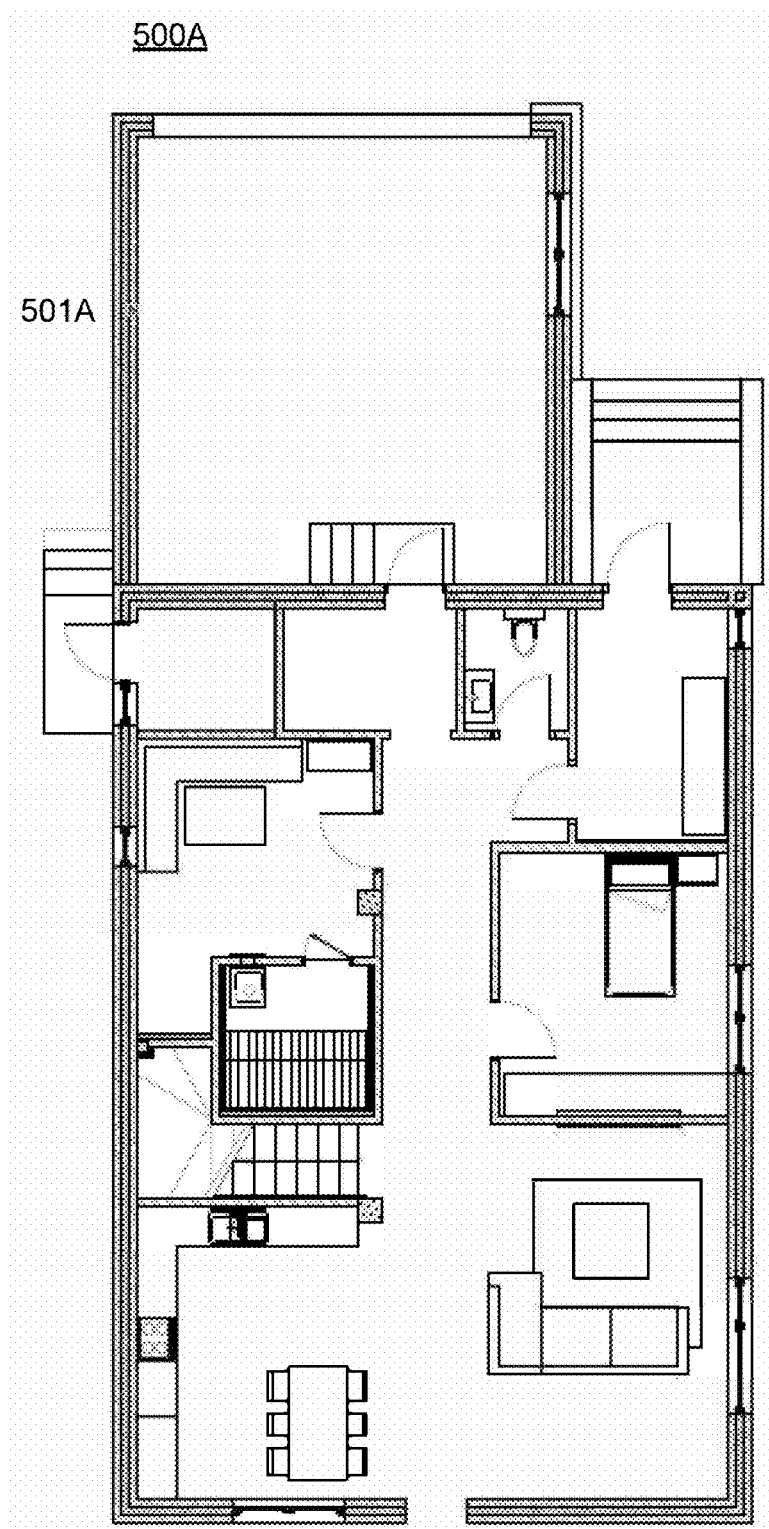
FIGS. 5A-5D illustrate various aspects of region identification and area allocation.

Referring now to FIGS. 5A-5D, a progressive series of outputs that may be included in various user interface are illustrated and provides examples of a recognition process that may be implemented in some embodiments of the present invention. Referring now to FIG. 5A, a relatively complex drawing of a floorplan may be input as a design plan 501A into a controller running an AI engine. The two-dimensional reference 501 may be included in an initial user interface 500A.

Figure 5B:
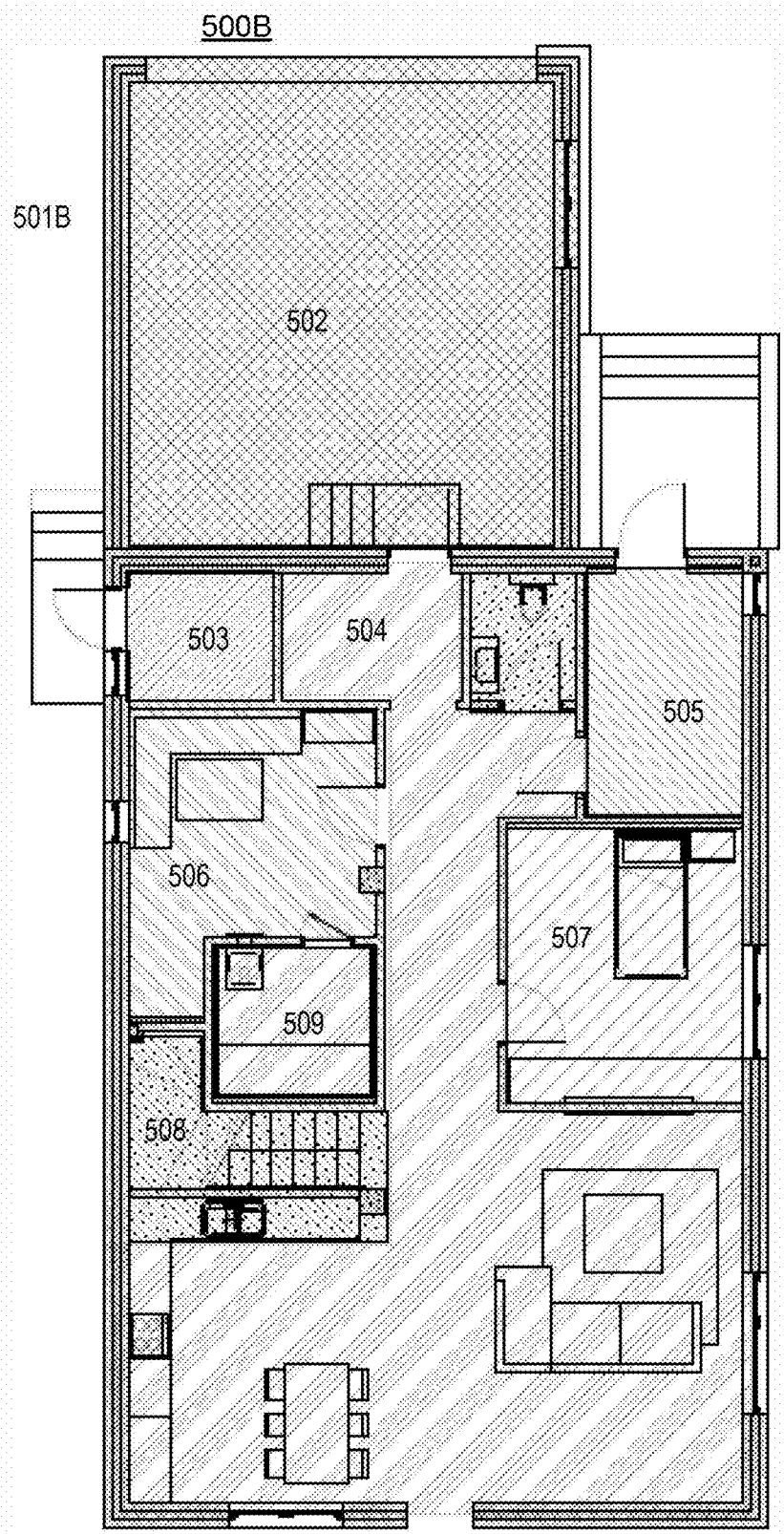

An AI engine based automated recognition process executes method steps via a controller, such as a cloud server, and identifies multiple disparate regions 502-509. Designation of the regions 502-509 may be integrated according to a shape and scale of the two dimensional reference and presented as a region view 501B user interface 500B, with symbolic hatches or colors etc., as shown in FIG. 5B.

The region view 501B may include the multiple regions 502-509 identified by the AI engine arranged based upon to a size and shape and relative position derived from the two dimensional reference 501.

Figure 5C:
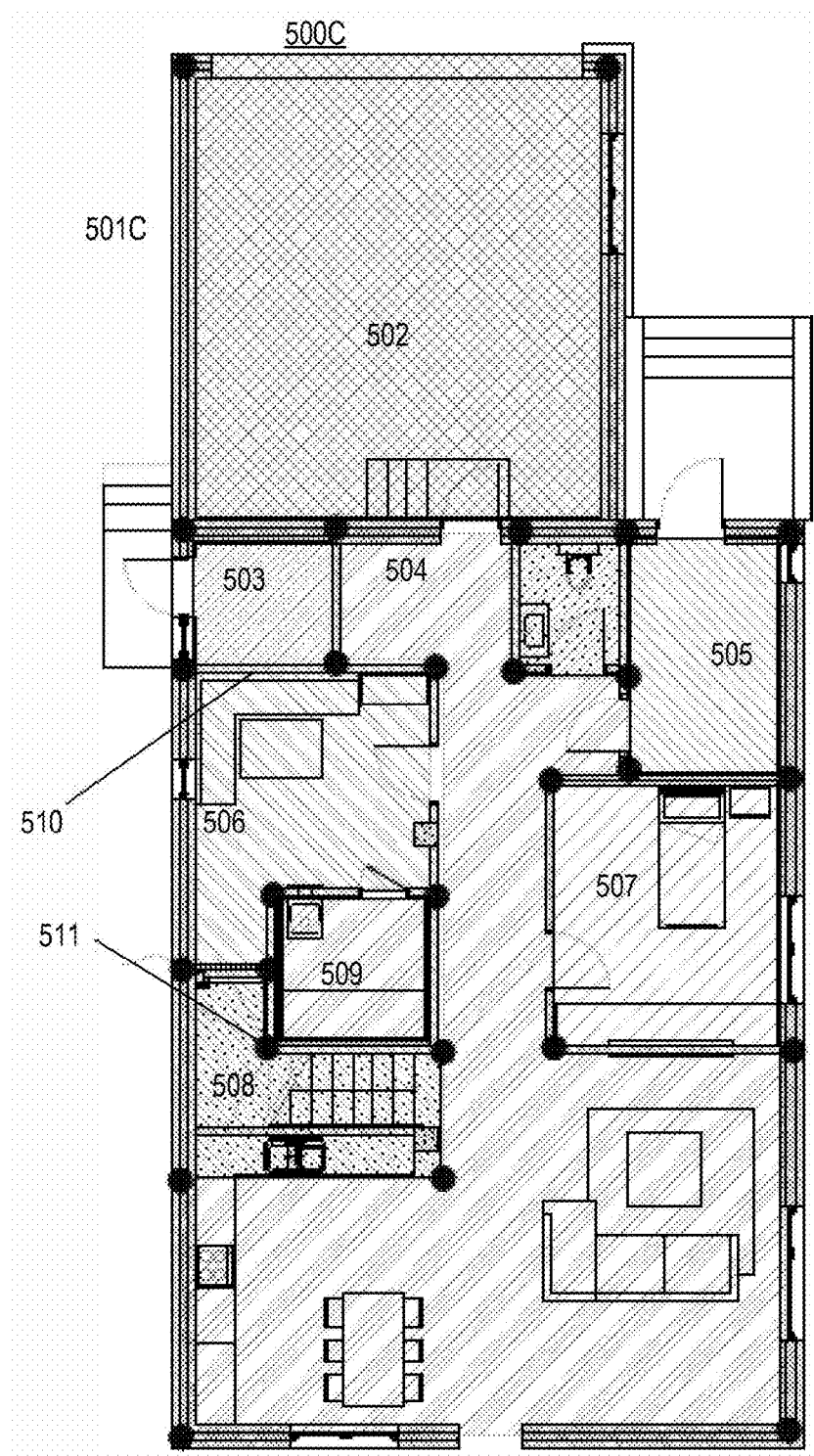

Referring now to FIG. 5C, a line segment view 501C may include identified boundary line segments 510 and vertices 511 may also be presented as an overlay of the regions 502-509 illustrated as delineated symbolic hatches or colors etc., as illustrated in FIG. 5C. Said line segments 510 may also be represented as symbols such as but not limited to dots. Such an interactive user interface 500C may allow a user to review and correct assignments in some cases. A component of the AI engine may further be trained to recognize aggregations of regions 502-509 spaces, or areas, such as in a non-limiting sense the aggregation of internal regions 502-509, spaces or areas.

Figure 5D:
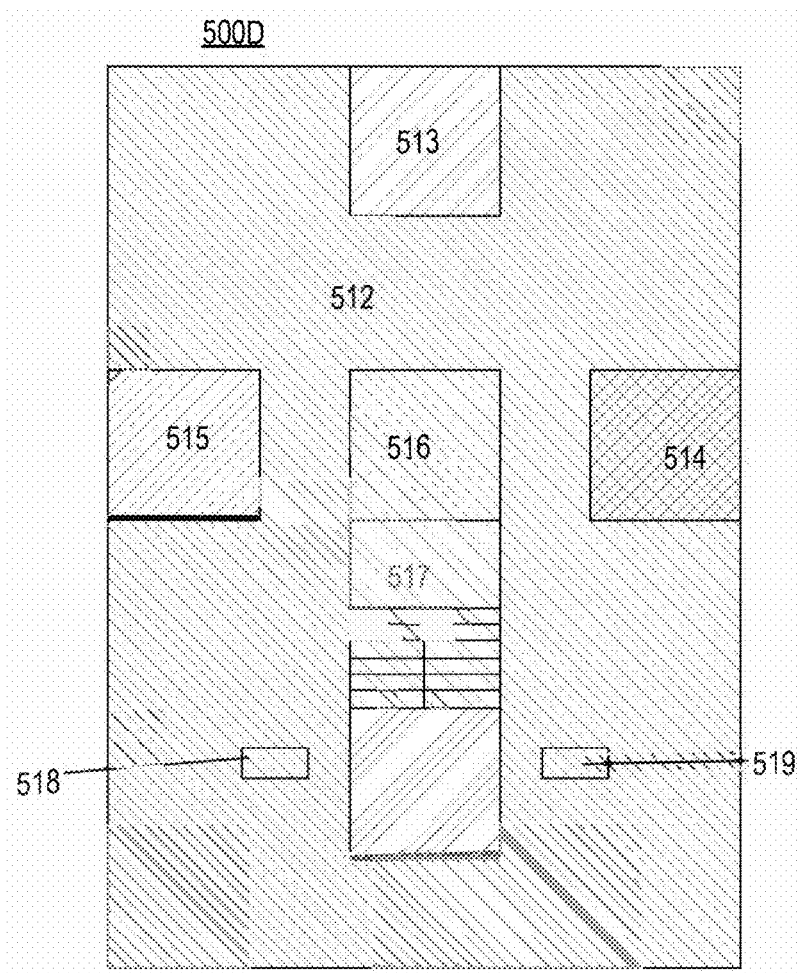

Referring now to FIG. 5D, an illustration of exemplary aggregation of regions 512-519 is provided where a user interface 500D includes patterned portions 512-519 and the patterned portions 512-519 may be representative of regions, spaces, or areas, such as, for example aggregated interior living spaces.

In some embodiments, integrated and/or overlaid aggregations of some or all of: regions; spaces; patterned portions; line segments; polygons; symbols; icons or other portions of the user interfaces may be assembled and presented in a user output and our user interface, or as input into another automated process.

Figure 6A:
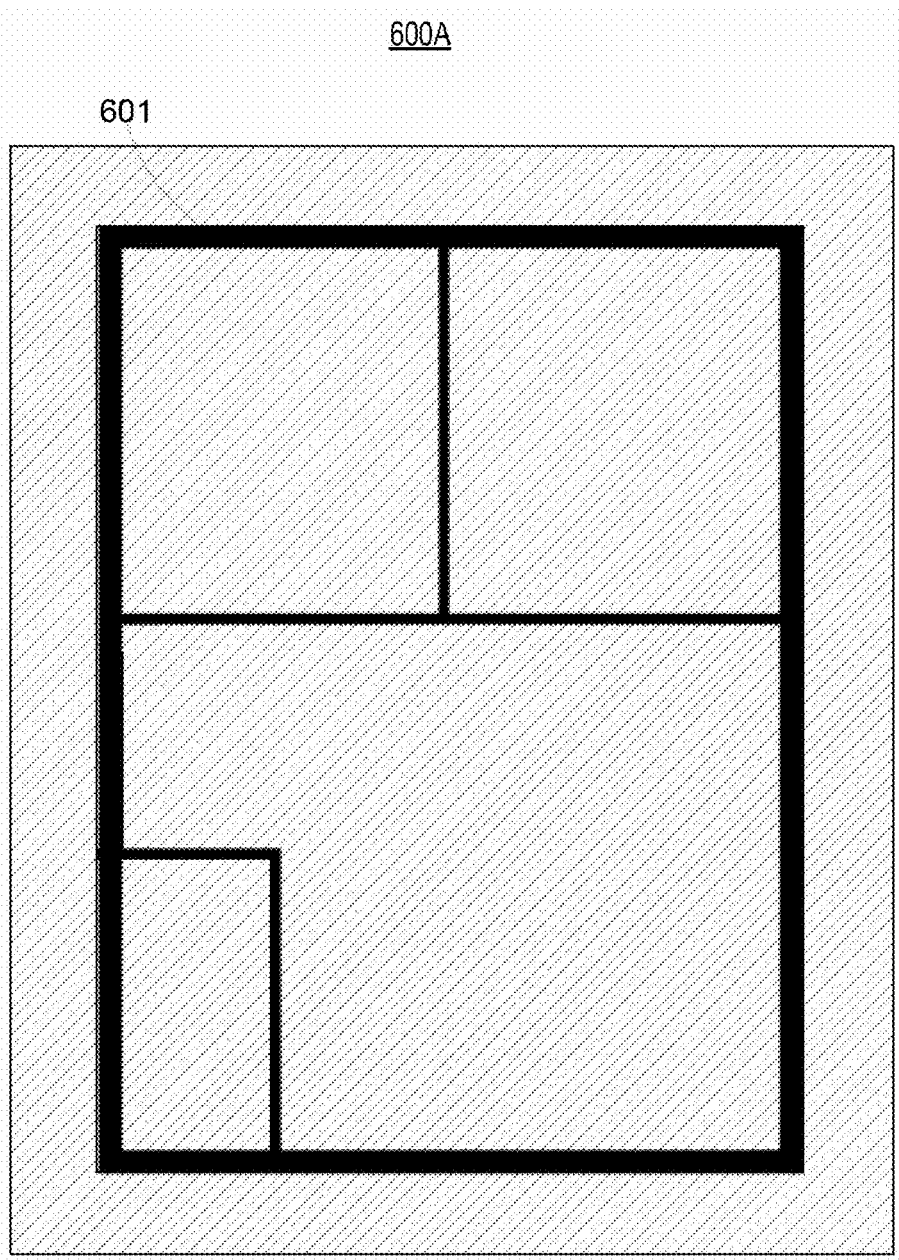
FIGS. 6A-6C illustrate various aspects of boundary segmentation and classification.
Figure 6B:
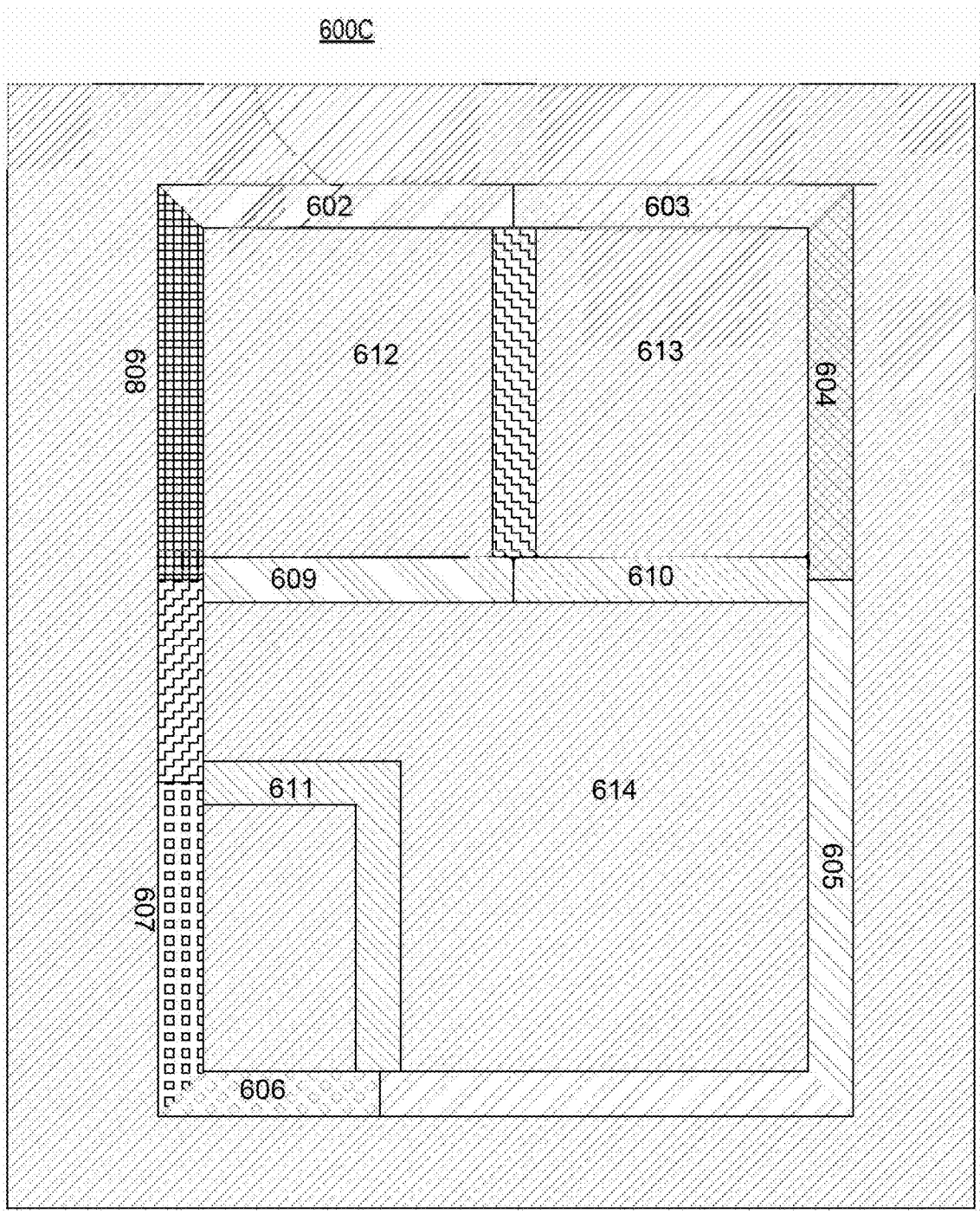
Figure 6C:
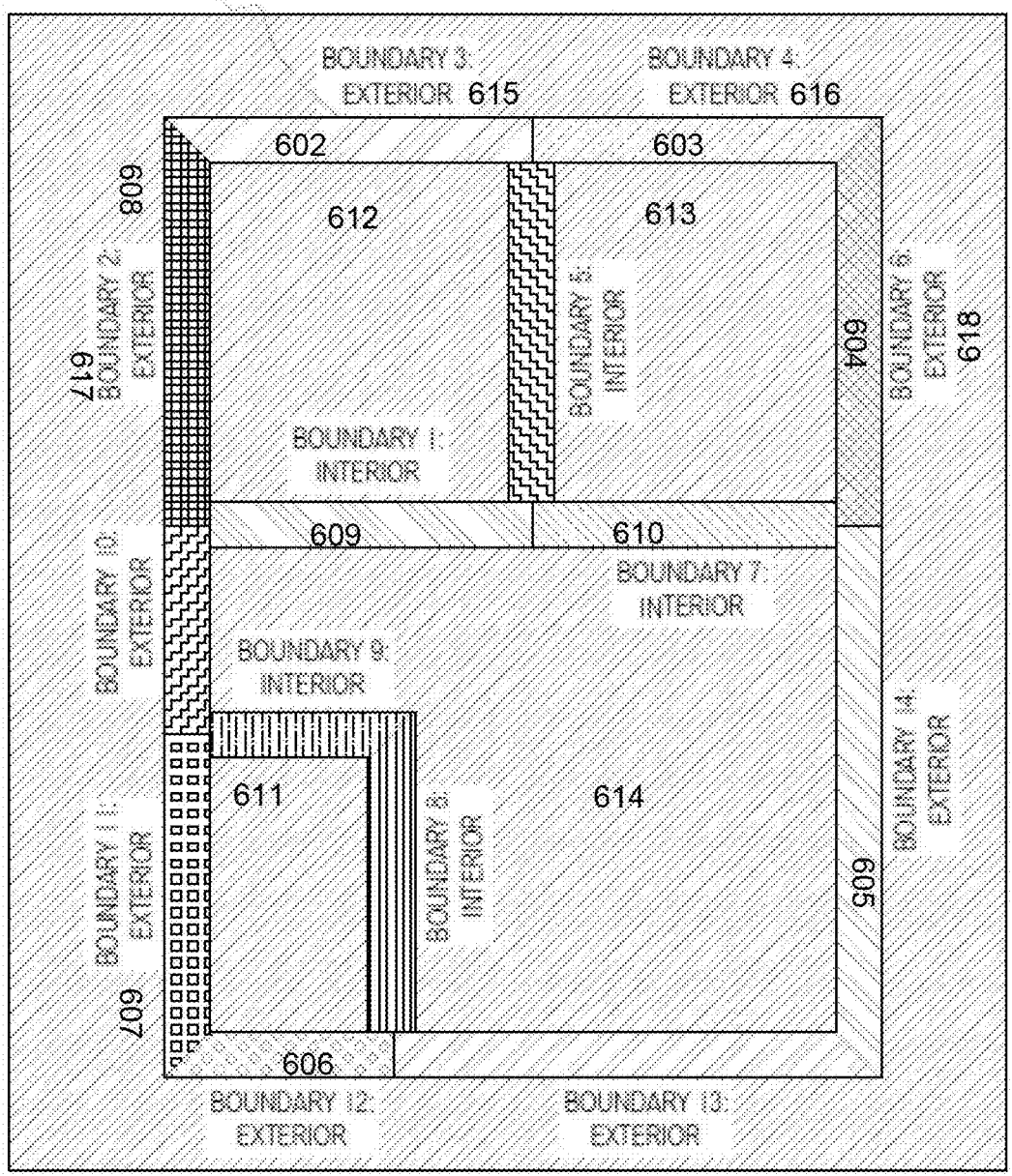

Referring now to FIGS. 6A-6C, in some embodiments, automated and/or user initiated processes may include refinement of regions, spaces, or areas may involve one or both of a user and a controller identifying individual wall segments 211A from previously defined boundaries.

For example, in some embodiments, a controller running an AI engine may execute processes that are operative to divide a previously predicted boundary into individual wall segments. In FIG. 6A, a user interface 600A includes a representation of a design plan with an original boundary 601 defined from an inputted design.

In FIG. 6B, an AI engine may be operative to take one or more original boundaries 601 and isolate one or more individual line segments 602-611 as shown by different hatching symbols in an illustrated user interface 600B. The identification of individual line segments 602-611 of a boundary 601 enables one or both of a controller and a user to assign and/or retrieve information about the individual line segment 602-611 such as, for example, one or more of: the length of the segment 602-611, a type of wall segment 211A, materials used in the wall segment 211A, parameters of the segment 602-611, height of the segment 602-611, width of the segment 602-611, allocation of the segment 602-611 to a region 612-614 or another, and almost any digital content relevant to the segment.

Referring now to FIG. 6C, in some embodiments, a controller executing an AI engine or other method steps, may be operative, in some embodiments, to classify individual line segments 602-611 of a boundary 601 and present a user interface 600C indicating the classified individual line segments 602-611. The AI engine may be trained, and subsequently operative, to classify individual line segments 602-611 included in a boundary 601 in different classes. As a non-limiting example, an AI engine may classify walls as interior walls, exterior walls and/or demising walls that separate internal spaces.

As illustrated in FIG. 6C, in some embodiments, an individual line segment 602-611 may be classified by the AI engine and an indication of the classification 615-618, such as alphanumeric or symbolic content, may be associated with the individual line segment 602-611 and presented in the user interface 600C.

In some embodiments, functionality may be allocated to classified individual line segments 602-611, such as, by way of non-limiting example, a process that generates an estimated materials list for a region or an area defined by a boundary, based on the regions or area's characteristics and its classification.

Figure 7:
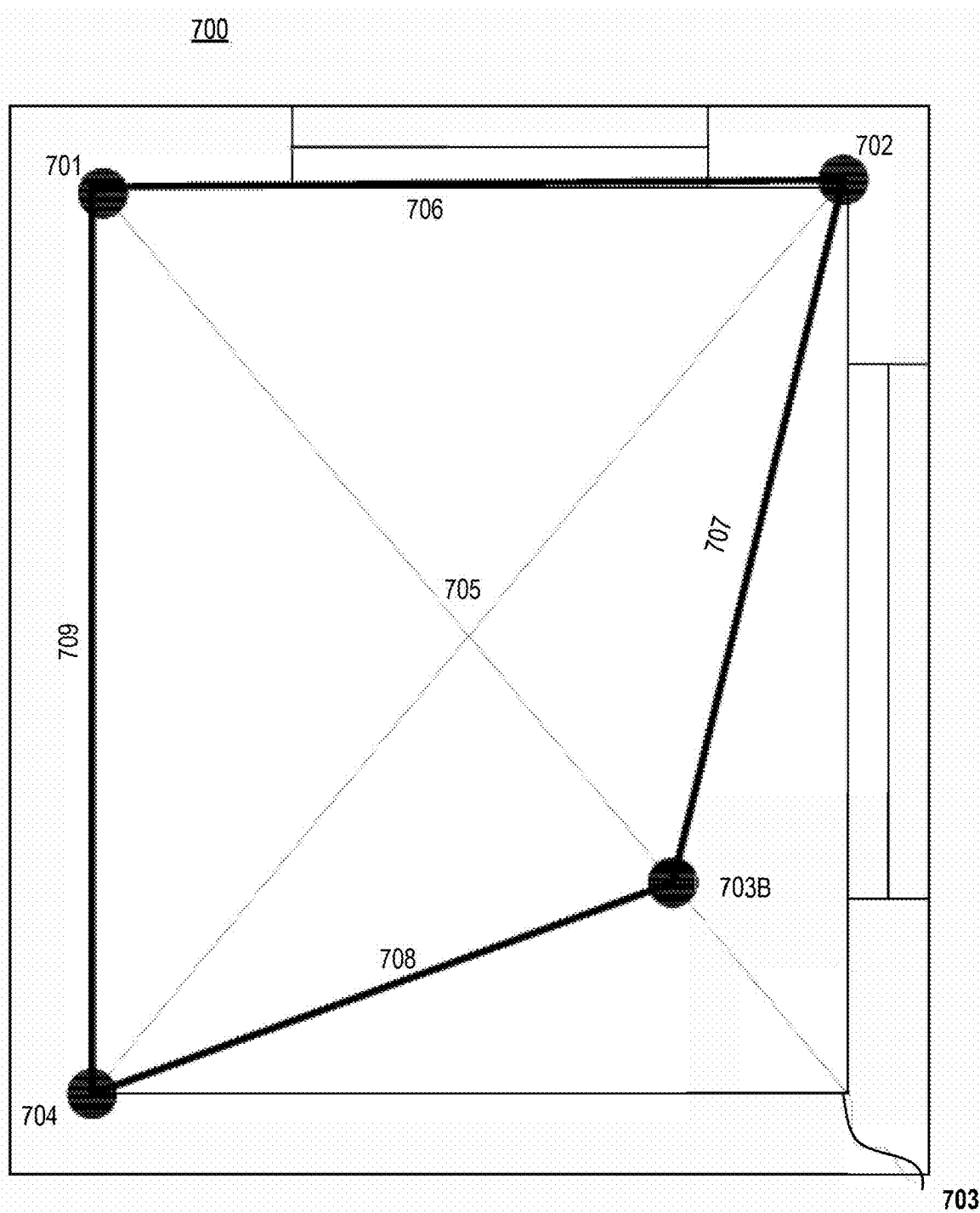
FIG. 7 illustrates aspects of correction protocols.

Referring now to FIG. 7 in some embodiments, a user interface 700 may include user interactive controls operative to execute process steps described herein (e.g. make a boundary determination, region classification, segmentation decision or the like) in an automated process (e.g. via an AI routine) and also be able to receive an instruction (e.g. from a user via a user interface, or a controller operative via executable software to perform a process) that modify one or more boundary segments.

For example, a user interface may include one or more vertex 701-704 (e.g., points where two or more line segments meet) that may be user interactive such that a user may position the one or more vertex 701-704 at a user selected position. User positioning may include, for example, user drag and drop of the one or more vertex 701-704 at a desired location or entering a desired position, such as via coordinates. A new position for a vertex 703B may allow an area 705 bounded by user defined boundaries 706-709 User interactive portions of a user interface 700 are not limited to vertex 701-704 and can be any other item 701-709 in the user interface 700 that may facilitate achievement of a purpose by allowing one or both of: the user, and the controller, to control dynamic sizing and/or placement of a feature or other item 701-709.

Still further, in some embodiments, user interaction involving positioning of a vertex 701-704 or modification of an item 705-709 may be used to train an AI engine to improve performance.

Model Training Procedures

An important aspect of the operation of the systems as have been described is the training of the AI engines that perform the functions as have been defined. A training dataset may involve a set of input drawings associated with a corresponding set of verified outputs. In some embodiments, a historical database of drawings may be analyzed by personnel with expertise in the field, user, including in some embodiments experts in a particular field of endeavor may manipulate dynamic features of a design plan or other aspects of a user interface to be used to train an AI engine, such as by creating or adding to an AI referenced database.

In some other examples, a trained version of an AI engine may produce user interfaces and/or other outputs based on the trained version of the AI engine. Teams of experts may review the results of the AI processing and make corrections as required. Corrected drawings may be provided to the AI engine for renewed training.

Estimation Automation

Aspects that are determined by a controller running an AI engine to be represented in a design plan may be used to generate an estimate of what will be required to complete a project. For example, according to various embodiments of the present invention, an AI engine may receive as input a two dimensional reference and generate one or more of: boundaries, areas, fixtures, architectural components, perimeters, linear lengths, distances, volumes, and the like may be determined by a controller running an AI engine to be required to be required to complete a project.

For example, a derived area or region comprising a room and/or a boundary, perimeter or other beginning and end indicator may allow for a building estimate that may integrate choices of materials with associated raw materials costs and with labor estimates all scaled with the derived parameters. The boundary determination function may be integrated with other standard construction estimation software and feed its calculated parameters through APIs. In other examples, the boundary determination function may be supplemented with the equivalent functions of construction estimation to directly provide parametric input to an estimation function. For example, the parameters derived by the boundary determinations may result in estimation of needed quantities like cement, lumber, steel, wall board, floor treatments, carpeting and the like. Associated labor estimates may also be calculated.

As described herein, a controller executing an AI engine may be functional to perform pattern recognition and recognize features or other aspects that are present within an input two dimensional reference or other graphic design. In a segmentation phase used to determine boundaries of regions or other space features, aspects that are recognized as some artifact other than a boundary may be replaced or deleted from the image. An AI engine and/or user modified resulting boundary determination can be used in additional pattern recognition processing to facilitate accurate recognition of the non-wall features present in the graphic.

For example, in some embodiments, a set of architectural drawings may include many elements depicted such as, by way of non-limiting example, one or more of: windows, exterior doors, interior doors, hallways, elevators, stairs, electrical outlets, wiring paths, floor treatments, lighting, appliances, and the like. In some two dimensional references, furniture, desks, beds, and the like may be depicted in designated spaces. AI pattern recognition capabilities can also be trained to recognize each of these features and many other such features commonly included in design drawings. In some embodiments, a list of all the recognized image features may be created and also used in the cost estimation protocols as have been described.

In some embodiments of the present invention, a recognized feature may be accompanied on a drawing with textual description which may also be recognized by the AI image recognition capabilities. The textual description may be assessed in the context of the recognized physical features in its proximity and used to supplement the feature identification. Identified feature elements may be compared to a database of feature elements, and matched elements may be married to the location on the architectural plan. In some embodiments, text associated with dimensioning features may be used to refine the identity of a feature. For example, a feature may be identified as an exterior window, but an association of a dimension feature may allow for a specific window type to be recognized. As well, a text input or other narrative may be recognized to provide more specific identification of a window type.

Identified features may be associated with a specific item within a features database. The item within the features database may have associated records that precisely define a vector graphics representation of the element. Therefore, an input graphic design may be reconstituted within the system to locate wall and other boundary elements and then to superimpose a database element graphic associated with the recognized feature. In some embodiments, various feature types and text may be associated into separate layers of a processed architectural design. Thus, a user interface or other output display or on reports, different layers may be illustrated at different times along with associated display of estimation results.

In some embodiments, a drawing may be geolocated by user entry of data associated with the location of a project associated with the input architectural plans. The calculations of raw material, labor and the like may then be adjusted for prevailing conditions in the selected geographic location. Similarly, the geolocation of the drawing may drive additional functionality. The databases associated with the systems may associate a geolocation with a set of codes, standards and the like and review the discovered design elements for compliance. In some embodiments, a list of variances or discovered potential issues may be presented to a user on a display or in a report form. In some embodiments, a function may be offered to remove user entered data and other personally identifiable information associated in the database with a processing of a graphic image.

In some embodiments, a feature determination that is presented to a user in a user interface may be assessed as erroneous in some way by the user. The user interface may include functionality to allow the user to correct the error. The resulting error determination may be included in a training database for the AI engine to help improve its accuracy and functionality.

Figure 8:
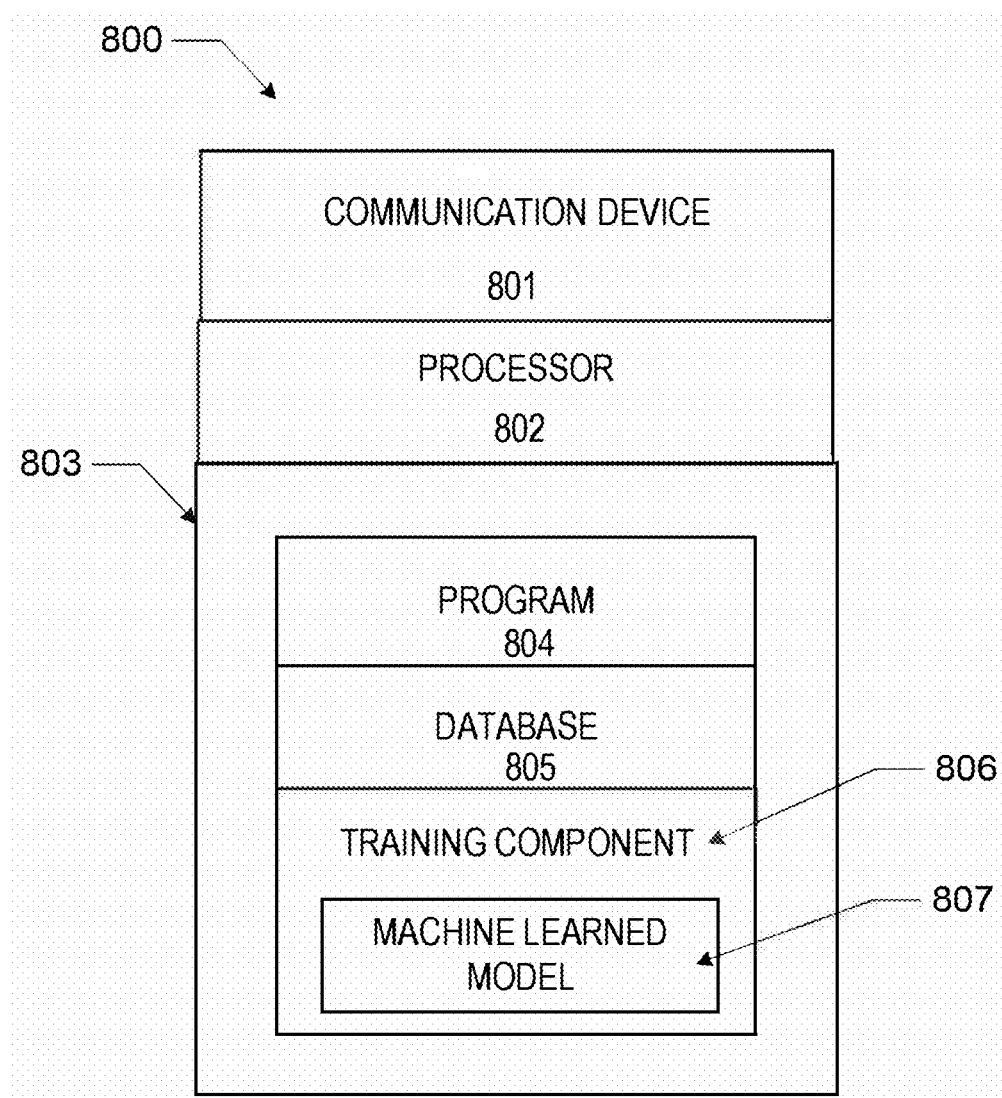
FIG. 8 illustrates exemplary processor architecture for use with the present disclosure.

Referring now to FIG. 8 an automated controller is illustrated that may be used to implement various aspects of the present disclosure, in various embodiments, and for various aspects of the present disclosure, controller 800 may be included in one or more of: a wireless tablet or handheld device, a server, a rack mounted processor unit. The controller may be included in one or more of the apparatuses described above, such as a Server, and a Network Access Device. The controller 800 includes a processor unit 802, such as one or more semiconductor-based processors, coupled to a communication device 801 configured to communicate via a communication network (not shown in FIG. 8). The communication device 801 may be used to communicate, for example, with one or more online devices, such as a personal computer, laptop, or a handheld device.

The processor 802 is also in communication with a storage device 803. The storage device 803 may comprise any appropriate information storage device, including combinations of magnetic storage devices (e.g., magnetic tape and hard disk drives), optical storage devices, and/or semiconductor memory devices such as Random Access Memory (RAM) devices and Read Only Memory (ROM) devices.

The storage device 803 can store a software program 804 with executable logic for controlling the processor 802. The processor 802 performs instructions of the software program 804, and thereby operates in accordance with the present disclosure. In some embodiments, the processor may be supplemented with a specialized processor for AI related processing. The processor 802 may also cause the communication device 801 to transmit information, including, in some instances, control commands to operate apparatus to implement the processes described above. The storage device 803 can additionally store related data in a database 805. The processor and storage devices may access an AI training component 806 and database, as needed which may also include storage of machine learned models 807.

Figure 9:
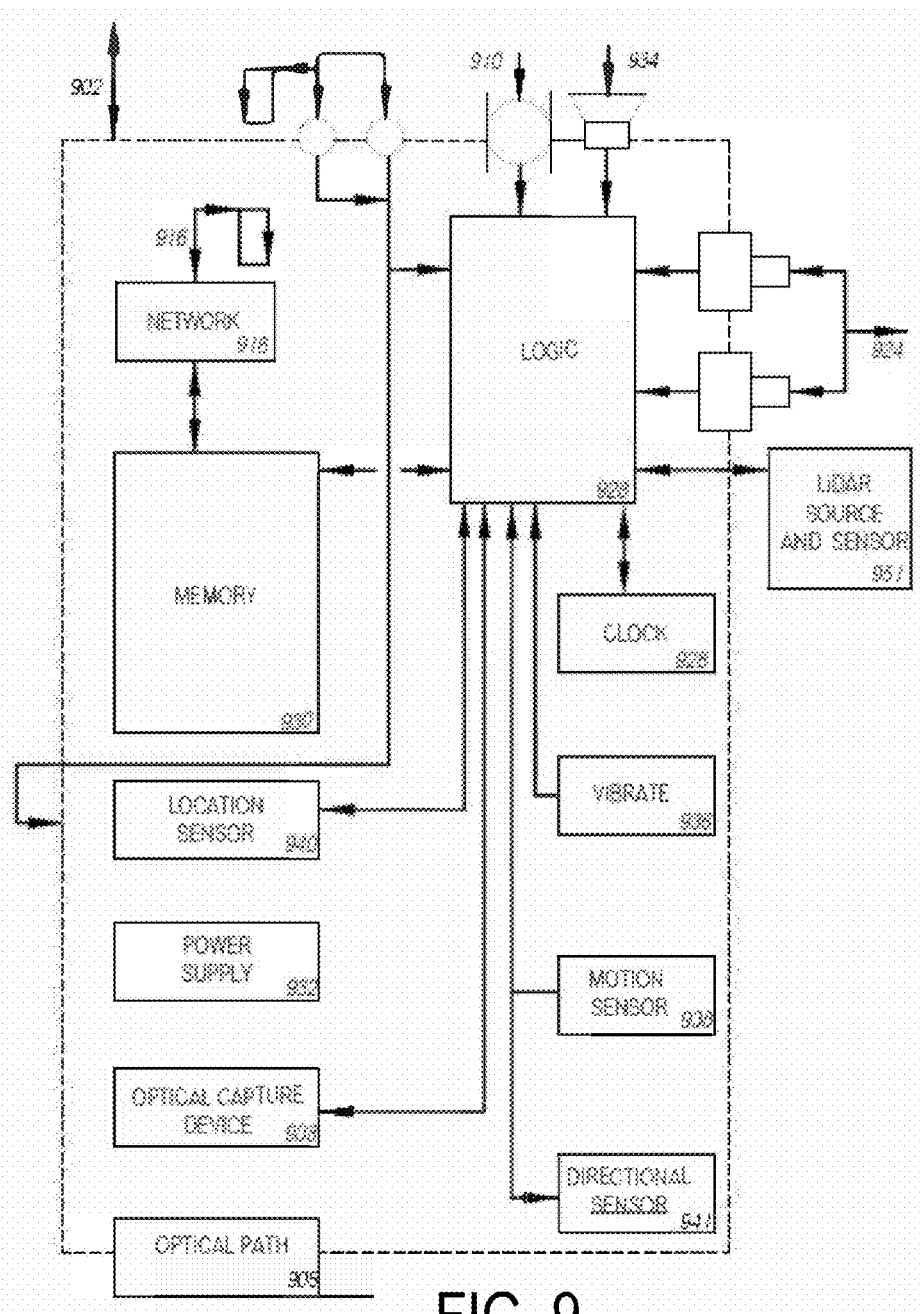
FIG. 9 illustrates exemplary mobile device architecture for use with the present disclosure.

Referring now to FIG. 9, a block diagram of an exemplary mobile device 902 is illustrated. The mobile device 902 comprises an optical capture device 908 to capture an image and convert it to machine-compatible data, and an optical path 906, typically a lens, an aperture, or an image conduit to convey the image from the rendered document to the optical capture device 908. The optical capture device 908 may incorporate a Charge-Coupled Device (CCD), a Complementary Metal Oxide Semiconductor (CMOS) imaging device, or an optical Sensor 924 of another type.

A microphone 910 and associated circuitry may convert the sound of the environment, including spoken words, into machine-compatible signals. Input facilities may exist in the form of buttons, scroll wheels, or other tactile Sensors such as touchpads. In some embodiments, input facilities may include a touchscreen display.

Visual feedback to the user is possible through a visual display, touchscreen display, or indicator lights. Audible feedback 934 may come from a loudspeaker or other audio transducer. Tactile feedback may come from a vibrate module 936.

A motion Sensor 938 and associated circuitry convert the motion of the mobile device 902 into machine-compatible signals. The motion Sensor 938 may comprise an accelerometer that may be used to sense measurable physical acceleration, orientation, vibration, and other movements. In some embodiments, motion Sensor 938 may include a gyroscope or other device to sense different motions.

A location Sensor 940 and associated circuitry may be used to determine the location of the device. The location Sensor 940 may detect Global Position System (GPS) radio signals from satellites or may also use assisted GPS where the mobile device may use a cellular network to decrease the time necessary to determine location.

The mobile device 902 comprises logic 926 to interact with the various other components, possibly processing the received signals into different formats and/or interpretations. Logic 926 may be operable to read and write data and program instructions stored in associated storage or memory 930 such as RAM, ROM, flash, or other suitable memory. It may read a time signal from the clock unit 928. In some embodiments, the mobile device 902 may have an on-board power supply 932. In other embodiments, the mobile device 902 may be powered from a tethered connection to another device, such as a Universal Serial Bus (USB) connection.

The mobile device 902 also includes a network interface 916 to communicate data to a network and/or an associated computing device. Network interface 916 may provide two-way data communication. For example, network interface 916 may operate according to the internet protocol. As another example, network interface 916 may be a local area network (LAN) card allowing a data communication connection to a compatible LAN. As another example, network interface 916 may be a cellular antenna and associated circuitry which may allow the mobile device to communicate over standard wireless data communication networks. In some implementations, network interface 916 may include a Universal Serial Bus (USB) to supply power or transmit data. In some embodiments other wireless links may also be implemented.

As an example of one use of mobile device 902, a reader may scan an input drawing with the mobile device 902. In some embodiments, the scan may include a bit-mapped image via the optical capture device 908. Logic 926 causes the bit-mapped image to be stored in memory 930 with an associated timestamp read from the clock unit 928. Logic 926 may also perform optical character recognition (OCR) or other post-scan processing on the bit-mapped image to convert it to text.

A directional sensor 941 may also be incorporated into the mobile device 902. The directional device may be a compass and be based upon a magnetic reading or based upon network settings.

A LiDAR sensing system 951 may also be incorporated into the mobile device 902. The LiDAR system may include a scannable laser light (or other collimated) light source which may operate at nonvisible wavelengths such as in the infrared. An associated sensor device, sensitive to the light of emission may be included in the system to record time and strength of returned signal that is reflected off of surfaces in the environment of the mobile device 902. In some embodiments, as have been described herein, a 2 dimensional drawing or representation may be used as the input data source and, vector representations in various forms may be utilized as a fundamental or alternative input data source. Moreover, in some embodiments, files which may be classified as BIM input files may be directly used as a source on which method steps may be performed. BIM and CAD file formats may include, by way of non-limiting example, one or more of: BIM, RVT, NWD, DWG, IFC and COBie. Features in the BIM or CAD datafile may already have defined boundary aspects having innate definitions such as walls and ceilings and the like. An interactive interface may be generated that receives input from a user indicating a user choice of types of innate boundary aspects a user provides instruction to the controller to perform subsequent processing on.

In some embodiments, a controller may receive user input enabling input data from either a design plan format or similar such formats, or also allow the user to access BIM or CAD formats. Artificial intelligence may be used to assess boundaries in different manners depending on the type of input data that is initially inputted. Subsequently, similar processing may be performed to segment defined spaces in useable manners as have been discussed. The segmented spaces may also be processed to determining classifications of the spaces.

As has been described, a system may operate (and AI Training aspects may be focused upon) recognition of lines or vectors as a basic element within an input design plan. However, in some embodiments, other elements may be used as a fundamental element, such as, for example, a polygon and/or series of polygons. The one or more polygons may be assembled to define an area with a boundary, as compared, in some embodiments, with an assembly of line segments or vectors, which together may define a boundary which may be used to define an area. Polygons may include different vertices; however common examples may include triangular facets and quadrilateral polygons. In some embodiments, AI training may be carried out with a singular type of polygonal primitive element (e.g., rectangles), other embodiments will use a more sophisticated model. In some other examples, AI engine training may involve characterizing spaces where the algorithms are allowed to access multiple diverse types of polygons simultaneously. In some embodiments, a system may be allowed to represent boundary conditions as combinations of both polygons and line elements or vectors.

Depending upon one or more factors, such as processing time, a complexity of the feature spaces defined, and a purpose for AI analysis, simplification protocols may be performed as have been described herein. In some embodiments, object recognition, space definition or general simplification may be aided by various object recognition algorithms. In some embodiments, Hough type algorithms may be used to extract diverse types of features from a representation of a space. In other examples, Watershed algorithms may be useful to infer division boundaries between segmented spaces. Other feature recognition algorithms may be useful in determining boundary definitions from building drawings or representations.

User Interface with Single and Multiple Layers

In some embodiments, the user may be given access to movement of boundary elements and vertices of boundary elements. In examples where lines or vectors are used to represent boundaries and surrounding area, a user may move vertices between lines or center points of lines (which may move multiple vertices). In other examples, elements of polygons such as the user may move vertices, sides, and center points. In some embodiments, the determined elements of the space representation may be bundled together in a single layer. In other examples, multiple layers may be used to distinguish distinct aspects. For example, one layer may include the AI optimized boundary elements, another layer may represent area and segmentation aspects, and still another layer may include object elements. In some embodiments, when the user moves an element such as a vertex the effects may be limited only to elements within its own layer. In some examples, a user may elect to move multiple or all layers in an equivalent manner. In still further examples, all elements may be assigned to a single layer and treated equivalently. In some embodiments, users may be given multiple menu options to select disparate elements for processing and adjustment. Features of elements such as color and shading and stylizing aspects may be user selectable. A user may be presented with a user interface that includes dynamic representations of a features or other aspects of a design plan and associated values and changes may be input by a user. In some embodiments, an algorithm and processor may present to the user comparisons of various aspects within a single model or between different models. Accordingly, in various embodiments, a controller and a user may manipulate aspects of a user interface and AI engine.

Referring now to FIGS. 10A-10B method steps are illustrated for quantifying requirements for compliance of a selected code applied to a building based upon artificial intelligence analysis of a design plan according to some embodiments of the present invention. At step 1001, the method includes receiving into a controller a design plan of at least a portion of a building. As described above, the design plan may include an architectural drawing, floor plan, design drawing and the like.

At step 1002, the portion of a design plan may be represented as a raster image or other image type that is conducive to artificial intelligence analysis, such as, for example a pixel-based drawing.

At step 1003, the raster image may be analyzed with an artificial intelligence engine that is operative on a controller to ascertain components included in the design plan.

At step 1004, a scale of components included in the design plan may be determined. The scale may be determined for example via a scale indicator or ruler included in the design plan, or inclusion in the design plan of a component of a known dimension.

At step 1005, a user interface may be generated that includes at least some of the multiple components.

At step 1006, the components may be arranged in the user interface to form boundaries.

At step 1007, a length of a feature may be generated based upon a formed boundary.

At step 1008, based upon one or more of components included in at least one or the user interface and the design plan, at least one of: the area of a feature, space or region may be generated and/or a length of a feature may be generated and one or more of: an occupancy load; a travel distance of an egress path; a dead end; a common path; clearance around a feature such as a plumbing fixture (e.g. ADA specified clearance around a toilet); a width of an egress path including doorways, stairways, elevators, and ramps.

At step 1009, one or more of the above steps may be repeated for multiple areas, units and egress paths of a building being described by the design plan.

At step 1010, values of variables specified in a relevant code may be aggregated. The aggregated quantities may include, by way of non-limiting example, one or more of: areas for occupancy, authorized use during occupancy; distances of egress paths; widths of egress paths; widths of doorways; widths of stairways; and widths of ramps suitable for use by a wheelchair and/or walker.

Figure 11:
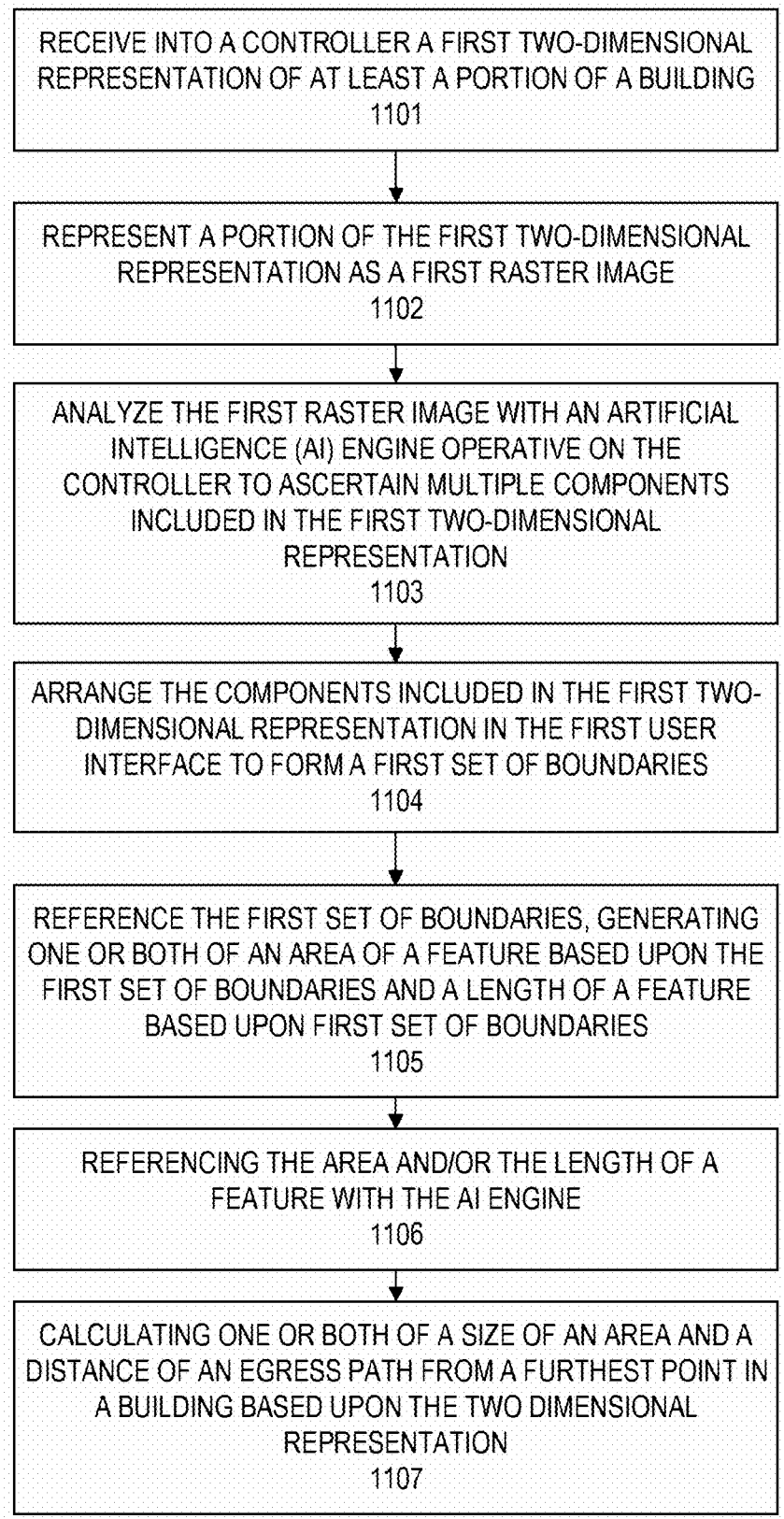
FIG. 11 illustrates additional method steps that may be executed in some embodiments of the present invention.

Referring now to FIG. 11, a system including one or more controllers can be configured to perform particular operations or actions by virtue of having executable software, firmware, hardware, or a combination of them that in operation cause the controllers to be operative to perform method steps. In some embodiments, the controller may perform method steps directed to quantifying requirements for construction of a building based upon artificial intelligence analysis of design plans.

At step 1101, the method of quantifying whether requirements for compliance with a relevant code are present in a building may include receiving into a controller a design plan of at least a portion of a building.

At step 1102 the method may include representing a portion of the first design plan as a first raster image; and step 1103 analyzing the first raster image with an artificial intelligence (AI) engine operative on the controller to ascertain multiple components included in the first design plan. The controller may also generate a first user interface including at least some of the multiple components included in the first design plan; and at step 1104, arrange the components included in the first design plan in a first user interface that forms a first set of boundaries.

At step 1105, the method may include generating one or both of an area of a feature based upon the first set of boundaries and a length of a feature based upon first set of boundaries.

At step 1106, the method may include using the AI engine to reference at least one of: the area of the feature and the length of a feature, and at step 1107 the controller may calculate an area or distance of an aspect of the building, such as an area of a unit and/or a distance of an egress path.

Any or all of steps 1101-1107 may be repeated for different portion of the two dimensional reference descriptive of the building.

A scale of one or more components may be determined and a parameter of one or both of a polygon and a line segment may be modified based upon receipt of an instruction for a user; and a boundary may be set based upon reference to a boundary allocation hierarchy.

The steps may be performed multiple times and may include two or more two dimensional references with results of the process be compared one against the other to ascertain when a change has been made to a two dimensional reference that places a building in compliance with a selected code. In various embodiments, a change in subsequent two dimensional references may be used to generate a change in one or more of a take off, labor costs, project management input or other aspects that may impact construction of a building and/or associated costs.

Implementations may include one or more of the following features. The method additionally determining a scale of the components included in the design plan and/or generating a user interface including user interactive areas to change at least one of: a size and shape of at least one of the dynamic components, the dynamic components may include, by way of non-limiting example, one or more of: architectural features, polygons or arcuate shapes; regions, areas, spaces, travel paths, egress paths, dominance hierarchies, occupancy loads, doorways, stairs, or other portion of a design plan that may be modified.

In some embodiments dynamic components may include a polygon and/or arcuate shape. A method of practice of the present invention may further include the steps of: receiving an instruction via the user interactive interface to modify a parameter of the polygon and modifying the parameter of the polygon based upon the instruction received via the interactive user interface. The parameter modified may include one or both of: an area of the polygon; and a shape of the polygon.

In another aspect a dynamic component may include a line segment and/or arcuate segment, and methods of practice may include one or more of: receiving an instruction via a user interactive interface to modify a parameter of the line segment, and the method further includes the step of modifying the parameter of the line segment based upon the instruction received via the interactive user interface. The parameter of the line segment may include a length of the line segment and the method may additionally include modifying a length of a wall based upon the modifying the length of the line segment.

The parameter modified may additionally include a direction of the line segment and the method may additionally include modifying an area of a room based upon the modifying of the length and direction of the line segment. A boundary may be set based upon reference to a boundary allocation hierarchy.

In another aspect, a price may be associated with each of the quantities of items to be included construction of the building. In addition, a type of labor associated with at least one of the items to be included construction of the building may be designated based upon AI analysis of the first two dimensional reference and the second two dimensional reference, respectively.

Methods of practice may additionally include the steps of: determining whether a design plan received into the controller includes a vector image, and if one of the first and the second design plan received into the controller includes a vector image converting at least a portion of the vector image into a raster image. Implementations of the described techniques may include hardware, a method or process, or computer software on a computer-accessible medium.

Methods of practice may additionally include one or more of the steps of: generating a user interface including user interactive areas to change at least one of: a size and shape of at least one of the dynamic components. At least one of the dynamic components may include a polygon and the method further includes the steps of: receiving an instruction via the user interactive interface to modify a parameter of the polygon and modifying the parameter of the polygon based upon the instruction received via the interactive user interface. The parameter modified may include an area of the polygon and/or a shape of the polygon. Moreover, a modification of a dynamic component included in a polygon may change a calculation of an area of a unit, or other defined space. A change in area of a unit may allow for a recalculation that results in a modification of one or more of: an occupancy load; a length of a path of egress; an length and/or area of a common path; a width of a stair; a travel distance to traverse a dead end; an existence of a dead end; or other variable referenced in determination of compliance with a set of conditions, such as a code relevant to a geopolitical locality and a building.

A dynamic component may include a line segment and/or vector, and the method may further include the steps of: receiving an instruction via the user interactive interface to modify a parameter of the line segment and/or vector and modifying the parameter of the line segment and/or vector based upon the instruction received via the interactive user interface. The parameter modified may include a magnitude of the line segment and/or vector and/or a direction of the vector.

The methods may additionally include one or more of the steps of setting a boundary based upon reference to a boundary allocation hierarchy; associating a price with each of the quantities of items to be included construction of the building; totaling the aggregated prices of items to be included construction of the building; designating a type of labor associated with at least one of the items to be included construction of the building; designating a quantity of the type of labor associated with the at least one of the items to be included in construction of the building; repeating the steps of designating a type of labor associated with at least one of the items to be included construction of the building and designating a quantity of the type of labor associated with the at least one of the items to be included in construction of the building for multiple items, and generating an aggregate quantity of the type of labor.

The method may additionally include the step of training the AI engine based upon a human identifying portions of a design plan to indicate that it includes a particular type of item; or to identify portions of the design plan that include a boundary. The AI engine via may also be trained by reference to a boundary allocation hierarchy.

The methods may additionally include the steps of: determining whether the design plans received into the controller includes a vector image, and if the design plan received into the controller does include a vector image converting at least a portion of the vector image into a raster image; and/or whether a design plan includes a vector image format. Implementations of the described techniques and method steps may include hardware (such as a controller and/or computer server), a method or process, or computer software on a computer-accessible medium.

Figure 12A:
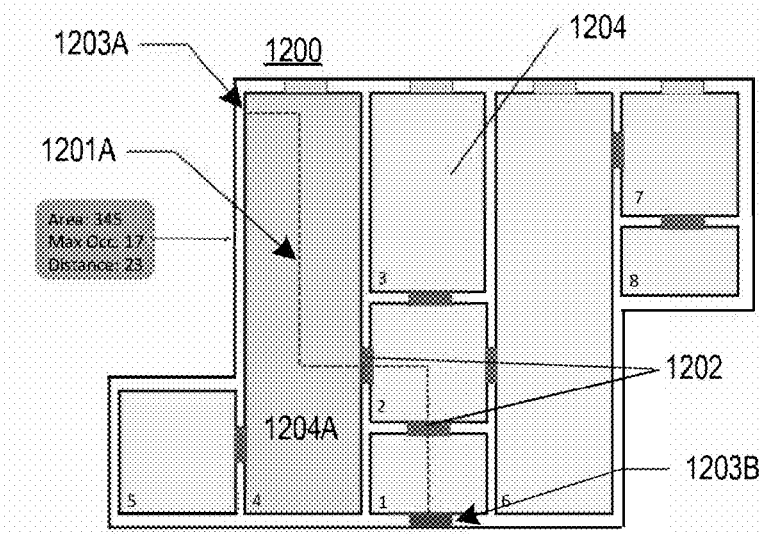
FIGS. 12A-12D illustrate diagrams of paths of egress.

Referring now to FIG. 12A, a diagram of a design plan 1200 of a unit 1200 with an egress path 1201A originating in a first area 1204A inside the unit is illustrated. The egress path 1201A proceeds from a furthermost point of travel 1203A for an occupant, to a point of egress 1203B (in the case illustrated the point of egress includes a door to an exterior of the unit 1204). The egress path 1201A proceeds through two interior doorways 1202. In some preferred embodiments (and as discussed further below wit reference to FIG. 13), an egress path will follow a setoff distance from all walls and generally traverse a middle portion of an area or region.

Figure 12B:
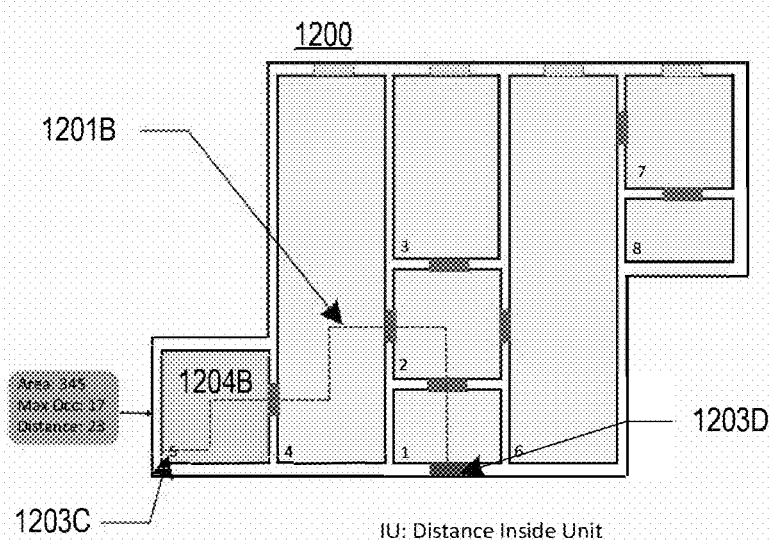

Referring now to FIG. 12B, an egress path 1201B through originating in a second area 1204B inside the unit is illustrated from a second furthest point 1203C in a second area 1204B to a point of egress 1203D. In some embodiments, multiple paths of egress 1201A-1201B may be generated, each with a respective distance from an origination point to a point of egress, so that a path of egress with the longest distance may be determined.

Figure 12C:
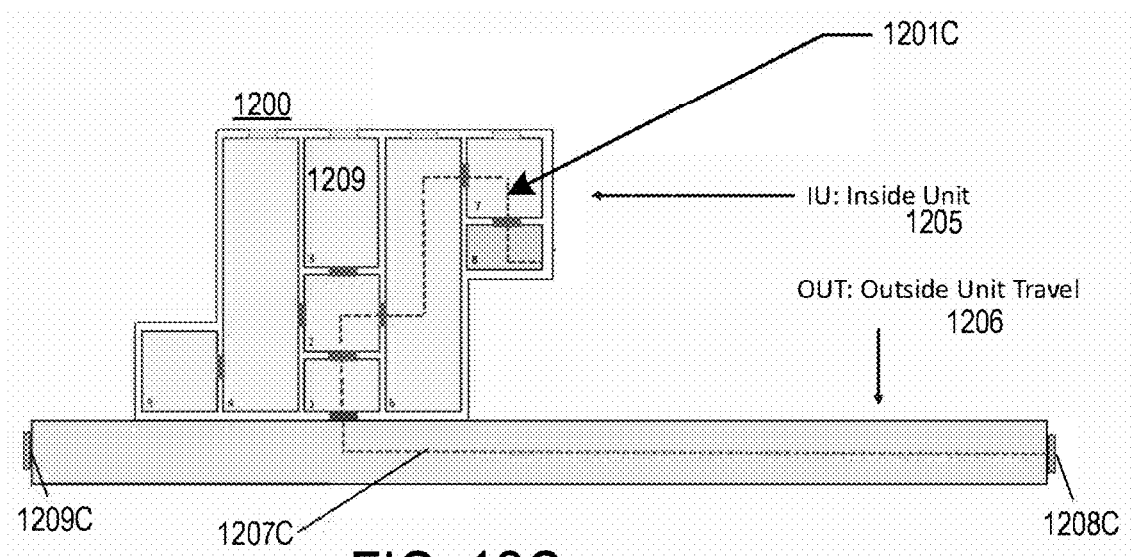

Referring now to FIG. 12C, a design plan 1200 is illustrated with a path of egress 1201C through an area 1205 inside a unit 1209 and a path of egress 1207C through an area outside 1206 of the unit 1209. Adding a distance of the internal path of egress 1201C with the external path of egress 1207C can provide a total distance for a path of egress to an external point of egress, such as a door to an exterior of a building.

Figure 12D:
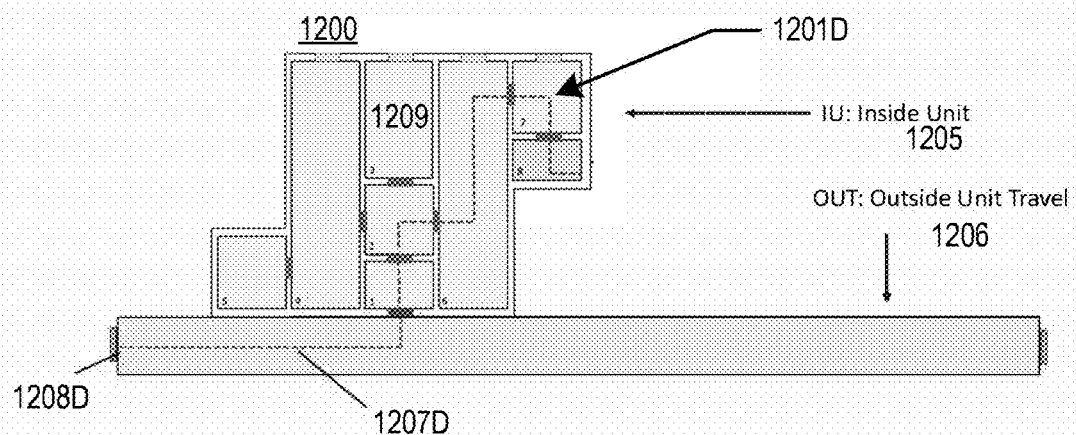

Referring now to FIG. 12D, an alternate path of egress through an area outside 1206 of the unit 1209 is illustrated to a second point of egress 1208D external to the unit 1209. A total distance of the path of egress may be calculated by adding the distance of a path of egress 1201D through an area internal to the unit 1209 to the distance of the path of egress 1207D through an area external to the unit 1209.

Some embodiments may include a comparison of a distance of a total path of egress to the first external point of egress 1208C and the second external point of egress 1209D.

Figure 13:
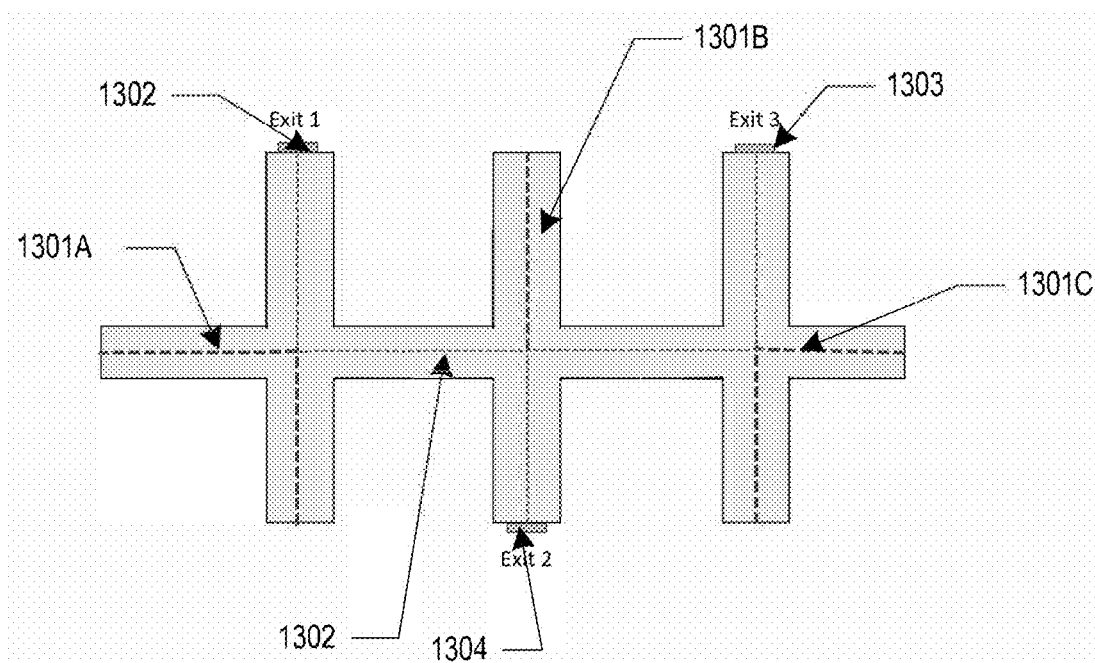
FIG. 13 illustrates a path of egress with dead ends.

Referring now to FIG. 13, three paths to dead ends 1301A-1301C are illustrated in comparison to a path 1301 to a location of three different points of egress 1302-1304. Some embodiments will include a calculation to each end of a dead end path 1301A-1301C added to a distance of a potential path of egress 1302.

Figure 14:
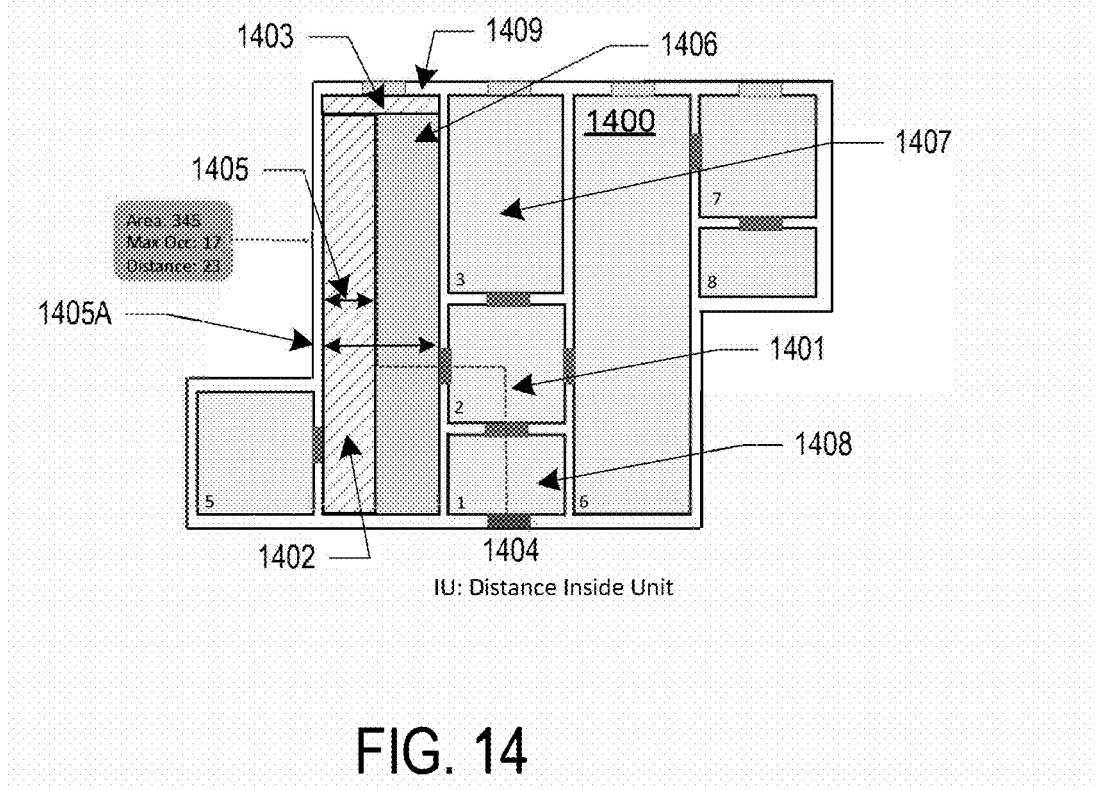
FIG. 14 illustrates determination of an egress path along a likely path.

Referring now to FIG. 14, in some embodiments, a path of egress 1401 may be generated through one or more defined areas 1406-1408 in a manner that best reflects an actual path of a person who will be exiting a unit 1400 along a path of egress 1401 to a point of egress 1404. In general, in some embodiments, an area 1406 may be virtually divided into multiple polygons 1402-1403, each polygon including at least one boundary along which a path of egress may be generated for the purpose of determining a distance of a path of egress 1401. For example, a first polygon 1403 may provide a boundary that keeps the path of egress at least a minimum distance from a wall 1409 to emulate how a person actually walks (without a shoulder or elbow striking the wall). A set off distance may include, by way of non-limiting example between six inches and 8 inches (or 15 to 20 centimeters). A polygon 1403 may have a width to represent the setoff distance.

In another aspect, a person may be calculated as walking generally though a middle of a room and a second polygon 1402 may include a width 1405 that is about half a width 1405A of an area 1406 through which the person will walk. Other methods for calculating a path may include, for example, associating a path with cartesian coordinates of pixels and choosing values of pixels that are included in a path of egress 1401 that fall within a margin of latitude for the set offs and/or determination of a middle of an area 1406.

User Interaction and Experience

In some embodiments, the present invention includes a controller operative to analyze a building described via one or more of: a floorplan, two dimensional reference, and/or Revit® compatible file, to ascertain whether the building described possesses a set of conditions useful to determine compliance with code set. In addition, in some embodiments, a process executed by an AI engine may ascertain building attributes and analyze the building attributes may be modified in order to bring the building into compliance. A user interface may present suggested modifications to a user. Some embodiments may also include designation and/or ranking of variables that may be modified in order to bring a building into compliance. By way of non-limiting example, variables may relate to one or more of: magnitude of structural changes, cost to implement changes, time to implement changes, impact of a change(s) on a desired use of the building, and duration of a proposed change.

In another aspect, in some embodiments, suggested modifications may be ranked according to a priority ranking of features input via a user interface. For example, a user may input priority rankings that dictate that a number of a certain type of room or unit must be maintained above a threshold within the plan, such as, for example, the plan must include: ten residential units, each unit with three bedrooms and two bathrooms and kitchen a living room; or at least four units with three bedrooms each; a second priority may include room sizes of a minimum and/o maximum size; a third priority may include a washer and dryer area; a fourth priority may include a common area of a minimum size; and other prioritized attributes to be included in a building design. AI and/or user input may modify a design of the building to bring the building into compliance with an applicable code while also adhering to the priority ranking of features.

Still further, in some embodiments, the controller may assess how assignment of different classes of space to one or more designated areas may alter conformance of a design with a specified code. Furthermore, in some embodiments, particular attributes of a building may be analyzed based upon laws or regulations in effect within a geopolitical boundary encompassing the building. In some embodiments, multiple disparate user interfaces may be used to communicate calculated parameters associated with determined attributes in order to give a user an improved experience while determining code compliance of a given design plan, as well as changes in a determination of code compliance based upon a change in one or more of the building attributes.

In an example, a user interface may be designed for an optimal user experience in evaluating an existence (or non-existence) of attributes necessary in order for a design plan to be in compliance with a specified code. In some embodiments a design may be evaluated by any of the various processes as have been described herein. After a design plan is received into a controller, an interface may be presented to a user to allow for interactive assessment of attributes required for code compliance.

Figure 15A:
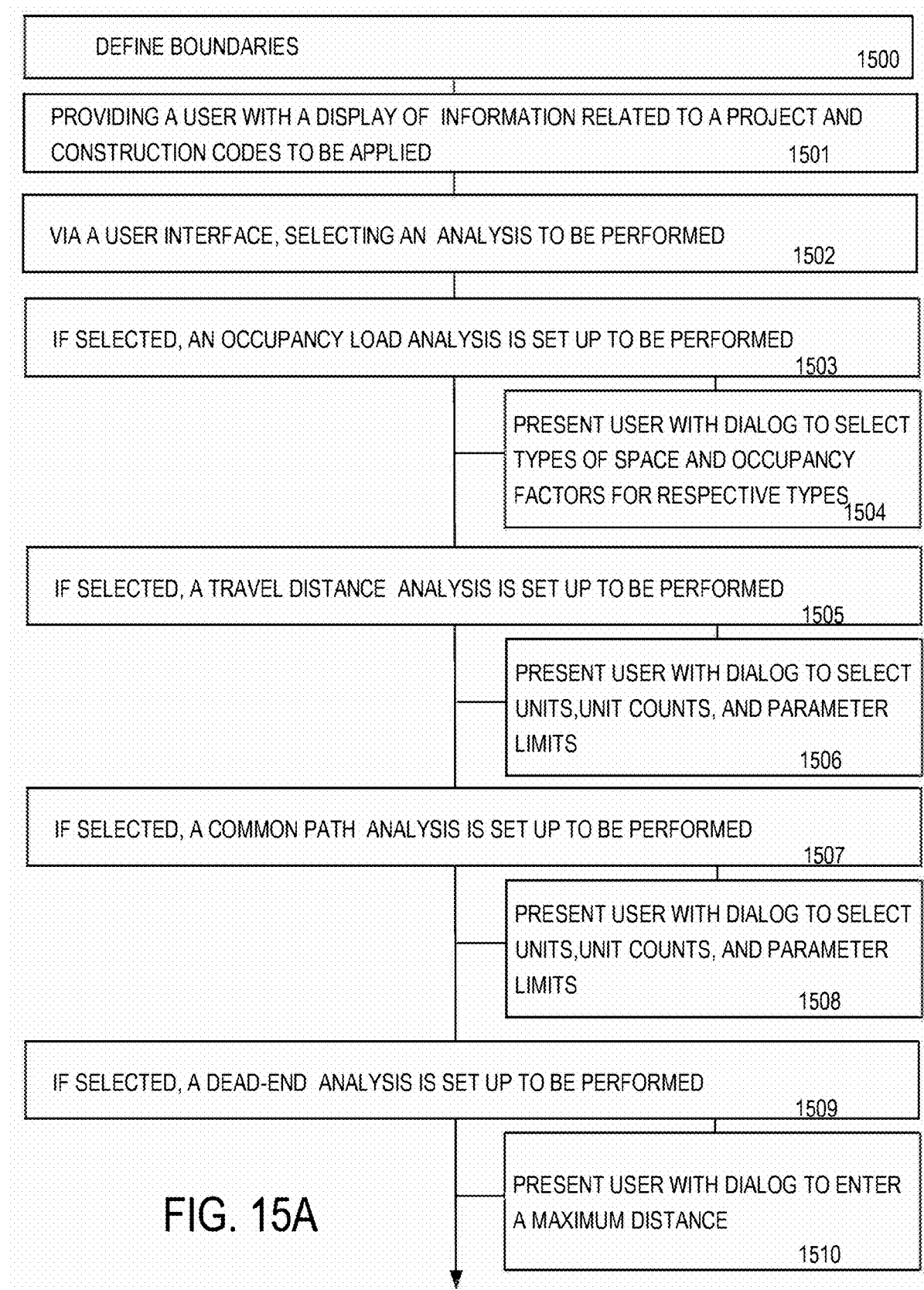
FIGS. 15A and B illustrate exemplary method steps that may be included in some embodiments of the present invention.
Figure 15B:
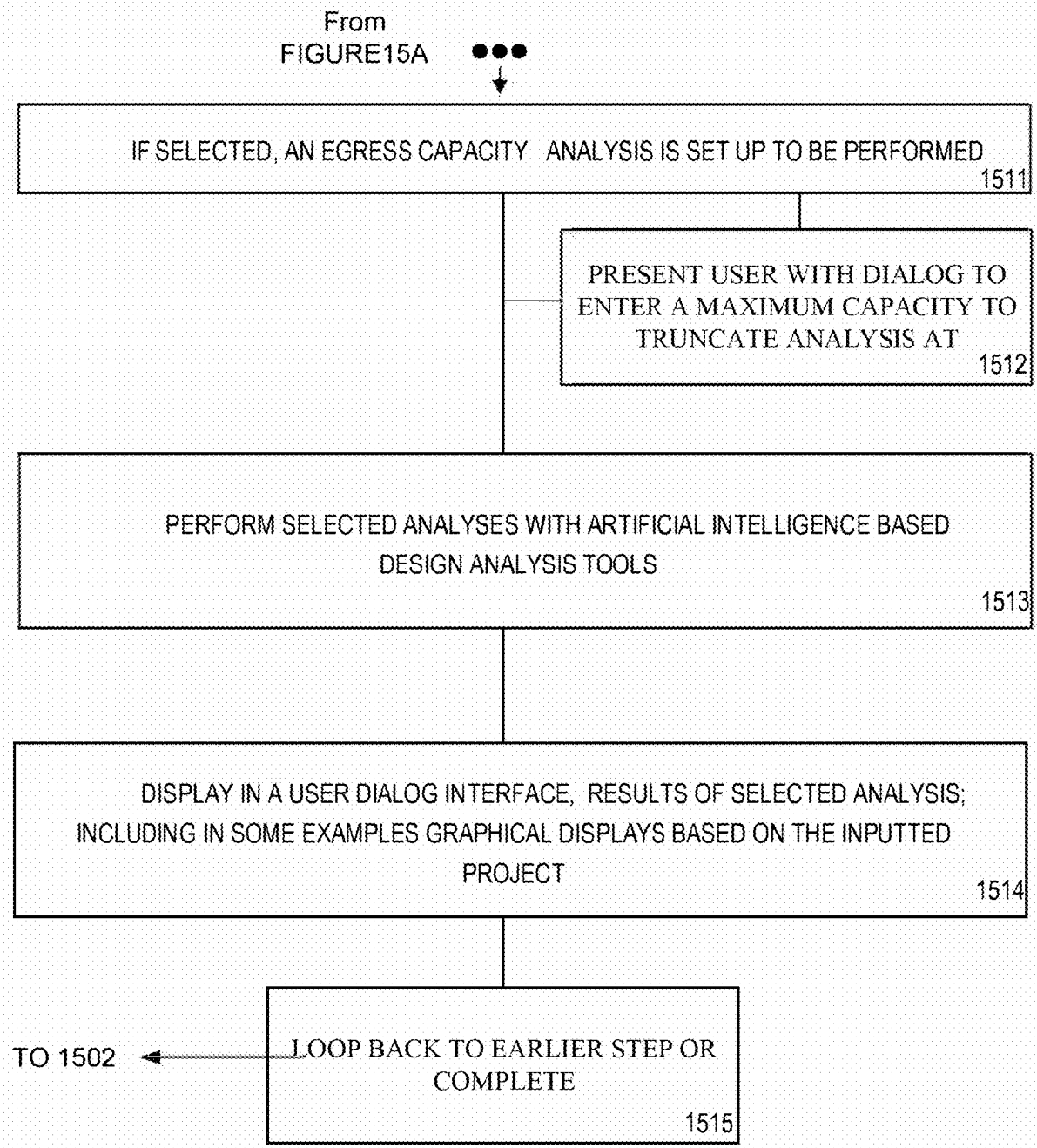

Referring now to FIGS. 15A-15B exemplary method steps that may be completed in accordance with the present invention are illustrated. The method steps may be part of a user experience.

At step 1500, boundaries may be defined.

At step 1501, the user may be provided with a user interactive interface that display project information including building attributes that are included in a determination of compliance with a set of conditions, such as, for example, statutory or regulatory codes for which compliance will be determined.

At step 1502, the user may select an analysis to be performed. In some embodiments, the options for the analysis may include an analysis of a building for attributes that pertain to, one or more of: occupancy load, travel distance, a common path, dead end paths, and egress capacity of the spaces described in a design plan (or other reference). In some examples, multiple analyses or all offered analysis may be chosen by the user. Since a choice of all analysis may proceed through all example analysis, the example in the illustration will proceed with this choice.

At step 1503, in a first analysis occupancy load may be performed.

At step 1504, in some examples, the user may decide on the types of space to be used along with an occupant load factor for the associated type of space. In some examples, the user may enter descriptions and factors manually. In other examples, a drop down dialog may be presented to the user for them to choose the space types. In some examples, the user may enter associated occupant load factors. In other examples, an automatic look up of the space's associated occupant load factor may occur with a choice of the type of space. In some examples, an associated code to be used for appropriate regions may be displayed to the user. In some embodiments, optical character recognition may be performed on located code documents to look up the appropriate occupant load factors automatically. As well, as mentioned in some examples, the user may input the types of area for a design, while in other examples algorithms may be used to automatically classify areas by type.

At step 1505, a second analysis of travel distance may be performed.

At step 1506, the UI/UX may present the user with a dialog to allow the user to input units along with a number of those unit types and limits, such as the maximum inside, maximum outside and total values. In some examples, the limit values may be automatically chosen. The limits may comprise just a max total value, or a combination of max total as well as max inside, or in some examples a max inside, a max outside and a max total limit value. In an example there may be residential units with different limit values than commercial units.

At step 1507, a third analysis may be performed for the common path.

At step 1508, the user may input values associated with the common path analysis which in some examples may be the same values inputted at step 1506.

At step 1509, a dead end analysis may be chosen and performed.

At step 1510, the user may input a dead end max limit that may be used to assess compliance. In other examples, these dead end max limits may be automatically entered based on the specific code type that is chosen for the design and analysis.

At step 1511, a fifth analysis of egress capacity may be chosen and performed.

At step 1512, a user may input capacity factors for doors and stairs that may be used to assess compliance. In some examples, a user may enter a maximum amount to truncate an egress capacity at. In other examples, a user may choose a result for occupancy load to compare to.

At step 1513, with the parameters, designations and limits entered, the analysis may continue. In some examples, the design may be presented to the users along with icons, buttons and other active features that may allow the user to adjust the design and the AI extracted feature elements. There may also be icons, buttons and other features to activate chosen analysis types to be performed.

At step 1514, after the analyses are performed the interactive interface may be generated with graphical presentations indicating analysis results.

At step 1515, the process may loop back to an earlier step or conclude.

Figure 16:
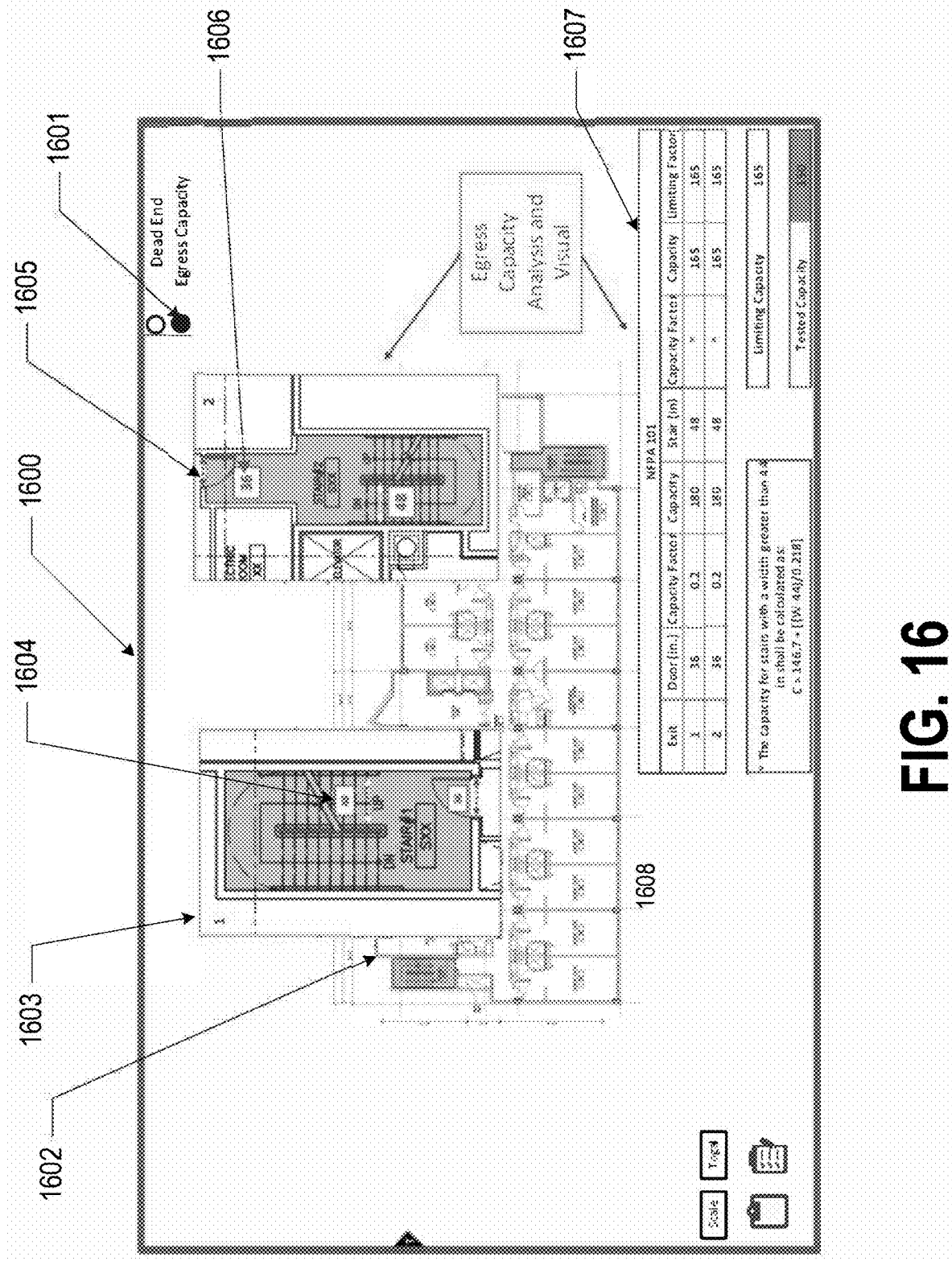
FIG. 16 illustrates an exemplary user interactive interface including exemplary egress compliance analysis.

Referring now to FIG. 16 an exemplary user interactive interface 1600 illustrates building attributes referenced in an analysis of egress capacity of a design plan. Egress capacity may be defined as the number of people an egress system of doors and stairwells can accommodate safely during an emergency. A graphic included in the user interactive interface 1600 may be descriptive of a structure design plan 1608 and display for an egress capacity analysis 1601.

In some embodiments, the AI engine may analyze a design plan 1602 for the presence of one or more elements, such as, for example, stairwells 1603, and/or doors 1605. The stairwells 1603, and/or doors 1605 may be analyzed for key dimensions respectively for stairwell width 1604 and/or door width 1606. Algorithms may utilize one or both of: the analyzed widths, and user entered parameters, to create an egress capacity analysis, the results of which may be displayed to the user, such as in the exemplary table 1607.

Figure 17A:
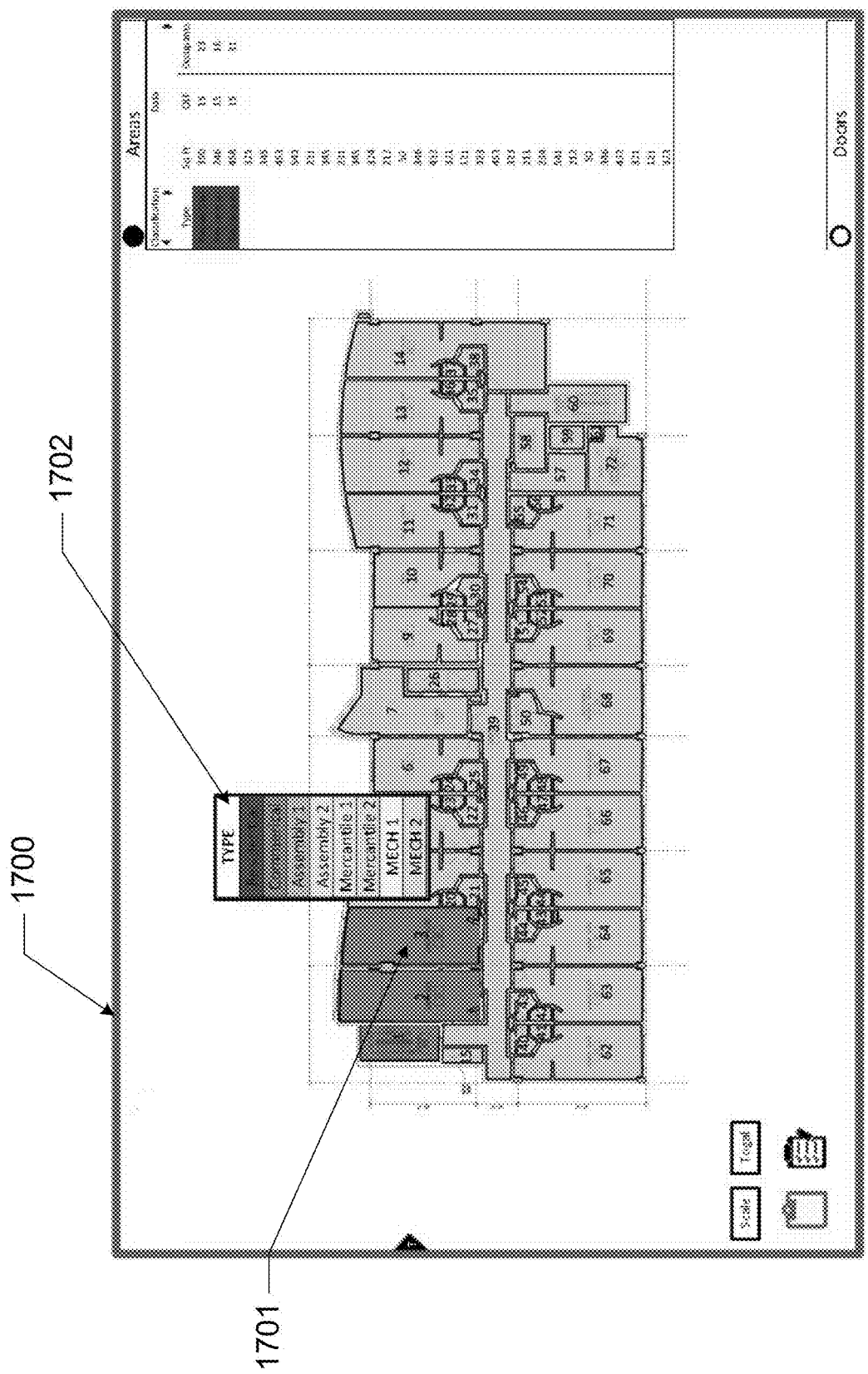
FIGS. 17A and 17B illustrates an exemplary allocation of space in a design plan according to some embodiments of the present invention.

Referring now to FIG. 17A an example of classification of areas through dialogs is illustrated. An inputted design may be analyzed and the various extracted elements such as room spaces, walls, and the like may be defined in the model. The resulting space model may be displayed to the user in display 1700. Individual spaces 1701 may be coded, such as via different patterns of colors in various manners. In an example, a color such as green may indicate a space that is not allocated as a specific type. One or both of an AI engine and a user may consider a space 1701 delineated, for example, as one or more polygons and/or arcuate. An AI engine may automatically designate a type to be allocated to the space, a user may interact with the interactive user interface to designate a type of space, such as, for example via a drop down menu 1702 which may allow the user to select a type for a selected individual or combine space 1701. As illustrated in the drop down menu 1702, the different space types may have different pictorial designations to indicate different types of spaces. The user may use these interfaces to assign a type to each of the individual spaces that the analysis has identified.

Figure 17B:
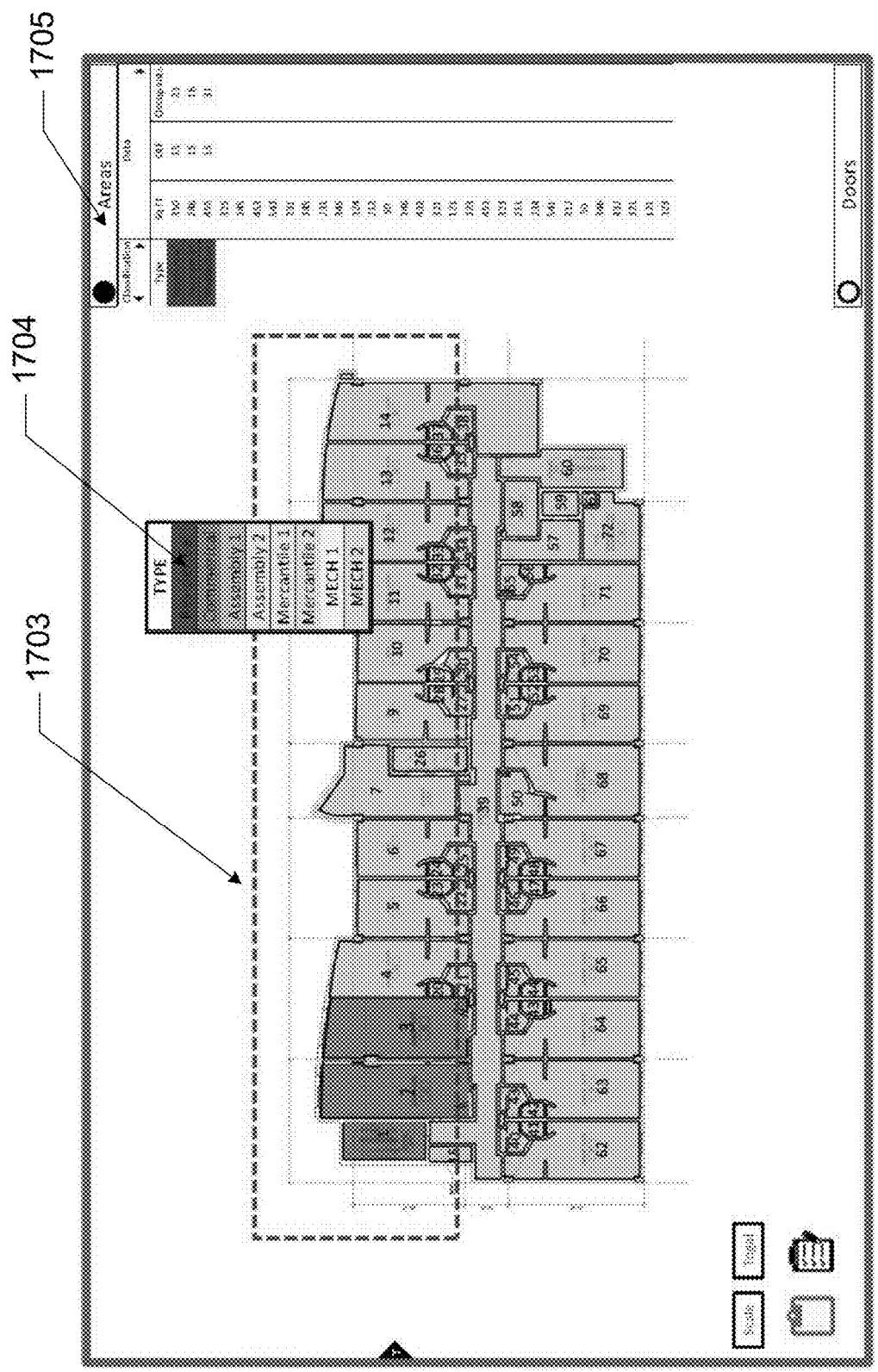

Referring now FIG. 17B, in some examples, one or both of an AI engine and a user may designate multiple spaces at once that are the same space type. In an example, one or both of an AI engine and a user may create a regional boundary 1703 that surrounds multiple identified spaces. The AI engine and the user may select a space type from a predefined list of types 1704 or designate a new space type. In some examples, a tabular display 1705 of the spaces along with assigned types may be displayed. Once the areas are classified other analysis types may be performed and displayed such as occupancy load, dead end, and egress capacity analysis as non-limiting examples.

Figure 18:
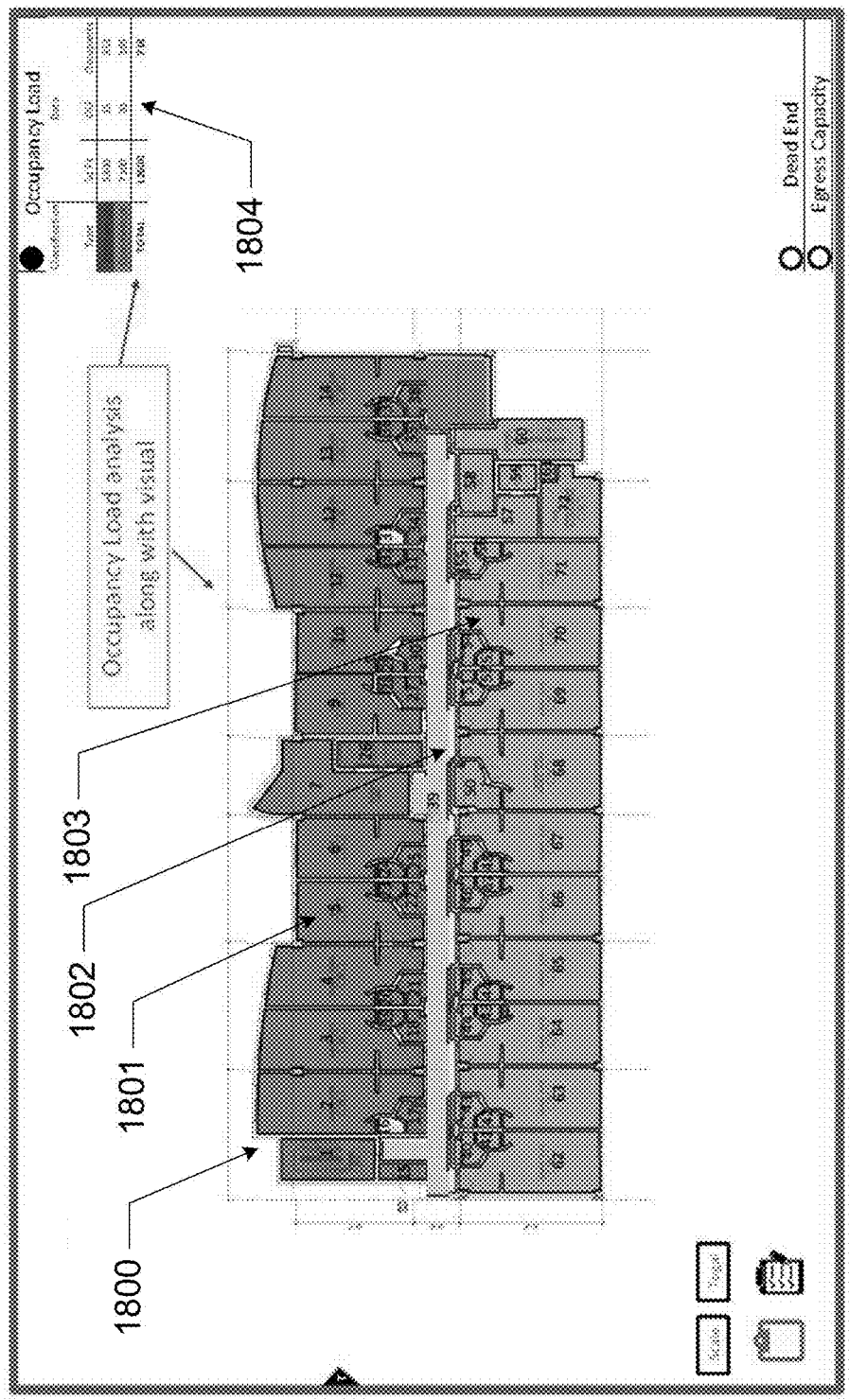
FIG. 18 illustrates an exemplary user interactive interface including exemplary occupancy load compliance analysis.

Referring now to FIG. 18 an exemplary display of an occupancy load analysis along with tabular results is illustrated. Occupancy load may mean the maximum number of people anticipated to occupy the building rooms or spaces at any given time and under all possible situations. An analyzed design with identified discrete spaces 1800 may be analyzed to extract the area of identified spaces of the same type. The analysis may continue to use the analyzed values such as the area, as well as parameters entered by the user. Different spaces may include residential spaces 1801, corridors 1802 and commercial spaces 1803 as an example. The occupancy load for the different space type may be calculated and displayed to the user in tabular form 1804.

Figure 19:
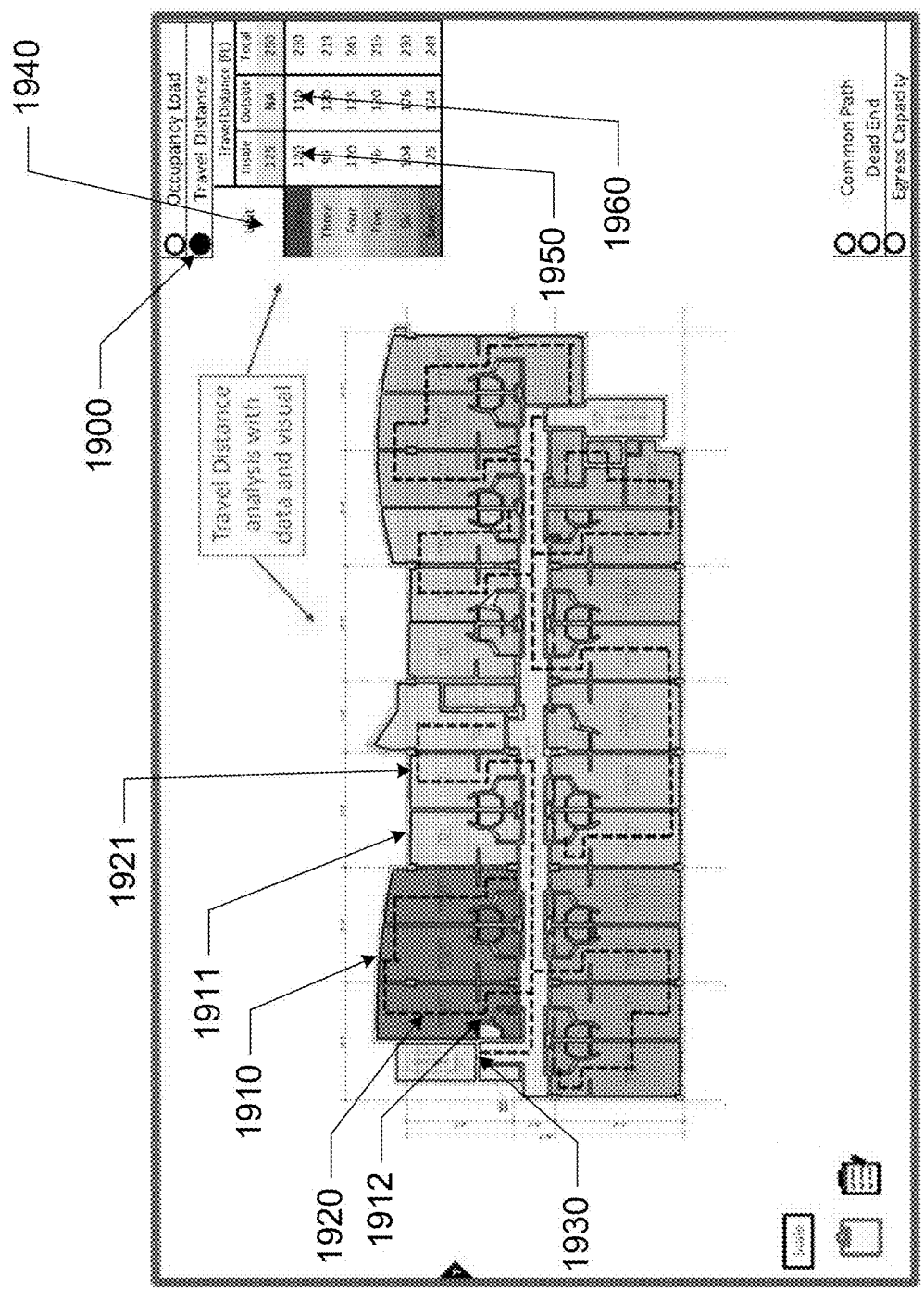
FIG. 19 illustrates an exemplary user interactive interface including travel distance compliance analysis.

Referring now to FIG. 19 one or both of an AI engine and a user may elect a travel distance analysis 1900. Travel distance may mean the maximum allowable distances to exits from any occupiable point of the building. In FIG. 19 an exemplary display of areas classified by units such as unit One 1910, and unit Three 1911 along with calculated travel distances 1920, 1921 respectively is provided. In an example, a design with designated spaces identified may be further processed via one or both of AI engine designation, and user intervention through an interactive user interface. Units may be analyzed individually or in combination for a longest path (or travel distance) from within a defined unit, such as unit One 1910 to an exit path 1930. In some examples, a tabular representation 1940 may be provided with a column for the calculated inside unit travel distance 1950 and outside unit travel distance 1960.

In some embodiments, a longest path through a unit 1910-1911 may be automatically calculated by recognizing doorways 1912 through which an exit path must travel. The doorways 1912 may be internal to a unit 1910-1911 or from within a unit 1910-1911 into a common area outside the unit 1910-1911. An exit path 1930 may calculated according to rules. The rules may be designated by one or both of an AI engine, and a user. In some embodiments, the rules may be according to accepted practices in a locality, or in an organization. Additionally, in some implementations, rules pertaining to a longest path may designate that an exit path comply with one or more of: remain a minimum distance from a wall; bifurcate a polygon; bifurcate an arcuate shape; follow a circumference of a space with an offset distance; traverse a dead end to its end and loop back; avoid fixed obstacles that are not part of the building; and traverse handicap accessible routes.

In some embodiments, one or both of an AI engine and a user may fill a space with multiple polygons and/or arcuate shapes and an exit path may be aligned with one or more of:

an offset of a perimeter of one or more of the polygons and/or arcuate shapes; on a perimeter of one or more of the polygons and/or arcuate shapes; and bifurcate one or more of the polygons and/or arcuate shapes.

Figure 20:
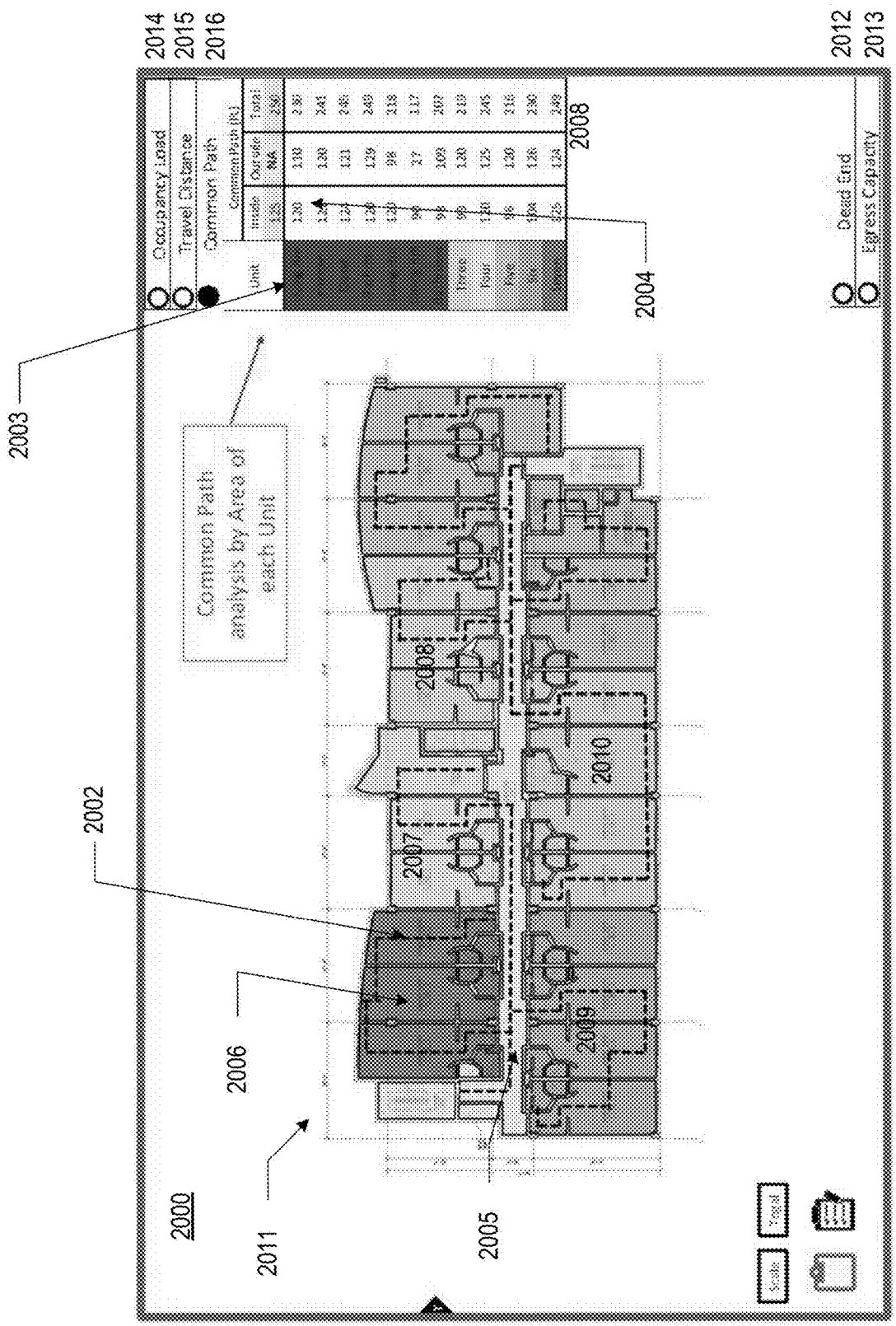
FIG. 20 illustrates an exemplary user interactive interface including common path compliance analysis.

Referring now to FIG. 20, an exemplary interactive user interface 2000 is illustrated with a design plan floorplan 2011 (which may be a floor plan) with multiple areas classified by units 2003 along with calculated common path distances 2004. A common path 2005 may be considered a portion of an exit access travel path that is shared amongst multiple units 2003. As illustrated, in some embodiments of the present invention, it is useful to determine a distance from a most remote point (sometimes referred to as a furthermost point) within a floor of a building, or a unit in a building, to that point with separate access to two exits or exit access doorways. A user may select a common path analysis 2011 from an interactive user device presented on the user interactive interface.

As in other processes described herein, one or both of an AI engine, and/or a user, may designate one or more of regions, areas, and spaces 2006-2010 into separate units such as unit one 2006, and each unit 2006 may include one or more internal spaces. An AI engine may execute software to perform AI analysis on the floorplan 2011 to determine which region, area, or space (if any), comprises a common path 2005. A user may also designate an area as a common path 2005. The common path 2005 may be a shared portion of multiple disparate exit paths 2002. The share portion may be accessible by multiple units 2006. In some embodiments, a result of a common path analysis may be presented to a user via the user interactive interface 2000 and include a length parameter 2004 (e.g., via the exemplary table 2008).

Additionally, user interactive devices 2014-2016 may cause the interface to display desired parameters, such as, for example, occupancy load 2014, travel distance 2015 and common path 2014. As illustrated, parameters associated with Common Path 2016 have been displayed.

The user interactive interface 2000 is illustrated with a common path option 2016 selected. Some implementations of the present invention allow a user to select various options 2014-2016, whereby a selection of an option will cause data pertinent to the selected option to display on the user interactive interface 2000. For example, selection of an occupancy load option 2014 will cause an AI calculated occupancy load to be displayed for selected (or all) units and/or areas. Selection of a travel distance option 2015 will cause a designated travel distance to be calculated and displayed. Selection of a Dead End option 2012 will display dead ends included in the floorplan 2016. A selection of an Egress Capacity option 2013 will display a capacity to provide safe egress for a designated area or path.

Figure 21:
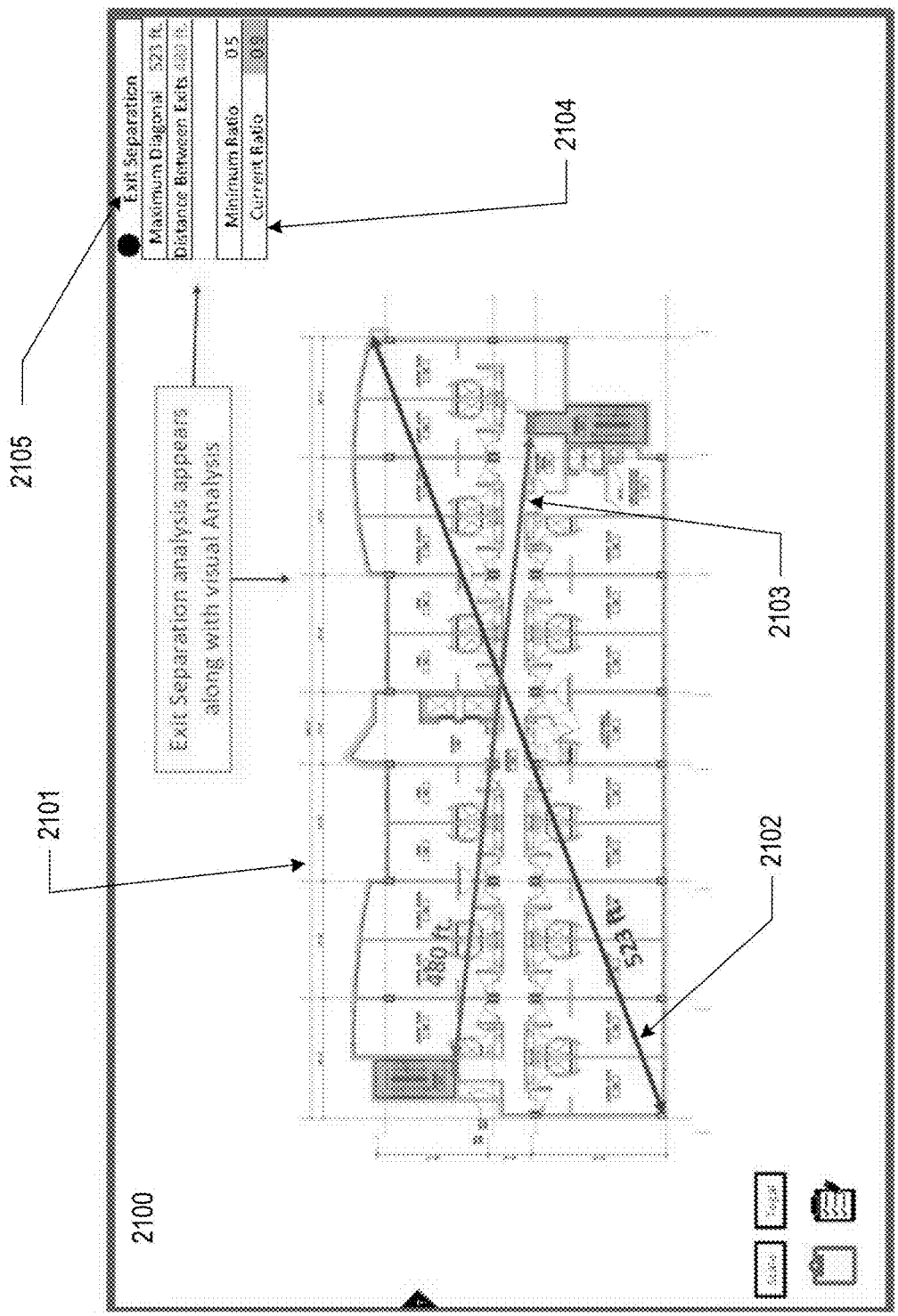
FIG. 21 illustrates an exemplary user interactive interface including exit separation compliance analysis.

Referring now to FIG. 21 an exemplary display of an interactive user interface 2100 with calculated exit separations 2105 is illustrated. The maximum exit separation to be evaluated may mean a distance apart of separate exits equal to not less than one-half of a length of a maximum overall diagonal dimension of a building or area to be served. In some embodiments, the maximum overall diagonal dimension may be measured in a straight line between exit doors or exit access doorways. In the example illustrated in FIG. 21, a design plan 2101 may be processed with a controller, such as an AI engine, to extract features such as spaces, walls, doors, exits and the like. The controller may then extract a maximum distance between exits 2103 in the design. The analysis system may also calculate a maximum diagonal distance 2102 between points in a design plan being analyzed. Values for variables included in the maximum diagonal distance 2102 may be used to process a compliance analysis 2104.

In the examples provided and in general, a user interface 2100 may allow for the user to access and display applicable code to the analysis selected as well as, in some examples, to regional location of the design under analysis. In some examples, the applicable code may be accessed from a database in logical communication with the controller. In other examples, the systems of the types described herein may access online data sources and may interpret code sources by analyzing graphical sources and files such as with optical character recognition.

In displaying and listing relevant code, a user interface of the system may highlight portions of the display of a design plan 2101 which illustrate relevant aspects of that code and the status of compliance. In some examples, color shading, blinking or the like may be manners to provide such highlighting.

In some examples, where there are non-compliant aspects, a trained artificial intelligence analysis of numerous examples of non-compliant designs and their subsequent design changes that remediated the issues may be used to suggest modifications based on an analysis of the design under review. In other examples, other algorithms may be used to provide such suggestions, such as by review of databases which track common required changes to make a building conform to requirements. Examples of improvements which the system may recommend to a user may include adding a new door or other feature to create a new path of egress. In other examples, design elements such as doors may be relocated to address non-compliance. Other examples may include adding structure to block aspects such as dead ends. Still further examples may address non-compliance aspects by adding features such as by suggesting the adding of a doorway to a dead end corridor as a non-limiting example.

Highlighting, such as in the ways previously described, may be used to indicate one or both of points of compliance and points of non-compliance. The relevant portions of the code may be displayed such as in an overlay, or a pop-up window and may be matched in various manners to the design under analysis, such as with coloration as a non-limiting example. Alternatively, points of non-compliance may be highlighted. These aspects of the user interface experience may improve effectiveness and/or efficiency for inspectors by providing this highlighting or other summarization of points of compliance and points of non-compliance.

Other tools may also be provided through the user interface experience to support users such as, for example, allowing the user to click and drag a cursor over a space designated as a room. Various symbols and icons may be overlayed on the design to indicate various artifacts, corners, stairs, measurements such as door width, access to measurements or design data of various kinds and the like. The user may be able to zoom to portions of the drawing for more detailed review and/or the display of more detailed measurements and design data. Furthermore, the user may be able to zoom to features such as in a non-limiting example a doorway to allow a check of calibration of the scale of the design or even a recalibration of the scale, where such a recalibration may drive a reassessment of compliance by the system.

Additional Methods of Model Formation

There may be alternative methods of receiving data from various sources that can be used to generate a design or to supplement a design created in the manners as have been described previously. For example, the system may receive an architectural file with intelligent features of various kinds which will be discussed in further detail following. The present system may operate in concert with a BIM or CAD design system for example as an add-in to these design systems and then the present system may have access to design elements, location data and the like directly. In other examples, the present system may access BIM or CAD design system data by loading datafiles from said systems. In still further examples, the present system may operate to capture data from display screens that are displaying designs from the said BIM or CAD design systems.

In a non-limiting example, the present system may receive a file in one of the REVIT native formats such as files of types RVT, RFA, RTE and RFT. Embodiments may also include receiving non-Revit compatible file formats, such as, one or more of: BMP, PNG, JPG, JPEG, and TIF.

Figure 22:
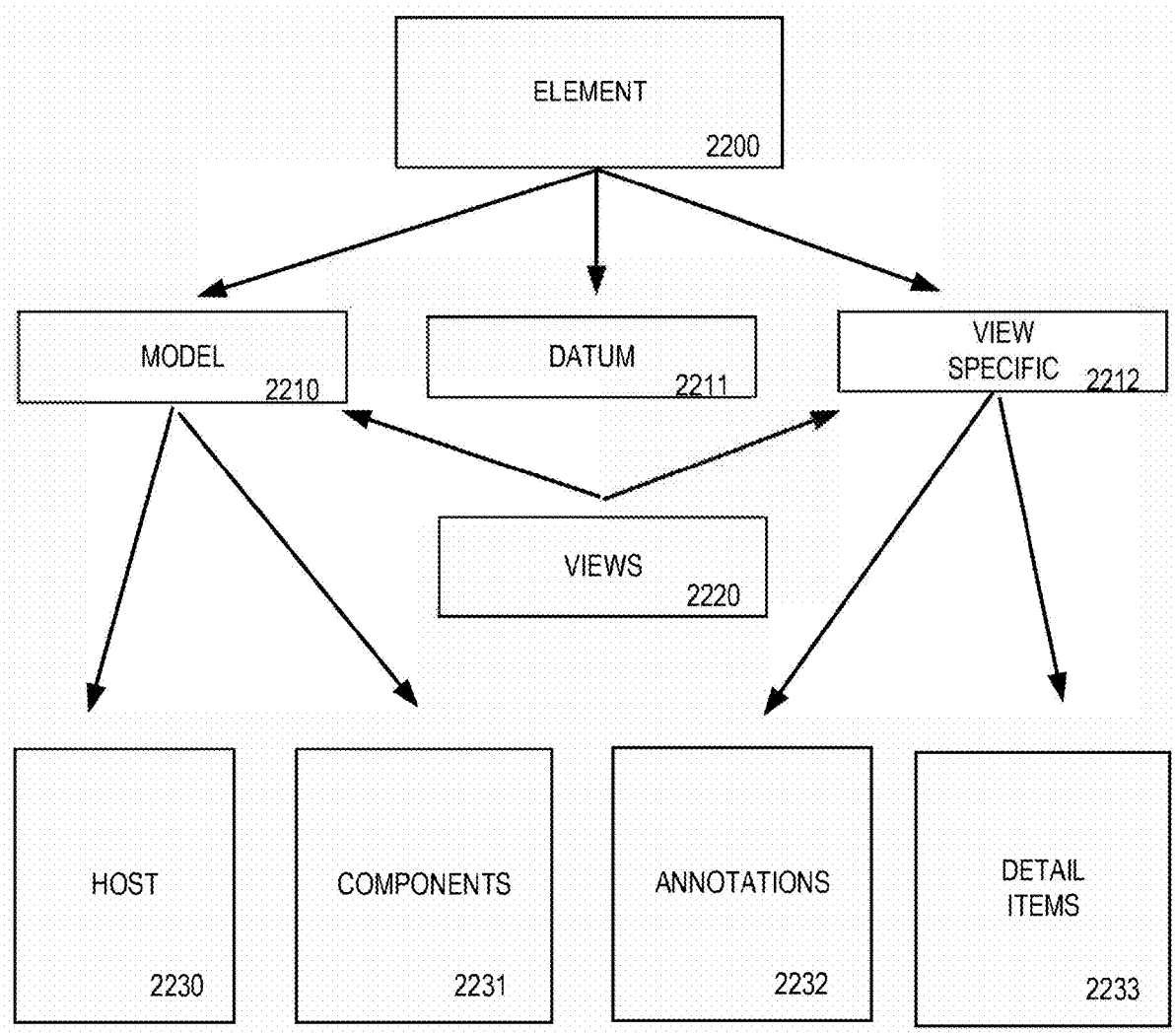
FIG. 22 illustrates a block diagram of exemplary aspects that may be used in building or refining design models.

Referring now to FIG. 22, a high level review of the type of information that may be stored in such a filetype is provided, in general for Revit file types. As shown, the datafile may include objects that may be considered elements 2200. The elements may be of different types such as model elements, datum elements and view-specific elements. Model elements 2210 may correspond to physical elements that are constructed. These may include, amongst others, such elements as floors, walls, ceilings, walls that include structural support aspects, roofs, and the like which may be considered "Hosts" 2230. Other model elements 2200 may include components 2231. Components 2231 may include features such as windows, doors and cabinets and the like. Components may also include beams, braces and structural columns amongst other such features. An artificial intelligence based analysis system may be used to load such features from a file and recognize their content and context based upon direction information in the file as well as learned aspects.

The Datum elements 2211 may include aspects that define the design context. These may include contextual support such as definition of grids, which in some cases may be used to "snap" elements or components to. The Datum elements 2211 may also include levels which may organize components and elements into similar groups. The Datum elements 2211 may include reference planes to support specifically locating and placing elements and components in a design.

The files may also include view-specific elements 2212. View specific elements may be details and annotation elements that appear only when specific views 2220 are activated. Annotation elements 2232 may include keynotes, comments, tags, dimensions, and other such annotations. Detail elements 2233 may include detail lines, filling of various aspects and other such components.

These various elements may be loaded from exemplary files and extracted for their relevant information. Other file types in addition to the Revit® types previously mention may include in a non-limiting sense DGN, DWF, DWG, DXF, IFC, SAT, SKP, ODBC, HTML, TXT, and gbXML file types. As mentioned, systems of the present type may be configured to extract information based on defined file structure of the input file times. In addition, learned aspects may be applied to interpret the designs and assign components or alter certain information about a component. For example, a wall definition may be recognized by the present system and have aspects of it modified, and additional model aspects defined such as an appropriate center line defined, or a set of different dividing line types assigned. The wall may have a designation assigned such as whether it is an internal or external wall. Other such learned assignments may be applied after data is loaded from an external file. As mentioned, the present system may also operate in manners where it has access to objects of the BIM or CAD design system directly as an add in, or a parallel running system with access to memory locations running in the BIM or CAD design system. Still further examples may derive from capturing design elements in displays of various kinds. Finally, such access to external file types may be used to verify models generated in the standard manners as have been described or add information such as annotations, descriptions, and other such aspects.

Figure 23A:
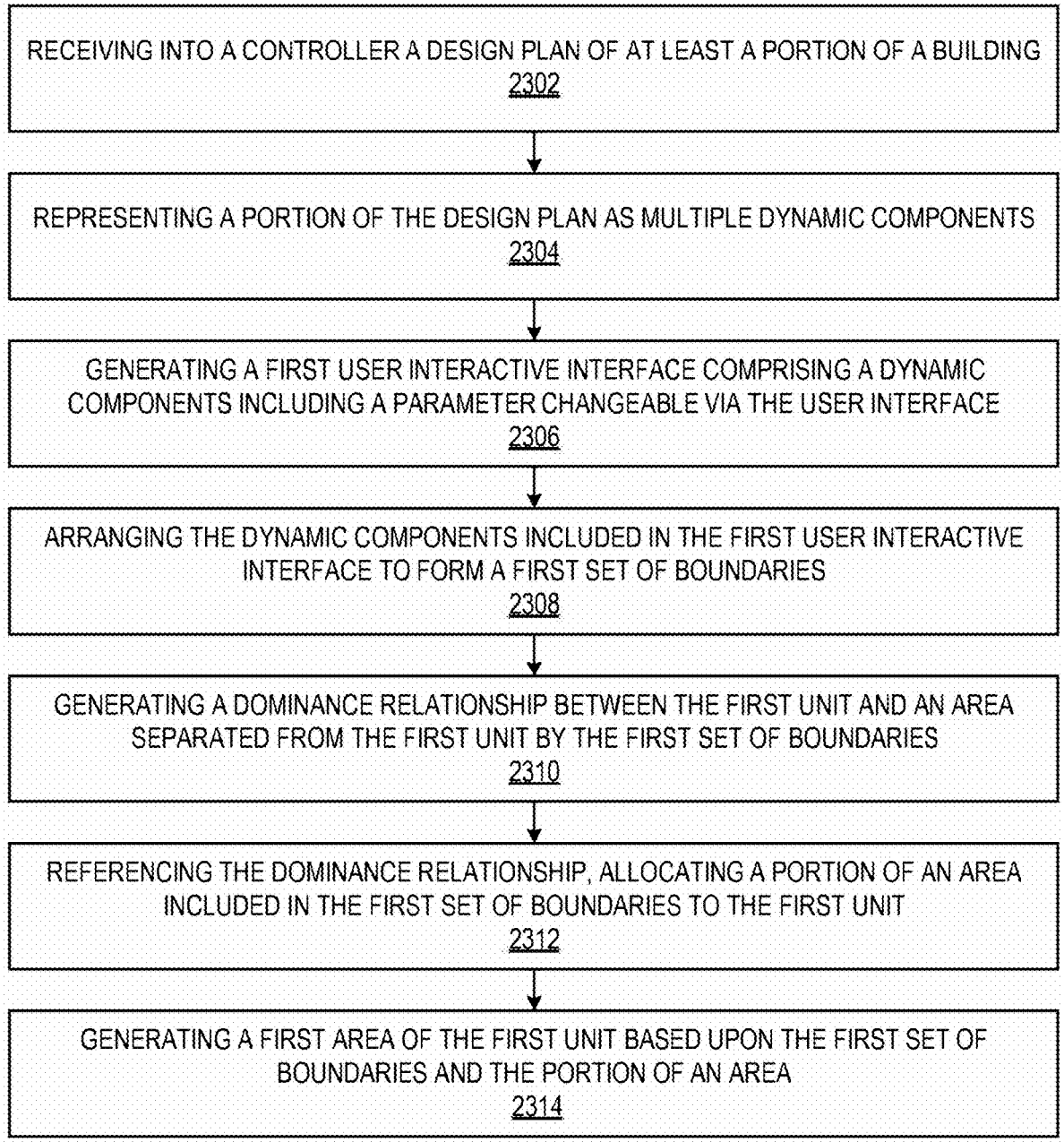
FIGS. 23A and B illustrate exemplary method steps that may be included in some embodiments of the present invention.
Figure 23B:
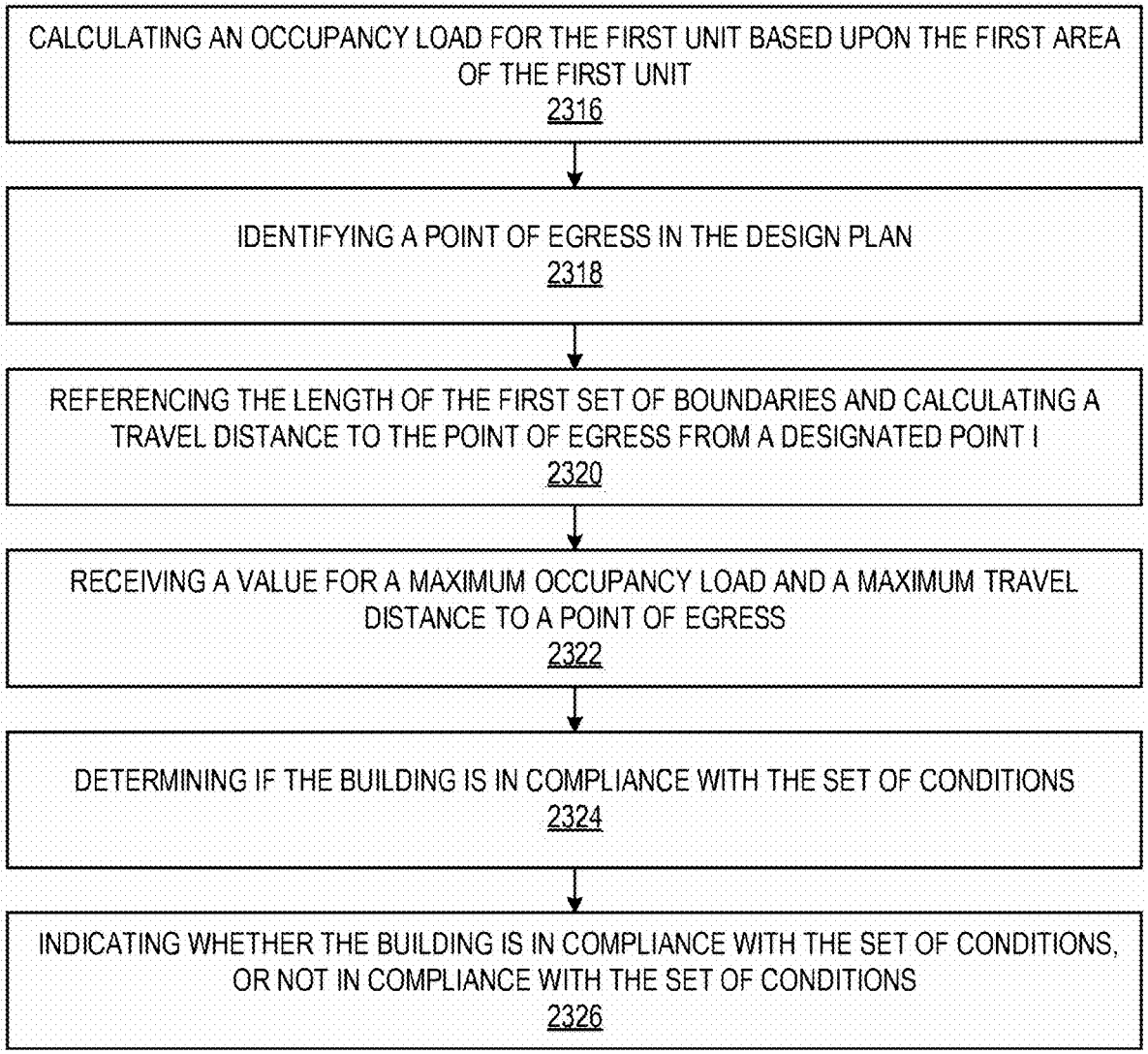

FIGS. 23A and 23B illustrate flowcharts that describe a method, according to some embodiments of the present disclosure. According to the present invention a method of practice may include the steps of: at step 2302 receiving into a controller a design plan of at least a portion of a building.

At step 2304, the method may include representing a portion of the design plan as multiple dynamic components.

At step 2306, the method may include generating a first user interactive interface including at least some of the multiple dynamic components representing portion of the design plan, each dynamic component including a parameter changeable via the user interactive interface.

At step 2308, the method may include arranging the dynamic components included in the first user interactive interface to form a first set of boundaries, the first set of boundaries including a respective length and area, and the first set of boundaries defining at least a portion of a first unit.

At step 2310, the method may include generating a dominance relationship between the first unit and an area separated from the first unit by the first set of boundaries.

At step 2312, the method may include referencing the dominance relationship, allocating a portion of an area included in the first set of boundaries to the first unit. At step 2314, the method may include generating a first area of the first unit based upon the first set of boundaries and the portion of an area included in the first set of boundaries that may be allocated to the first unit. At step 2316, the method may include calculating an occupancy load for the first unit based upon the first area of the first unit. In some embodiments, at step 2318, the method may include identifying a point of egress in the design plan. At step 2320, the method may include, with the controller, referencing the length of the first set of boundaries and calculating a travel distance to the point of egress from a designated point included in the first unit. At step 2322, the method may include receiving a value for including a maximum occupancy load and a maximum travel distance to a point of egress in order to be in compliance with a set of conditions.

In some embodiments, at step 2324, the method may include referencing the occupancy load first unit and the travel distance from the designated point within the first unit to the point of egress, determining if the building may be in compliance with the set of conditions. At step 2326, the method may include indicating in the user interactive interface indicating whether the building may be in compliance with the set of conditions, or not in compliance with the set of conditions.

In some embodiments, the method may additionally include determining a scale of the components included in the design plan and/or referencing the dynamic components and determining a width of one or more of: a path of egress, a doorway, and a stairwell.

In some embodiments, the method may also include training the AI engine via a human identifying portions of the design plan as a particular type of component and associating a pattern of pixels with the portions of the design plan.

Another aspect may include generating suggested modifications to a design plan in order to meet compliance with a set of conditions. Modifications may include, by way of non-limiting example, including a doorway, changing a length of a wall, widening the path of egress, eliminating a dead end, such as, for example, via inclusion of an additional wall.

Figure 24:
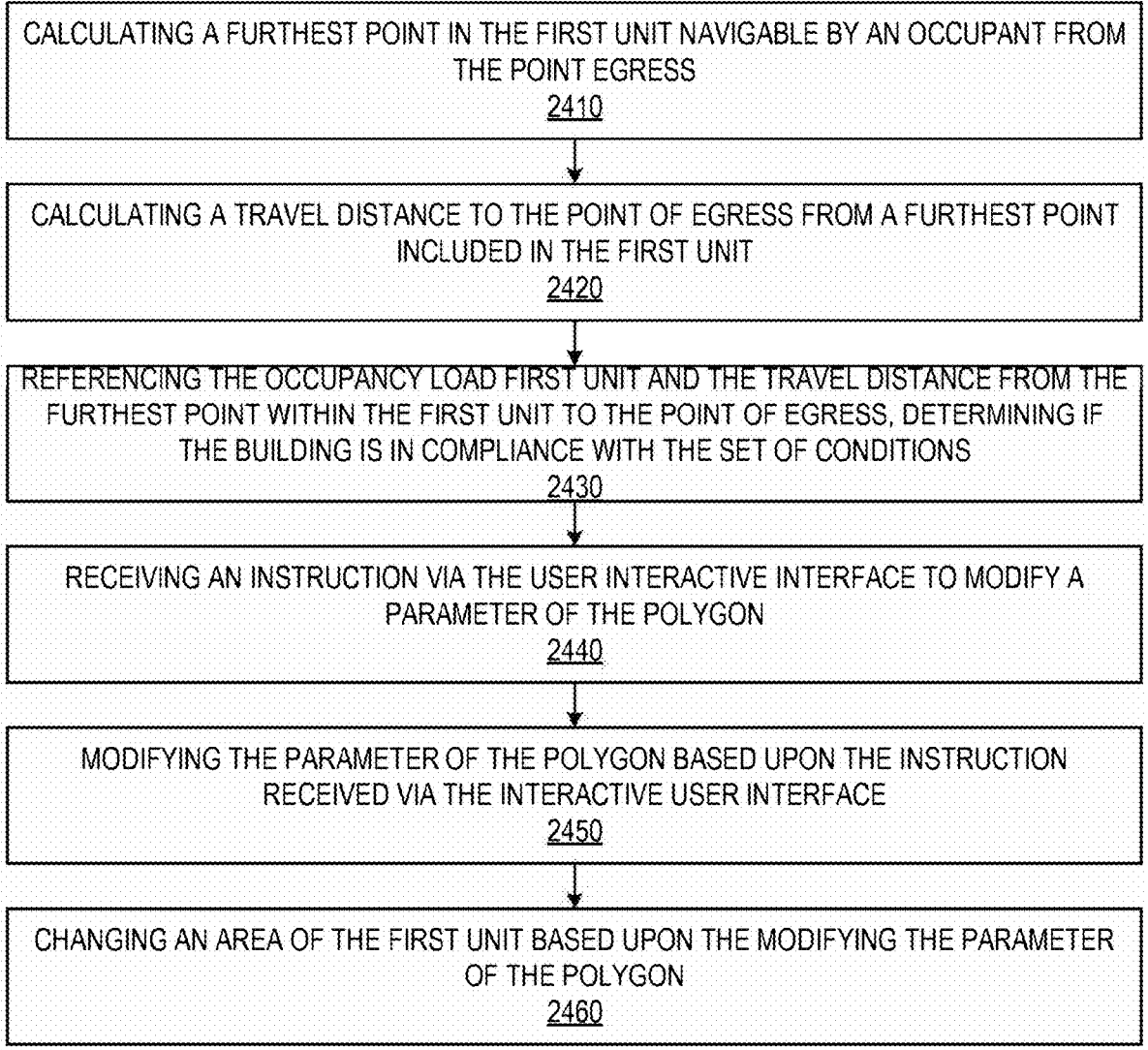
FIG. 24 illustrates additional method steps that may be performed in some implementations of the present invention.

FIG. 24 illustrates a flowchart that describes additional method steps according to some embodiments of the present disclosure. At step 2410, the method may include calculating a furthest point in the first unit navigable by an occupant from the point of egress. At step 2420, the method may include calculating a travel distance to the point of egress from a furthest point included in the first unit. At step 2430, the method may include referencing the occupancy load first unit and the travel distance from the furthest point within the first unit to the point of egress, determining if the building may be in compliance with the set of conditions.

In some embodiments, some steps of the processes described herein may be repeated for multiple units included in a design plan. For example, the steps of: arranging the dynamic components included in the first user interactive interface to form a first set of boundaries, the first set of boundaries comprising a respective length and area, and said first set of boundaries defining at least a portion of a first unit; generating a dominance relationship between the first unit and an area separated from the first unit by the first set of boundaries; referencing the dominance relationship, allocating a portion of an area included in the first set of boundaries to the first unit; generating a first area of the first unit based upon the first set of boundaries and the portion of an area included in the first set of boundaries that is allocated to the first unit; calculating an occupancy load for the first unit based upon the first area of the first unit; identifying a point of egress in the design plan; and with the controller, referencing the length of the first set of boundaries and calculating a travel distance to the point of egress from a designated point included in the first unit; may be repeated multiple times for multiple respective units.

In some embodiments, a geopolitical locality with jurisdiction over a situs of the building may be determined and a set of conditions specified by a building code adopted by the locality with jurisdiction over a situs of the building may be used in the methods described.

At step 2440, the method may include receiving an instruction via the user interactive interface to modify a parameter of the polygon. At step 2450, the method may include modifying the parameter of the polygon based upon the instruction received via the interactive user interface.

At step 2460, the method may include changing an area of the first unit based upon the modifying the parameter of the polygon.

Glossary

"Artificial Intelligence" as used herein means machine-based decision making and machine learning including, but not limited to: supervised and unsupervised recognition of patterns, classification, and numerical regression. Supervised learning of patterns includes a human indicating that a pattern (such as a pattern of dots formed via the rasterization of a two-dimensional image) is representative of a line, polygon, shape, angle or other geometric form, or an architectural aspect, unsupervised learning can include a machine finding a pattern submitted for analysis. One or both may use mathematical optimization, formal logic, artificial neural networks, and methods based on one or more of: statistics, probability, linear regression, linear algebra, and/or matrix multiplication.

"AI Engine" as used herein an AI Engine (sometimes referred to as an AI model) refers to methods and apparatus for applying artificial intelligence and/or machine learning to a task performed by a controller. In some embodiments, a controller may be operative via executable software to act as an AI engine capable of recognizing aspects and/or tally aspects of a design plan that are relevant to generating an estimate for performing projects included in construction of a building or other activities related to construction of a building.

"Computer Aided Design," sometimes referred to as "CAD," as used herein shall mean the use of automation for the creation, modification, analysis, or optimization of a design plan or design plan file.

"Vector File" as used herein a vector file is a computer graphic that uses mathematical formulas to render its image. In some embodiments, a sharpness of a vector file will be agnostic to size within a range of sizes viewable on smart device and personal computer display screens.

Typically, a vector image includes segments with two points. The two points create a path. Paths can be straight or curved. Paths may be connected at connection points. Connected paths form more complex shapes. More points may be used to form longer paths or closed shapes. Each path, curve, or shape has its own formula, so they can be sized up or down and the formulas will maintain the crispness and sharp qualities of each path.

A vector file may include connected paths that may be viewed as graphics. The paths that make up the graphics may include geometric shapes or portions of geometric shapes, such as: circles, ellipsis, Bezier curves, squares, rectangles, polygons, and lines. More sophisticated designs may be created by joining and intersecting shapes and/or paths. Each shape may be treated as an individual object within the larger image. Vector graphics are scalable, such that they may be increased or decreased without significantly distorting the image.

The methods and apparatus of the present invention are presented herein generally, by way of example, to actions, processes, and deliverables important to industries such as the construction industry, by generating improved determination of compliance with specified codes, based on inputted design plans, floor plans or other construction related diagrams, however, design plans may include almost any artifact that may be converted to a pixel pattern.

Some specific embodiments of the present invention include input of a design plan (e.g., a blueprint, design plan floorplan or other two-dimensional artifact) so that it may be analyzed using artificial intelligence and used to generate a determination of compliance with specified conditions included in one or multiple building codes in a short time period. However, unless expressly indicated in an associated claim, the present invention is not limited to analysis of design plans for any particular industry. The examples provided herein are illustrative in nature and show that the present invention may use controllers and/or neural networks and artificial-intelligence (AI) techniques to identify aspects of a building described by a design plan and specify quantities for variables used to generate a bid or other proposal for completion of a project (or some subset of a project) represented by the design plan. For example, aspects of a building that are identified may include one or more of: walls or other boundaries; doorways; doors; plumbing; plumbing fixtures; hardware; fasteners; wall board; flooring; a level of complexity and other variables ascertainable via analysis of the design plan. AI analysis provides values for variables used in estimations involved in a project bidding process or related activity.

The present invention provides for systems of one or more computers that can be configured to perform particular operations or actions by virtue of having software, firmware, hardware, or a combination of them installed on the system that in operation causes or cause the system to perform the actions. One or more computer programs can be configured to perform artificial intelligence operations or actions by virtue of including instructions that, when executed by data processing apparatus, cause the apparatus to perform the actions.

CONCLUSION

A number of embodiments of the present disclosure have been described. While this specification contains many specific implementation details, there should not be construed as limitations on the scope of any disclosures or of what may be claimed, but rather as descriptions of features specific to particular embodiments of the present disclosure. While embodiments of the present disclosure are described herein by way of example using several illustrative drawings, those skilled in the art will recognize the present disclosure is not limited to the embodiments or drawings described. It should be understood the drawings and the detailed description thereto are not intended to limit the present disclosure to the form disclosed, but to the contrary, the present disclosure is to cover all modification, equivalents and alternatives falling within the spirit and scope of embodiments of the present disclosure as defined by the appended claims.

The headings used herein are for organizational purposes only and are not meant to be used to limit the scope of the description or the claims. As used throughout this application, the word "may" be used in a permissive sense (i.e., meaning having the potential to), rather than the mandatory sense (i.e., meaning must). Similarly, the words "include," "including," and "includes" mean including but not limited to. To facilitate understanding, like reference numerals have been used, where possible, to designate like elements common to the figures.

The phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted the terms "comprising," "including," and "having" can be used interchangeably.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while method steps may be depicted in the drawings in a particular order, this should not be understood as requiring that such operations be performed in the particular order shown or in a sequential order, or that all illustrated operations be performed, to achieve desirable results.

Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed disclosure.

What is claimed is:

1. A method of quantifying building metrics based upon artificial intelligence analysis of a design plan, the method comprising the steps of:
   a. receiving into a controller the design plan of at least a portion of a building, the controller comprising a semiconductor-based processor and storage device storing a software program;
   b. with the controller, representing a portion of the design plan as multiple dynamic components;
   c. with the controller, generating a first user interactive interface comprising at least some of the multiple dynamic components representing the portion of the design plan, each dynamic component including a parameter changeable via the first user interactive interface;
   d. arranging the multiple dynamic components included in the first user interactive interface to form a first set of boundaries, the first set of boundaries comprising a respective first length and first area, and said first set of boundaries defining at least a portion of a first unit comprising a first unit area;
   e. in the controller, generating a dominance relationship between the first unit area and a second area separated from the first unit area by the first set of boundaries, the dominance relationship based upon a dominance ranking of area types that scores the area types as one of: equal to each other, one dominant to another, and one subservient to another;
   f. with the controller, allocating a portion of the first area included in the first set of boundaries to the first unit area based upon the dominance relationship, wherein the portion of the first area included in the first set of boundaries is allocated to the first unit area according to a ratio included in the dominance relationship;
   g. with the controller, generating a value for the first unit area based upon the first set of boundaries and the portion of a third area included in the first set of boundaries that is allocated to the first unit area;

h. calculating an occupancy load for the first unit based upon the value for the first unit area that is based upon the first set of boundaries and the portion of the third area included in the first set of boundaries allocated to the first unit area;

i. identifying a point of egress in the design plan;

j. with the controller, referencing a length of the first set of boundaries, calculating a travel distance along a path of egress to the point of egress from a point designated as a furthest point in the first unit from the point of egress, said path of egress representing an actual path of a person who will exit the first unit to the point of egress;

k. receiving a value comprising a maximum occupancy load and a maximum travel distance to the point of egress in order to be in compliance with a set of conditions;

l. referencing the occupancy load of the first unit and the travel distance from the furthest point within the first unit from the point of egress along the path of egress, determining if the building is in compliance with the set of conditions; and m. with the controller, indicating in the first user interactive interface whether the building is in compliance with the set of conditions.

2. The method of claim 1 further comprising the steps of: virtually dividing the first area into multiple polygons, each polygon comprising at least one boundary along which the path of egress may be generated; and referencing the multiple polygons with each polygon comprising at least one boundary along which the path of egress may be generated, calculating a furthest point in the first unit navigable by an occupant from the point of egress.

3. The method of claim 1 further comprising the step of repeating steps 1. d. through m. for multiple respective units in the design plan in addition to the first unit.

4. The method of claim 3, further comprising aggregating an area of multiple respective units included in the design plan and determining an occupancy load for the multiple respective units.

5. The method of claim 4, additionally comprising the step of determining an occupancy load for the entire building based upon: the aggregated area of the multiple respective units; common egress paths; and stairwells.

6. The method of claim 3 additionally comprising the steps determining a geopolitical locality and authority having jurisdiction over a situs of the building; and including in the set of conditions, conditions specified by a building code adopted by the authority having the jurisdiction over the situs of the building.

7. The method of claim 6 additionally comprising the step of generating an egress path comprising a distance internal to the first unit, and a distance via a common path external to the first unit.

8. The method of claim 2 additionally comprising determining a scale of the multiple dynamic components included in the design plan.

9. The method of claim 8 additionally comprising the step of: with the controller, referencing the scale of the multiple dynamic components, and determining a width of the path of egress.

10. The method of claim 9 additionally comprising the step of determining a width of one or both of a doorway and a stairwell.

11. The method of claim 7 additionally comprising the step of generating a user interface comprising user interactive areas operative to change at least one of: a size and shape of at least one of the multiple dynamic components thereby changing at least one of: the first area of the first unit and a length of the egress path; and based upon the changing of at least one of: the first area of the first unit and the length of the egress path, placing the building in compliance with the set of conditions.

12. The method of claim 6 wherein at least one of the multiple dynamic components comprises a polygon and the method further comprises the steps of: receiving an instruction via the first user interactive interface to modify a parameter of the polygon; modifying the parameter of the polygon based upon the instruction received via the first user interactive interface; changing the first area of the first unit based upon the modifying the parameter of the polygon; and repeating steps 1.g, and 1.m, after the modification to the parameter of the polygon.

13. The method of claim 12, wherein the parameter modified comprises an area of the polygon.

14. The method of claim 12, wherein the parameter modified comprises a shape of the polygon.

15. The method of claim 7 wherein the at least one of the multiple dynamic components comprises a line segment and the method further comprises the steps of: receiving an instruction via the first user interactive interface to modify a parameter of the line segment; modifying the parameter of the line segment based upon the instruction received via the first user interactive interface; changing a length of the egress path based upon the modifying the parameter of the line segment; and repeating steps 1.l, and 1.m, after the modification of the parameter of the line segment.

16. The method of claim 15, wherein the parameter of the line segment comprises a length of the line segment and the method additionally comprises the step of modifying a length of a wall based upon the modifying the length of the line segment.

17. The method of claim 6 additionally comprising the steps of determining that a longest path of egress includes a dead end; including in a longest path calculation traversing the dead end to its end and looping back; and modifying a component to shorten the dead end included in the path of egress.

18. The method of claim 17 additionally comprising the step of displaying in the first user interactive interface an action that may be taken to place a building incompliance with the building code designated by the authority having the jurisdiction.

19. The method of claim 18 wherein the action that may be taken to place the building in compliance comprises at least one or: shortening the path of egress and widening the path of egress.

20. The method of claim 9 additionally comprising the step of training an AI engine via a human identifying portions of the design plan to comprise a boundary.

21. The method of claim 2, additionally comprising the steps of: generating the path of egress to emulate a path a person walks through the portion of the building by providing a boundary that maintains the path of egress at least a minimum distance from a wall.

22. The method of claim 21 wherein the minimum distance from a wall comprises between six inches to 8 inches.

23. The method of claim 21 additionally comprising the step of generating a polygon of about one half of a width of the first unit area; and generating the path of egress within the minimum distance comprising a width of the polygon about one half of a width of the first unit area.

24. The method of claim 23 wherein the width of the polygon comprises one half of a width of the first unit area.

25. The method of claim 21 additionally comprising the step of associating the path of egress with cartesian coordinates of pixels; and setting values of the pixels that are included in the path of egress to correspond with the minimum distance from the wall.

26. The method of claim 21 wherein the path of egress to emulate where a path a person walks through the portion of the building comprises an internal path of egress through an area inside of the first unit added to a first external path of egress through an area outside of the first unit to a first point of egress.

27. The method of claim 26 additionally comprising the step of calculating a distance of an alternative path of egress comprising the internal path of egress through an area inside of the first unit added to a second external path of egress through an area outside of the first unit to a second point of egress.

28. The method of claim 21 additionally comprising the step of, with the controller, generating suggested modifications to the design plan a suggested modification to the design plan in order to meet compliance with the set of conditions.

29. The method of claim 28, wherein the suggested modification comprises one or more of: adding a doorway, changing a length of a wall, widening the path of egress, and eliminating a dead end.

30. The method of claim 1 wherein the ratio included in the dominance relationship is a 50/50 ratio.

31. The method of claim 1 wherein the ratio included in the dominance relationship is a 60/40 ratio.

* * * * *